(12) United States Patent
Nowak et al.

(10) Patent No.: US 9,570,884 B2
(45) Date of Patent: Feb. 14, 2017

(54) LASER APPARATUS, EXTREME ULTRAVIOLET LIGHT GENERATION SYSTEM, METHOD FOR CONTROLLING THE LASER APPARATUS, AND METHOD FOR GENERATING THE EXTREME ULTRAVIOLET LIGHT

(75) Inventors: Krzysztof Nowak, Oyama (JP); Osamu Wakabayashi, Hiratsuka (JP)

(73) Assignee: GIGAPHOTON INC., Tochigi-ken (JP)

( * ) Notice: Subject to any disclaimer, the term of this patent is extended or adjusted under 35 U.S.C. 154(b) by 0 days.

(21) Appl. No.: 13/817,817

(22) PCT Filed: Jan. 25, 2012

(86) PCT No.: PCT/IB2012/000113
§ 371 (c)(1),
(2), (4) Date: Feb. 19, 2013

(87) PCT Pub. No.: WO2012/107815
PCT Pub. Date: Aug. 16, 2012

(65) Prior Publication Data
US 2013/0148674 A1    Jun. 13, 2013

(30) Foreign Application Priority Data

Feb. 9, 2011   (JP) ................................. 2011-026228
Dec. 12, 2011  (JP) ................................. 2011-271346

(51) Int. Cl.
*H01S 5/06* (2006.01)
*B82Y 20/00* (2011.01)
(Continued)

(52) U.S. Cl.
CPC ................. *H01S 5/06* (2013.01); *B82Y 20/00* (2013.01); *G03F 7/70025* (2013.01);
(Continued)

(58) Field of Classification Search
CPC .... H01S 3/2308; H01S 3/2316; H01S 5/0612; H01S 5/0622; H01S 5/14; H01S 5/141; H01S 5/143
(Continued)

(56) References Cited

U.S. PATENT DOCUMENTS 6,421,363 B1   7/2002 Osinski et al.
6,526,071 B1 * 2/2003 Zorabedian et al. ........... 372/20
(Continued)

FOREIGN PATENT DOCUMENTS

EP    0110201 A2    6/1984
JP    H04-76976 A   3/1992
(Continued)

OTHER PUBLICATIONS

Liaw S.K. et al. "Passive gain equalization of erbium-doped fiber amplifier using samarium-doped fiber for multiwavelength transmission" Lasers and Electro-Optics, 1996. CLEO '96., Summaries of papers presented at the Conference on, Jun. 2, 1996, pp. 4-5, IEEE, Washington DC, USA.
(Continued)

*Primary Examiner* — Joshua King
(74) *Attorney, Agent, or Firm* — Studebaker & Brackett PC

(57) ABSTRACT

A laser apparatus may include: a master oscillator configured to output a pulsed laser beam at a repetition rate, the master oscillator including at least one semiconductor laser apparatus; at least one amplifier configured to amplify the pulsed laser beam from the master oscillator, the at least one amplifier being configured to include at least one gain bandwidth; and a controller for controlling a parameter affecting an output wavelength of the pulsed laser beam from the master oscillator such that a wavelength chirping
(Continued)

range of the pulsed laser beam from the master oscillator overlaps at least a part of the at least one gain bandwidth.

18 Claims, 37 Drawing Sheets

(51) Int. Cl.
    *G03F 7/20*     (2006.01)
    *H01S 3/23*     (2006.01)
    *H01S 5/062*     (2006.01)
    *H01S 3/13*     (2006.01)
    *H01S 3/223*     (2006.01)
    *H01S 5/065*     (2006.01)
    *H01S 5/14*     (2006.01)
    *H01S 5/34*     (2006.01)
    *H01S 5/40*     (2006.01)
    *H05G 2/00*     (2006.01)

(52) U.S. Cl.
    CPC ........ *G03F 7/70033* (2013.01); *H01S 3/2316* (2013.01); *H01S 5/0622* (2013.01); *H01S 5/06216* (2013.01); *H01S 3/1305* (2013.01); *H01S 3/2232* (2013.01); *H01S 3/235* (2013.01); *H01S 3/2375* (2013.01); *H01S 5/0612* (2013.01); *H01S 5/0653* (2013.01); *H01S 5/0654* (2013.01); *H01S 5/141* (2013.01); *H01S 5/3402* (2013.01); *H01S 5/4025* (2013.01); *H05G 2/003* (2013.01); *H05G 2/005* (2013.01); *H05G 2/008* (2013.01)

(58) Field of Classification Search
    USPC .......................................................... 372/26
    See application file for complete search history.

(56) References Cited

U.S. PATENT DOCUMENTS

| | | | |
|---|---|---|---|
| 6,661,815 B1* | 12/2003 | Kozlovsky et al. ............ | 372/20 |
| 7,518,787 B2 | 4/2009 | Bykanov et al. | |
| 2002/0122260 A1 | 9/2002 | Okazaki et al. | |
| 2003/0219054 A1 | 11/2003 | Capasso et al. | |
| 2004/0258107 A1* | 12/2004 | Sherrer et al. ................. | 372/19 |
| 2005/0157303 A1 | 7/2005 | Langford et al. | |
| 2005/0254531 A1 | 11/2005 | Furukawa et al. | |
| 2006/0078017 A1 | 4/2006 | Endo et al. | |
| 2007/0229939 A1 | 10/2007 | Brown et al. | |
| 2008/0013163 A1* | 1/2008 | Leonardo ................ | G02F 1/353 359/341 |
| 2008/0019889 A1 | 1/2008 | Rogers et al. | |
| 2008/0149862 A1 | 6/2008 | Hansson et al. | |
| 2008/0175279 A1* | 7/2008 | Kakui ............................ | 372/10 |
| 2008/0179548 A1 | 7/2008 | Bykanov et al. | |
| 2008/0210889 A1 | 9/2008 | Suganuma et al. | |
| 2009/0087186 A1* | 4/2009 | Holman et al. ............... | 398/102 |
| 2009/0134967 A1 | 5/2009 | Naito et al. | |
| 2010/0193710 A1 | 8/2010 | Wakabayashi et al. | |
| 2010/0220756 A1* | 9/2010 | Krzysztof et al. ......... | 372/38.02 |
| 2011/0220816 A1 | 9/2011 | Kakizaki et al. | |

FOREIGN PATENT DOCUMENTS

| | | | |
|---|---|---|---|
| JP | 2003-115631 | A | 4/2003 |
| JP | 2005-522694 | A | 7/2005 |
| JP | 2006-091285 | A | 4/2006 |
| JP | 2006-267457 | A | 10/2006 |
| WO | WO2011/108761 | A1 | 9/2011 |

OTHER PUBLICATIONS

International Search Report issued in PCT/IB2012/000113, mailed on Oct. 22, 2012.

An Office Action; "Notice of Reason for Rejection," issued by the Japanese Patent Office on Mar. 15, 2016, which corresponds to Japanese Patent Application No. 2011-271346 and is related to U.S. Appl. No. 13/817,817; with English language translation.

An Office Action; "Notice of Reason for Rejection," issued by the Japanese Patent Office on Sep. 1, 2015, which corresponds to Japanese Patent Application No. 2011-271346 and is related to U.S. Appl. No. 13/817,817; with English language translation.

* cited by examiner

LASER APPARATUS, EXTREME ULTRAVIOLET LIGHT GENERATION SYSTEM, METHOD FOR CONTROLLING THE LASER APPARATUS, AND METHOD FOR GENERATING THE EXTREME ULTRAVIOLET LIGHT

RELATED APPLICATIONS

This application is the U.S. National Phase under 35 U.S.C. §371 of International Application No. PCT/1132012/000113, filed on Jan. 25, 2012, which in turn claims the benefit of Japanese Application No. 2011-026228, filed on Feb. 9, 2011 and Japanese Application No. 2011-271346, filed on Dec. 12, 2011, the disclosures of which Applications are incorporated by reference herein.

CROSS-REFERENCE TO RELATED APPLICATIONS

The present application claims priority from Japanese Patent Application No. 2011-026228 filed Feb. 9, 2011, and Japanese Patent Application No. 2011-271346 filed Dec. 12, 2011.

BACKGROUND

1. Technical Field

This disclosure relates to a laser apparatus, an extreme ultraviolet (EUV) light generation system, a method for controlling the laser apparatus, and a method for generating the EUV light.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication at 32 nm or less, for example, an exposure apparatus is expected to be developed, in which an apparatus for generating EUV light at a wavelength of approximately 13 nm is combined with a reduced projection reflective optical system.

Three kinds of systems for generating EUV light have been known in general, which include a Laser Produced Plasma (LPP) type system in which plasma generated by irradiating a target material by a laser beam is used, a Discharge Produced Plasma (DPP) type system in which plasma generated by electric discharge is used, and a Synchrotron Radiation (SR) type system in which orbital radiation is used.

SUMMARY

A laser apparatus according to one aspect of this disclosure may include: a master oscillator configured to output a pulsed laser beam at a repetition rate, the master oscillator including at least one semiconductor laser apparatus; at least one amplifier configured to amplify the pulsed laser beam from the master oscillator, the at least one amplifier being configured to include at least one gain bandwidth; and a controller for controlling a parameter affecting an output wavelength of the pulsed laser beam from the master oscillator such that a wavelength chirping range of the pulsed laser beam from the master oscillator overlaps at least a part of the at least one gain bandwidth.

A laser apparatus according to another aspect of this disclosure may include: a master oscillator configured to output a pulsed laser beam at a repetition rate, the master oscillator including at least one semiconductor laser apparatus which includes a semiconductor laser device, an optical resonator including an output coupler and a grating between which the semiconductor laser device is provided; at least one amplifier configured to amplify the pulsed laser beam outputted from the master oscillator, the at least one amplifier being configured to include at least one gain bandwidth; and a controller for controlling a parameter affecting an output wavelength of the pulsed laser beam outputted from the master oscillator such that a wavelength chirping range of the pulsed laser beam to be outputted from the master oscillator overlaps at least a part of the at least one gain bandwidth.

An extreme ultraviolet light generation system according to yet another aspect of this disclosure may include: a laser apparatus including a master oscillator configured to output a pulsed laser beam at a repetition rate, the master oscillator including at least one semiconductor laser apparatus, at least one amplifier configured to amplify the pulsed laser beam from the master oscillator, the at least one amplifier being configured to include at least one gain bandwidth, and a controller for controlling a parameter affecting an output wavelength of the pulsed laser beam from the master oscillator such that a wavelength chirping range of the pulsed laser beam from the master oscillator overlaps at least a part of the at least one gain bandwidth; a chamber; a target supply unit configured to supply a target material toward a predetermined region inside the chamber; and a collector mirror for selectively reflecting at least extreme ultraviolet light emitted in the predetermined region inside the chamber.

A method for controlling a laser apparatus comprising a master oscillator including a semiconductor laser apparatus, and an amplifier, according to still another aspect of this disclosure may include: outputting a pulsed laser beam from the master oscillator while controlling a parameter affecting an output wavelength of the pulsed laser beam from the master oscillator such that a wavelength chirping range of the pulsed laser beam from the master oscillator overlaps at least a part of at least one gain bandwidth; and amplifying the pulsed laser beam from the master oscillator in the amplifier, the amplifier being configured to have at least one gain bandwidth.

A method for generating an extreme ultraviolet light in an extreme ultraviolet light generation system including a laser apparatus, a chamber, a target supply unit, and a collector mirror, according to still another aspect of this disclosure may include: outputting a pulsed laser beam from the master oscillator while controlling a parameter affecting an output wavelength of the pulsed laser beam from the master oscillator such that a wavelength chirping range of the pulsed laser beam from the master oscillator overlaps at least a part of at least one gain bandwidth; amplifying the pulsed laser beam outputted from the master oscillator in the amplifier, the amplifier being configured to have at least one gain bandwidth; irradiating a target material by the amplified pulsed laser beam in a predetermined region inside the chamber; and outputting the extreme ultraviolet light emitted in the predetermined region inside the chamber by selectively reflecting the extreme ultraviolet light.

BRIEF DESCRIPTION OF THE DRAWINGS

Hereinafter, selected embodiments of this disclosure will be described with reference to the accompanying drawings.

DESCRIPTION OF PREFERRED EMBODIMENTS

Figure 1:
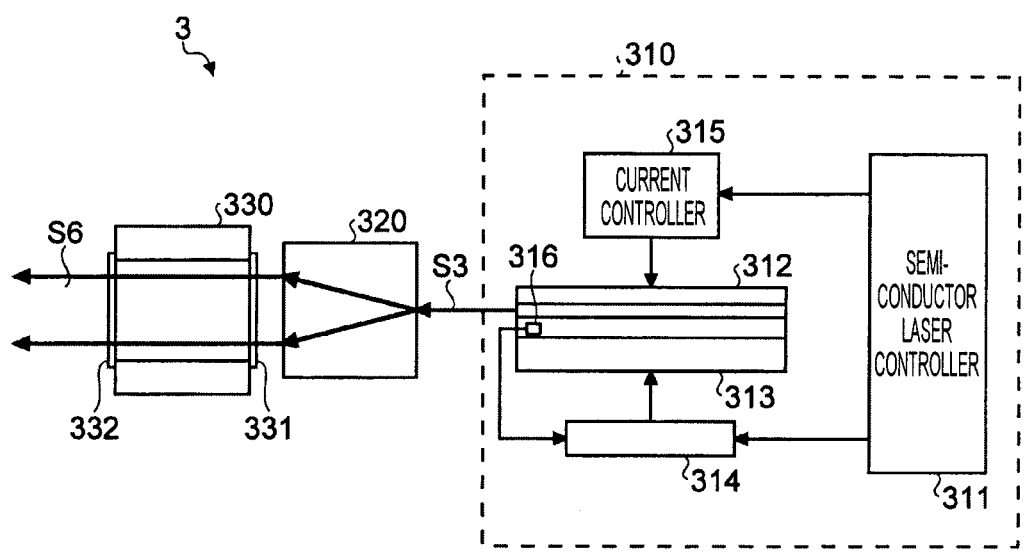
FIG. 1 schematically illustrates the configuration of a laser apparatus according to a first embodiment.

Hereinafter, selected embodiments of this disclosure will be described in detail with reference to the accompanying drawings. The embodiments to be described below are merely illustrative in nature and do not limit the scope of this disclosure. Further, the configuration(s) and operation(s) described in each embodiment are not all essential in implementing this disclosure. Note that like elements are referenced by like reference numerals and characters, and duplicate descriptions thereof will be omitted herein.

Hereinafter, a laser apparatus, an extreme ultraviolet light generation system, a method for controlling the laser apparatus, and a method for controlling the extreme ultraviolet light generation system will be described in detail with reference to the accompanying drawings. This disclosure will be described following the table of contents below.

Contents
1. Overview
2. Terms
3. $CO_2$ Laser Apparatus with QCL as MO
3.1 Embodiment Where Single QCL Is Used as MO (First Embodiment)
3.1.1 Configuration
3.1.2 Operation
3.1.2.1 Overview of Operation of Laser Apparatus
3.1.2.2 Overview of Operation of Semiconductor Laser Apparatus
3.1.2.3 Amplification Control by $CO_2$ Gas Gain Medium
3.1.2.3.1 Case Where Initial Wavelength in Wavelength Chirping Range of QCL Laser Beam Overlaps Part of Gain Bandwidth of $CO_2$ Gas Gain Medium
3.1.2.3.2 Case Where Wavelength Chirping Range of QCL Laser Beam Overlaps Entirety of Single Gain Bandwidth of $CO_2$ Gas Gain Medium
3.1.3 Semiconductor Laser
3.1.3.1 Internal-Resonator Type Semiconductor Laser
3.1.3.2 External-Resonator Type Semiconductor Laser
3.1.4 Wavelength Chirping Characteristics of QCL
3.1.5 Amplification Properties of $CO_2$ Gas Gain Medium
3.2 Embodiment Including Regenerative Amplifier (Second Embodiment)
3.2.1 Configuration
3.2.2 Operation
3.2.2.1 Overview of Operation of Laser Apparatus
3.2.2.2 Amplification Control Including Regenerative Amplifier
3.2.2.2.1 Regenerative Amplifier
3.2.2.2.1.1 Configuration
3.2.2.2.1.2 Operation
3.2.2.2.1.3 Delaying Pulsed Laser Beam by Regenerative Amplifier
3.3 Embodiment Where Multiple QCLs Are Used as MO (Third Embodiment)
3.3.1 Configuration
3.3.2 Operation
3.3.3 Combination of Oscillation Wavelength of Semiconductor Laser and Gain Bandwidth of $CO_2$ gas Gain Medium
3.3.3.1 Case Where Single QCL Is Allocated to Each Gain Bandwidth
3.3.3.2 Case Where Multiple QCLs are Allocated to Single Gain Bandwidth
3.3.3.3 Case Where Number of QCLs Allocated to Each Gain Bandwidth is Modified In Accordance with Gain of Each Gain Bandwidth
3.3.4 Waveform Control of Amplified Pulsed Laser Beam by Adjusting Timing of QCLs
3.3.4.1 Case Where Timings at Which Amplified Pulsed Laser Beams Are Outputted From Amplifier Are Controlled to Coincide with Each Other
3.3.4.2 Case Where Timings at Which Amplified Pulsed Laser Beams Are Outputted From Amplifier Are Offset from One Another
3.4 Embodiment Where Laser Apparatus With Multiple QCLs as MO Includes Regenerative Amplifier (Fourth Embodiment)
3.5 Longitudinal Mode Outputted by QCL
3.5.1 Resonator of QCL
3.5.2 Relationship Between Longitudinal Mode of QCL and Wavelength Selectivity by Grating
3.5.3 Controlling Beam Path Length
3.5.4 Controlling Current Pulse to Flow in Semiconductor Laser Device
3.5.5 Setting Wavelength Selectivity by Design
4. Control System of $CO_2$ Laser Apparatus with QCL as MO (Fifth Embodiment)
4.1 Configuration
4.2 Overview of Operation
4.3 Control Parameters and Measuring System Thereof
4.3.1 Measuring Configuration
4.3.2 Chirping Characteristics
4.3.3 Measuring Operation
4.4 Amplification Control Operation
4.5 Control System of $CO_2$ Laser Apparatus Capable of Feedback-Control (Sixth Embodiment)
4.5.1 Feedback-Control Configuration
4.5.2 Feedback-Control Operation
5. Extreme Ultraviolet Light Generation System (Seventh Embodiment)
5.1 Exemplary Laser Produced Plasma Type EUV Light Generation System
5.1.1 Configuration
5.1.2 Operation
5.2 EUV Light Generation System to Which $CO_2$ Laser Apparatus with QCL as MO Is Applied (Eighth Embodiment)
5.2.1 Configuration
5.2.2 Operation
5.2.2.1 Flow of Controlling Timing at Which Target Is Irradiated by Pulsed Laser Beam
5.2.2.1.1 Main Flow
5.2.2.1.2 Chirping Range Adjusting Processing
5.2.2.1.3 Timing Adjusting Processing
5.3 EUV Light Generation System to Which $CO_2$ Laser Apparatus with Multiple QCLs as MO Is Applied (Ninth Embodiment)
5.3.1 Configuration
5.3.2 Operation
6. Supplementary Descriptions 6.1 Beam Path Adjusting Unit for Multiple QCL Laser Beams
6.1.1 Beam Path Adjusting Unit for Multiple QCL Laser Beams at Different Oscillation Wavelengths
6.1.2 Beam Path Adjusting Unit for Multiple QCL Laser Beams at the Same Oscillation Wavelength
6.2 Case Where Semiconductor Laser That Oscillates at Multi-Longitudinal Mode Is Applied 1. Overview An overview of the embodiments described below is as follows. In some of the embodiments of this disclosure, the chirping range in wavelengths of a semiconductor laser beam is controlled such that at least part of the chirping range overlaps at least part of a gain bandwidth of a molecular gas gain medium.

2. Terms

Terms used in this disclosure will be defined as follows. The term "plasma generation region" can refer to a three-dimensional space in which plasma is generated. The term "droplet" can refer to one or more liquid droplet(s) of a molten target material. Accordingly, the shape of the droplet is generally substantially spherical due to the surface tension at the surface of the droplet. The term "beam path" is a path along which a laser beam travels. The "beam path length" is a product of a distance in which the light actually travels and a refraction index of a medium through which the light travels. The "gain bandwidth" is a bandwidth in which a laser beam can be amplified as it travels through the gain medium.

In a beam path of a laser beam, the side toward the source of the laser beam is referred to as "upstream," and the side toward the target of the laser beam is referred to as "downstream."

3. $CO_2$ Laser Apparatus with QCL as MO

A laser apparatus according to one aspect of this disclosure will be illustrated with examples.

3.1 Embodiment where Single QCL is Used as MO (First Embodiment)

A laser apparatus where a single quantum cascade laser (QCL) is used as a master oscillator will be described in detail with reference to the drawings.

3.1.1 Configuration

FIG. 1 schematically illustrates the configuration of a laser apparatus 3 according to a first embodiment. As illustrated in FIG. 1, the laser apparatus 3 may include a semiconductor laser apparatus 310, a relay optical system 320, and an amplifier 330. Various amplifiers, such as a regenerative amplifier and a slab amplifier, may be used as the amplifier 330. The laser apparatus 3 may include a plurality of amplifiers 330 connected serially.

The semiconductor laser apparatus 310 may serve as a master oscillator (MO). The semiconductor laser apparatus 310 may include a semiconductor laser controller 311, a semiconductor laser device 312, a Peltier device 313, a temperature controller 314, a current controller 315, and a temperature sensor 316.

The current controller 315 may be configured to input current pulses to the semiconductor laser device 312 under the control of the semiconductor laser controller 311 so that the semiconductor laser device 312 can oscillate.

The temperature sensor 316 may be in contact with the semiconductor laser device 312. The temperature sensor 316 may measure the temperature of or around an active layer in the semiconductor laser device 312, or may measure the temperature at a position distanced from the active layer. The Peltier device 313 may be in contact with the semiconductor laser device 312 along the direction in which the active layer of the semiconductor laser device 312 extends. The temperature sensor 316 may input the measured values to the temperature controller 314. The temperature controller 314 may actuate the Peltier device 313 in accordance with the measured values inputted from the temperature sensor 316, under the control of the semiconductor laser controller 311. With this, the temperature of the semiconductor laser device 312 may be controlled.

The amplifier 330 may be configured to amplify the pulsed laser beam from the semiconductor laser apparatus 310. The amplifier 330 may be a power amplifier (PA) or a power oscillator (PO). The amplifier 330 may include a sealed chamber. The chamber may be provided with windows 331 and 332, through which the pulsed laser beam may travel. The chamber may be filled with a gas containing $CO_2$ gas, for example. Further, the amplifier 330 may be provided with at least a pair of discharge electrodes and a power source (not shown) for applying voltage between the discharge electrodes so as to excite the gas. The amplifier 330 may be configured to excite the gas inside the chamber, and the excited gas may serve as a gain medium (hereinafter, referred to as $CO_2$ gas gain medium).

The relay optical system 320 may guide the pulsed laser beam outputted from the semiconductor laser apparatus 310 to the amplifier 330. The relay optical system 320 may include an optical system for expanding the pulsed laser beam in diameter (beam cross-section), for example. Here, the beam cross-section may refer to a region along a plane perpendicular to the axis of the pulsed laser beam, in which the beam intensity is at or above a predetermined value across the planar region. The pulsed laser beam that has been expanded in diameter may pass through most of the space where the $CO_2$ gas gain medium is present inside the amplifier 330. With this, the pulsed laser beam can be amplified efficiently.

3.1.2 Operation

Subsequently, the operation of the laser apparatus 3 will be described.

3.1.2.1 Overview of Operation of Laser Apparatus

General operation of the laser apparatus 3 will be described first. A pulsed laser beam S3 may be outputted from the semiconductor laser apparatus 310. The outputted pulsed laser beam S3 may enter the relay optical system 320 and be expanded in diameter by the relay optical system 320. The pulsed laser beam S3, which has been expanded in diameter, may enter the amplifier 330 through the window 331 provided at the input side of the chamber. The pulsed laser beam S3 that has entered the amplifier 330 may be amplified as it travels through the $CO_2$ gas gain medium inside the chamber. With this, an amplified pulsed laser beam S6 may be outputted from the amplifier 330 through the window 332 provided at the output side of the chamber.

3.1.2.2 Overview of Operation of Semiconductor Laser Apparatus

General operation of the semiconductor laser apparatus 310 will be described. In the semiconductor laser apparatus 310, a waveform signal for generating a current pulse (hereinafter referred to as a current pulse waveform) may be inputted to the current controller 315 from the semiconductor laser controller 311. The current controller 315 may cause a current pulse of a predetermined waveform to flow in the semiconductor laser device 312 based on the inputted current pulse waveform. When the current pulse flows in the semiconductor laser device 312, the semiconductor laser device 312 may oscillate. As a result, the pulsed laser beam S3 may be outputted from the semiconductor laser device 312.

Here, the wavelength of the pulsed laser beam S3 to be outputted from the semiconductor laser apparatus 310 may be controlled so as to overlap at least a part of the gain bandwidths of the $CO_2$ gas gain medium inside the amplifier 330. The wavelength of the pulsed laser beam S3 to be outputted from the semiconductor laser apparatus 310 may vary depending on the temperature of the semiconductor laser device 312. Accordingly, the wavelength of the pulsed laser beam S3 may be controlled by controlling the temperature of the semiconductor laser device 312. Here, the temperature may be controlled by using feedback-control of the Peltier device 313 based on the temperature of the semiconductor laser device 312 detected by the temperature sensor 316, for example.

As mentioned above, the wavelength of the pulsed laser beam S3 to be outputted from the semiconductor laser apparatus 310 may vary depending on the temperature of the semiconductor laser device 312. Here, factors causing the temperature of the semiconductor laser device 312 to fluctuate may include, in addition to the fact that the semiconductor laser device 312 is heated or cooled directly by a heater or a cooling device, ohmic heating resulting from current supplied to the semiconductor laser device 312. The wavelength of the pulsed laser beam S3 to be outputted from the semiconductor laser apparatus 310 may chirp depending on the change in temperature of the semiconductor laser device 312. Typically, a wavelength chirping range of a pulsed laser beam outputted from a semiconductor laser is wider than a gain bandwidth of the $CO_2$ gas gain medium in an amplifier. Thus, only a part of the pulsed laser beam may be amplified in a given amplifier in some cases. Accordingly, in order to amplify the pulsed laser beam S3 efficiently in the amplifier 330, the semiconductor laser apparatus 310 may be controlled such that at least a part of the chirping range of the output wavelength of the semiconductor laser apparatus 310 overlaps at least a part of a gain bandwidth of the $CO_2$ gas gain medium. Here, the output wavelength of the semiconductor laser apparatus 310 may refer to the central wavelength or the peak wavelength of the pulsed laser beam S3 outputted from the semiconductor laser apparatus 310 at a given time.

3.1.2.3 Amplification Control by $CO_2$ Gas Gain Medium

As mentioned above, in the amplification control of the pulsed laser beam S3, the semiconductor laser apparatus 310 may be controlled such that at least a part of the chirping range of the output wavelength (hereinafter, simply referred to as wavelength chirping range) of the semiconductor laser apparatus 310 overlaps at least a part of a gain bandwidth of the $CO_2$ gas gain medium. With this, the pulsed laser beam S3 may be amplified by the $CO_2$ gas gain medium for a duration in which the wavelength of the pulsed laser beam S3 overlaps the given gain bandwidth. Hereinafter, examples of the amplification control will be discussed. In the case shown below, the pulsed laser beam S3 is amplified using a gain bandwidth at P(18) transition of the $CO_2$ gas gain medium.

Figure 2:
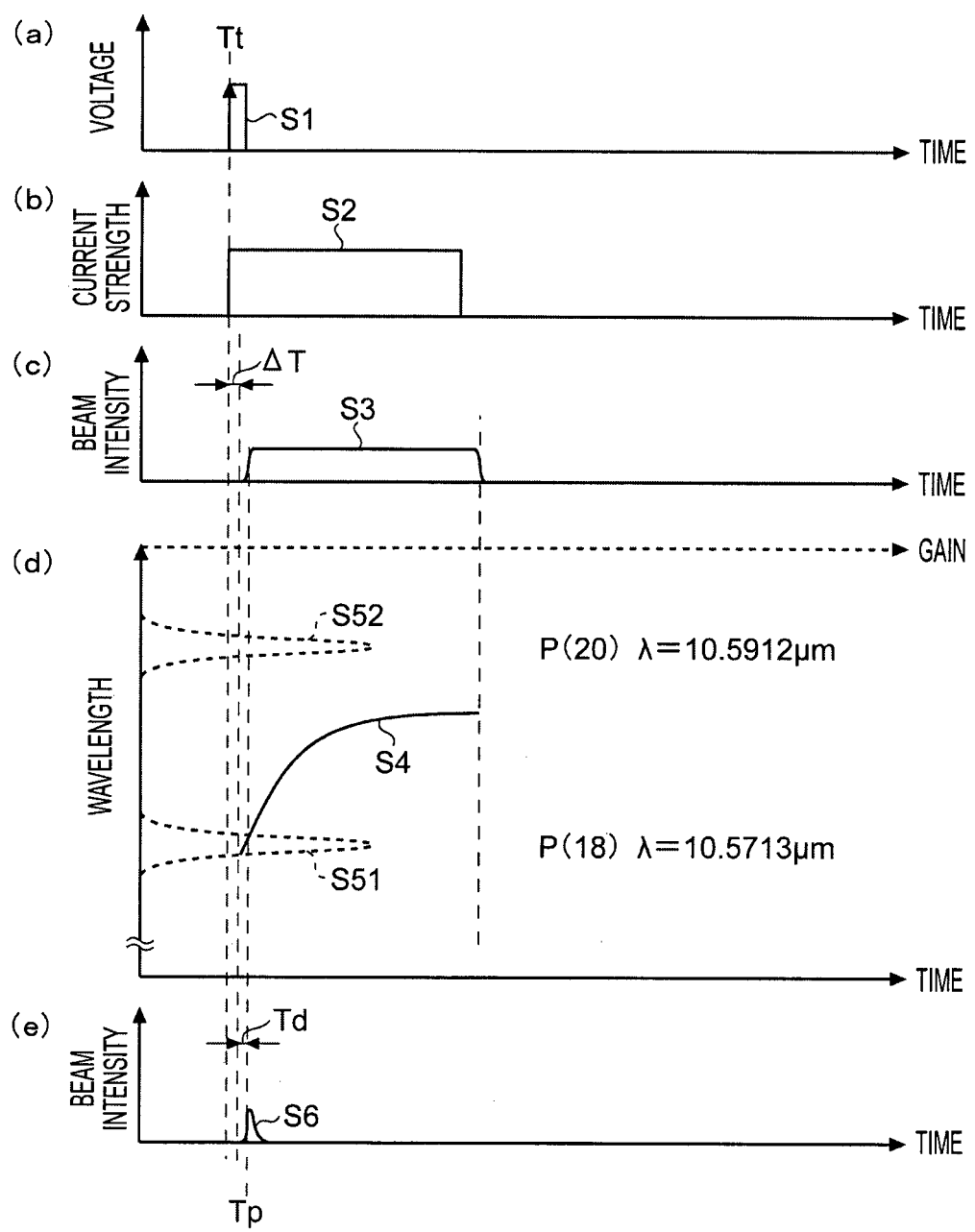
FIG. 2 illustrates an example of amplification control in the first embodiment where the initial wavelength of the wavelength chirping range is made to overlap a gain bandwidth of the $CO_2$ gas gain medium.

3.1.2.3.1 Case where Initial Wavelength in Wavelength Chirping Range of QCL Laser Beam Overlaps Part of Gain Bandwidth of $CO_2$ Gas Gain Medium First, the case where the initial wavelength of a wavelength chirping range is controlled to overlap a gain bandwidth of the $CO_2$ gas gain medium will be illustrated as an example. FIG. 2 illustrates an example of amplification control in such case.

As shown in FIG. 2, an oscillation trigger S1 may be inputted to the semiconductor laser apparatus 310 at a timing Tt, for example (see FIG. 2(a)). Then, a current pulse S2 of predetermined strength may flow in the semiconductor laser device 312 for a predetermined period (see FIG. 2(b)). With this, the semiconductor laser apparatus 310 may oscillate, and the pulsed laser beam S3 of intensity in accordance with the current waveform may be outputted at a timing delayed by a delay time ΔT (see FIG. 2(c)). The rise of the pulsed laser beam S3 may be at a timing Tt+ΔT.

Here, as shown in FIG. 2(d), an output wavelength (which is also referred to as a temporal waveform in this disclosure) S4 of the pulsed laser beam S3 may shift toward a longer wavelength with time. This phenomenon is the wavelength chirping. Accordingly, the temperature controller 314 may control the temperature of the semiconductor laser device 312 by using the Peltier device 313 such that the initial wavelength of the output wavelength S4 overlaps the gain bandwidth S51 at P(18) transition of the $CO_2$ gas gain medium. With this, the pulsed laser beam S3 may be amplified for a duration in which the output wavelength S4 of the pulsed laser beam S3 overlaps the gain bandwidth S51 (that is, the initial portion of the temporal waveform of the pulsed laser beam S3). Thereafter, the output wavelength S4 of the pulsed laser beam S3 may continue to chirp toward the longer wavelength. Then, when the output wavelength S4 goes outside the gain bandwidth S51, the pulsed laser beam 3 ceases to be amplified. According to such operation, as shown in FIG. 2(e), for a duration in which the output wavelength S4 of the pulsed laser beam S3 overlaps the gain bandwidth S51, the amplified pulsed laser beam S6 may be outputted from the amplifier 330. A rise timing Tp of the pulsed laser beam S6 may be delayed by a delay time Td from the output timing Tt+ΔT of the pulsed laser beam S3.

In this way, when the initial wavelength of the wavelength chirping range is controlled to overlap the gain bandwidth of the $CO_2$ gas gain medium, an onset of the amplification period of the pulsed laser beam S3 may be delayed by a slight delay time ΔT from the input of the oscillation trigger. Accordingly, synchronizing the oscillation of the laser apparatus 3 with generation of droplets by a droplet generator (see droplet generator 26 in FIG. 41) may be facilitated, for example.

Figure 3:
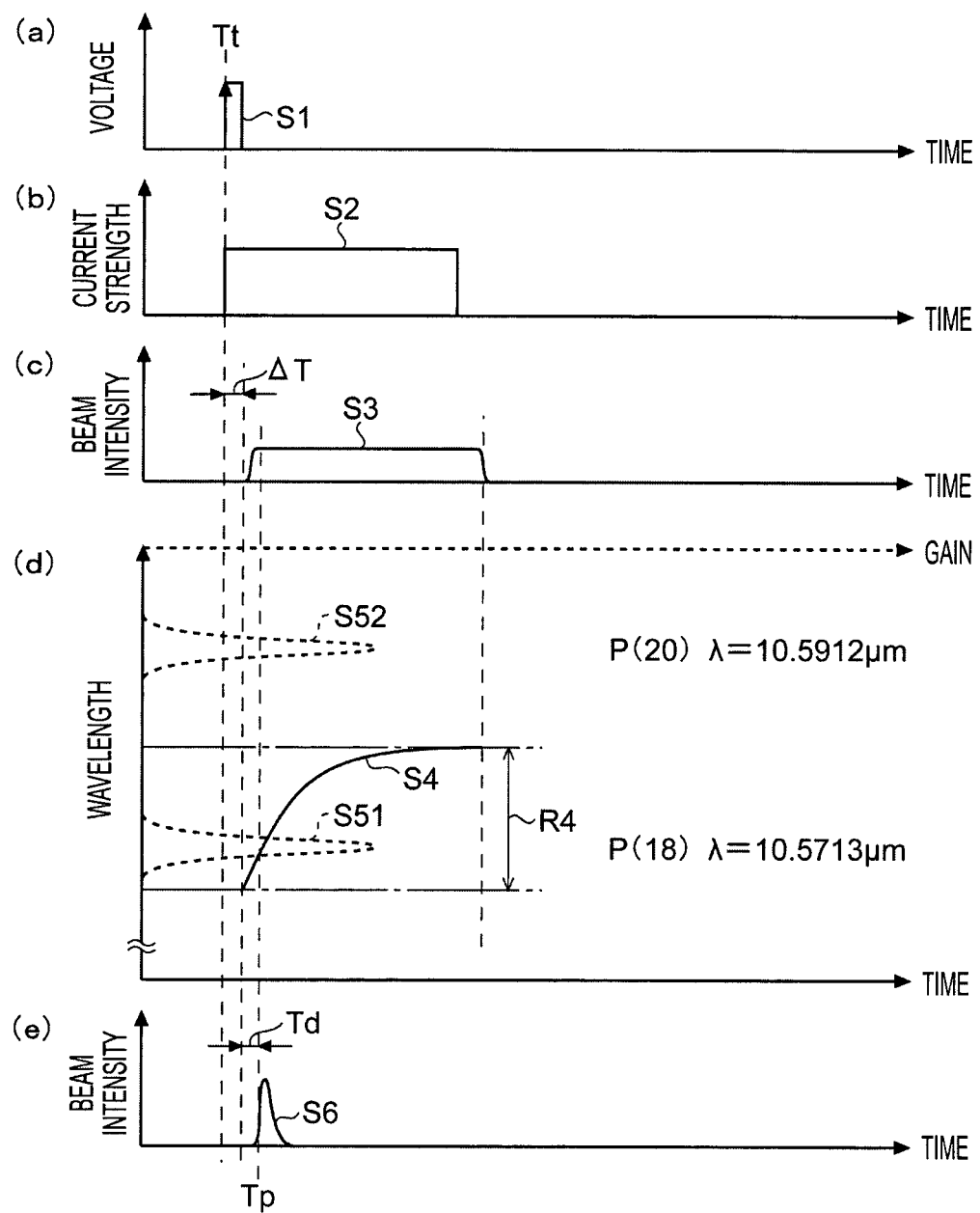
FIG. 3 illustrates an example of amplification control in the first embodiment where the wavelength chirping range is controlled such that a part thereof overlaps the entirety of a gain bandwidth of the $CO_2$ gas gain medium.

3.1.2.3.2 Case where Wavelength Chirping Range of QCL Laser Beam Overlaps Entirety of Single Gain Bandwidth of $CO_2$ Gas Gain Medium Subsequently, the case where the wavelength chirping range is controlled so as to overlap the entirety of a single gain bandwidth of the $CO_2$ gas gain medium will be illustrated as an example. FIG. 3 illustrates an example of amplification control in such case.

As shown in FIGS. 3(a) through 3(c), the timings and operation from the input of the oscillation trigger S1 until the pulsed laser beam S3 is outputted may be similar to the case shown in FIGS. 2(a) through 2(c). However, as shown in FIGS. 3(c) and 3(d), the temperature controller 314 may control the temperature of the semiconductor laser device 312 by using the Peltier device 313 such that the initial wavelength of the pulsed laser beam S3 is shorter than the gain bandwidth S51 at P(18) transition. Further, the temperature controller 314 may control the temperature of the semiconductor laser device 312 by using the Peltier device 313 such that the wavelength of the pulsed laser beam S3 at its falling edge is longer than the gain bandwidth S51. In other words, the temperature of the semiconductor laser device 312 may be controlled such that a wavelength chirping range R4 of the pulsed laser beam S3 contains the entirety of the gain bandwidth 51 at P(18) transition. According to such operation, as shown in FIG. 3(e), for a duration in which the output wavelength S4 of the pulsed laser beam S3 overlaps the gain bandwidth S51, the amplified pulsed laser beam S6 may be outputted from the amplifier 330. The rise of the pulsed laser beam S6 may occur at the timing Tp, which is delayed by a delay time Td which is from the rise of the pulsed laser beam S3 until the output wavelength S4 starts to overlap the gain bandwidth S51.

Here, when the initial wavelength of the pulsed laser beam S3 is not controlled to overlap the gain bandwidth 551, the delay time Td (>ΔT) corresponding to the difference between the initial wavelength and the gain bandwidth S51 may be generated (see FIG. 3(d)). The delay time Td corresponds to the duration from the input of the oscillation trigger S1 into the semiconductor laser apparatus 310 until the amplified pulsed laser beam S6 is outputted. Accordingly, when the oscillation of the laser apparatus 3 is to be synchronized with the generation of droplets by the droplet generator (see FIG. 41) for generating the EUV light, the oscillation trigger S1 may need to be inputted, taking the above delay time Td into consideration.

When the wavelength chirping range is controlled so as to overlap the entirety of a single gain bandwidth as described above, the following advantages may be obtained, compared to the case where the initial wavelength of the wavelength chirping range is controlled to overlap a gain bandwidth of the $CO_2$ gas gain medium.
(1) The pulsed laser beam S6 that has been amplified more may be obtained.
(2) The pulsed laser beam S6 of a longer pulse width may be obtained.

Here, as shown in FIGS. 2(d) and 3(d), a change at the beginning in the temporal waveform S4 of the semiconductor laser apparatus 310 is greater than a change toward the end after that beginning in the temporal waveform S4. A portion in FIG. 2(d) where the temporal waveform S4 overlaps the gain bandwidth S51 is referred to as a first portion, and a portion in FIG. 3(d) where the temporal waveform S4 overlaps the gain bandwidth S51 is referred to as a second portion, in this disclosure. Durations in which the wavelength of the pulsed laser beam S3 overlaps the gain bandwidth S51 may differ between the first portion of FIG. 2(d) and the second portion of FIG. 3(d). For example, the duration of the second portion in FIG. 3(d) is longer than that of the first portion in FIG. 2(d). Accordingly, the temperature of the semiconductor laser device 312 may be controlled such that the portion toward the end of the temporal waveform S4 of the pulsed laser beam S3 (e.g., a portion other than the first portion) overlaps a gain bandwidth of the $CO_2$ gas gain medium. This may allow the duration in which the wavelength chirping range R4 overlaps the gain bandwidth S51 to become longer; thus, the pulsed laser beam S6 that is longer in duration and has larger energy may be obtained.

3.1.3 Semiconductor Laser

Subsequently, the semiconductor laser apparatus 310, which may be used in the laser apparatus 3 of the first embodiment, will be illustrated with examples.

3.1.3.1 Internal-Resonator Type Semiconductor Laser

Figure 4:
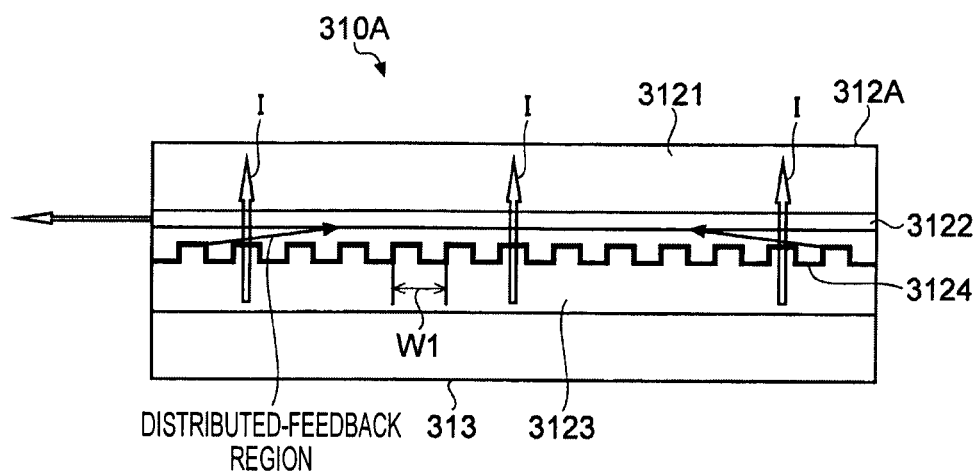
FIG. 4 schematically illustrates the configuration of a distributed-feedback semiconductor laser apparatus.

The case where an internal-resonator type semiconductor laser is used as the semiconductor laser apparatus 310 will be discussed, first. An example of the internal-resonator type semiconductor lasers may include a distributed-feedback semiconductor laser. FIG. 4 schematically illustrates the configuration of a distributed-feedback semiconductor laser apparatus 310A.

As illustrated in FIG. 4, the distributed-feedback semiconductor laser apparatus 310A may include a semiconductor laser device 312A and the Peltier device 313. Here, as in the semiconductor laser apparatus 310 described with reference to FIG. 1, the distributed-feedback semiconductor laser apparatus 310A may further include the semiconductor laser controller 311, the temperature controller 314, the current controller 315, and the temperature sensor 316.

The semiconductor laser device 312A may be formed such that a grating 3124 and an active layer 3122 are formed on a semiconductor substrate 3123. The top of the active layer 3122 may be protected by passivation layer 3121, for example. The active layer 3122 may serve as a gain medium for amplifying a laser beam. The grating 3124 may serve as both an optical resonator and a wavelength selector.

In the distributed-feedback semiconductor laser apparatus 310A, when a current I flows from a convex of the grating 3124 toward the active layer 3122, a portion of the active layer 3122 may function as a laser gain medium inside the active layer 3122. Further, an optical resonator may be formed by the grating 3124 formed on the semiconductor substrate 3123, whereby the oscillation wavelength may be selected. With the optical resonator and the gain medium, the laser oscillation may occur inside the distributed-feedback semiconductor laser apparatus 310A. As a result, the pulsed laser beam S3 may be outputted at a wavelength that may be determined by the selected wavelength by the grating 3124 and the optical path length of the optical resonator.

Here, the optical path length of the optical resonator formed in the distributed-feedback semiconductor laser apparatus 310A may be determined by the length of and the refractive index of the active layer 3122 of the semiconductor laser device 312A. The refractive index of the active layer 3122 may depend on the temperature. Accordingly, controlling the temperature of the semiconductor laser device 312A may allow the optical path length of the optical resonator to be controlled.

3.1.3.2 External-Resonator Type Semiconductor Laser

Figure 5:
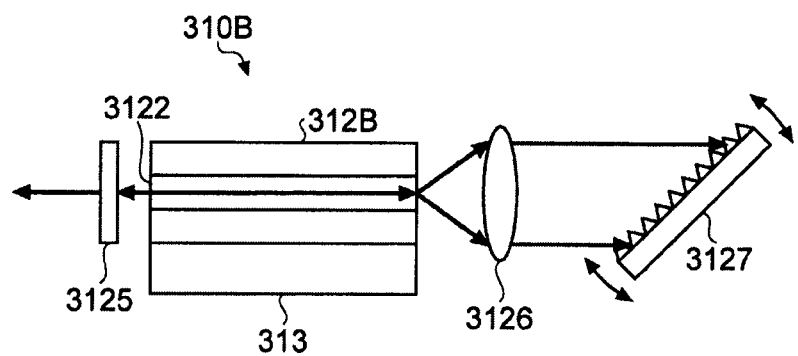
FIG. 5 schematically illustrates the configuration of an external-resonator type semiconductor laser apparatus.

Subsequently, the case where an external-resonator type semiconductor laser is used as the semiconductor laser apparatus 310 will be illustrated. FIG. 5 schematically illustrates the configuration of an external-resonator type semiconductor laser apparatus 310B.

As illustrated in FIG. 5, the external-resonator type semiconductor laser apparatus 310B may include an output coupler (OC) 3125, a semiconductor laser device 312B, the Peltier device 313, a collimator lens 3126, and a grating 3127.

The active layer 3122 may be formed inside the semiconductor laser device 312B. The active layer 3122 may serve as a gain medium. The output coupler 3125 and the grating 3127 may jointly form an optical resonator. Here, the grating 3127 may also function as a wavelength selector. The grating 3127 may be in Littrow arrangement so that the angle of incidence coincides with the angle of diffraction.

In the external-resonator type semiconductor laser apparatus 310B, when a predetermined pulsed current flows in the semiconductor laser device 312B, the inside of the active layer 3122 may be excited, to thereby function as a gain medium. Further, the optical resonator may be formed jointly by the output coupler 3125 and the grating 3127. With this, by controlling the current to flow in the semiconductor laser device 312B, the laser oscillation may occur in the external-resonator type semiconductor laser apparatus 310B. Accordingly, the pulsed laser beam S3 may be outputted from the semiconductor laser apparatus 310B at a wavelength that may be determined by the selected wavelength by the grating 3127 and the optical path length of the optical resonator. A posture of the grating can be controlled so that the pulsed laser beam is incident on the grating 3127 at a specified angle.

Here, the optical path length of the optical resonator formed in the external-resonator type semiconductor laser apparatus 310B may be determined by the length of and the refractive index of the active layer 3122 of the semiconductor laser device 312B. Similarly, the optical path length may depend on the distance between the output coupler 3125 and the semiconductor laser device 312B and the refractive index of that space (filled with the air, for example), and on the distance between the semiconductor laser device 312B and the grating 3127 and the refractive index of that space (filled with the air, for example). The refractive index of the active layer 3122 may depend on its temperature. Accordingly, controlling the temperature of the semiconductor laser device 312B may allow the optical path length of the optical resonator to be controlled. In the case of the external-resonator type semiconductor laser apparatus 310B, however, the optical path length of the optical resonator may also be controlled by controlling at least one of a type, a mixture ratio, and pressure of a gas with which the space between the output coupler 3125 and the semiconductor laser device 312B and the space between the semiconductor laser device 312B and the grating 3127 are filled.

3.1.4 Wavelength Chirping Characteristics of QCL

Subsequently, wavelength chirping characteristics of the semiconductor laser apparatus 310 will be discussed. The oscillation wavelength of the semiconductor laser apparatus 310 may partly depend on the optical path length of the optical resonator in the semiconductor laser apparatus 310. Further, it may also depend on the selected wavelength by the grating. As mentioned above, the optical path length of the optical resonator may vary as the refractive index of the active layer 3122 changes. The refractive index of the active layer 3122 may depend on its temperature. Accordingly, as the temperature of the semiconductor laser device 312 changes, the optical path length of the optical resonator in the semiconductor laser apparatus 310 may change, and as a result, the oscillation wavelength may change.

Figure 6:
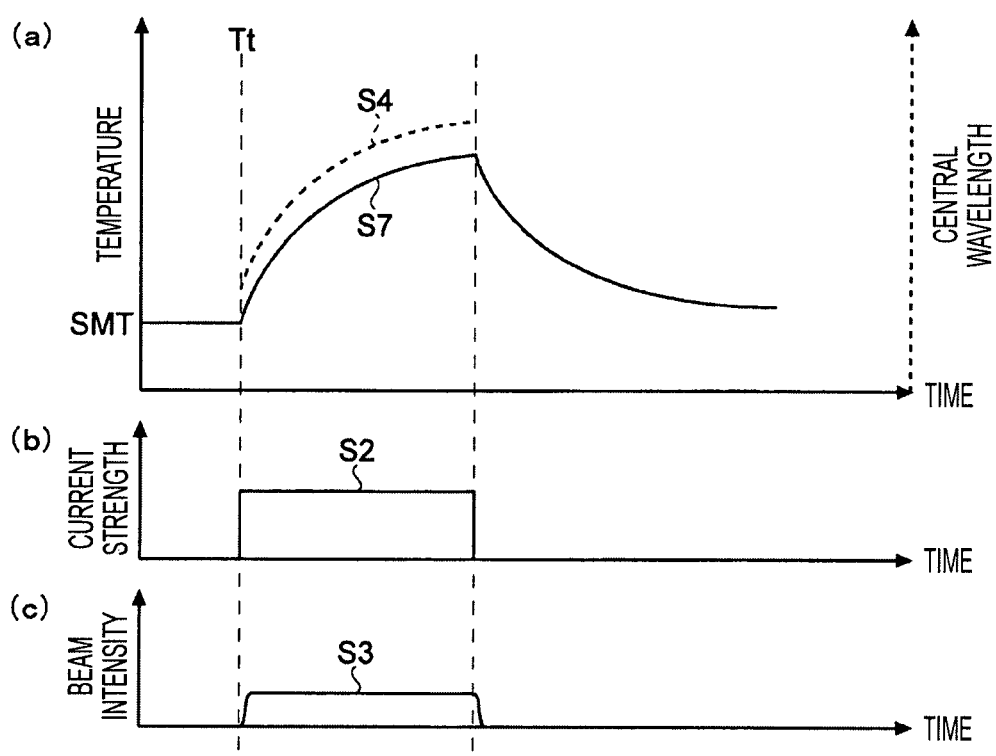
FIG. 6 illustrates an example according to the first embodiment where a pulsed laser beam is outputted by making a current flow in pulses in a semiconductor laser device.

Here, with reference to FIG. 6, the case where the current pulse S2 (see FIG. 6(b)) flows in the semiconductor laser device 312 to thereby cause the pulsed laser beam S3 (see FIG. 6(c)) to be outputted will be described. Even when the temperature of the semiconductor laser device 312 is controlled by using the Peltier device 313, the current pulse S2 flowing in the semiconductor laser device 312 may cause a temperature S7 of the active layer 3122 to fluctuate over time (see FIG. 6(a)). Accordingly, as shown in FIG. 6(a), the output wavelength S4 may chirp in accordance with the change in the temperature of the active layer 3122.

The temperature S7 of the active layer 3122 may rise rapidly at the beginning of the current pulse S2 and may rise steadily toward the end. Then, as the current pulse S2 is turned OFF, the temperature S7 of the active layer 3122 may start to fall, and thereafter may approach the temperature set by the Peltier device 313.

Here, as the temperature of the active layer 3122 rises, the refraction index of the active layer 3122 may increase, whereby the optical path length of the optical resonator may increase. Accordingly, the output wavelength S4 of the semiconductor laser apparatus 310 may shift rapidly toward the longer wavelength at the beginning of the current pulse S2, as in the change in the temperature S7 of the active layer 3122. This shift in the wavelength may become gradual toward the end of the current pulse S2. In this way, when the current pulse S2 flows in the semiconductor laser device 312, the wavelength of the pulsed laser beam S3 outputted from the semiconductor laser apparatus 310 may chirp.

3.1.5 Amplification Properties of $CO_2$ Gas Gain Medium

Figure 7:
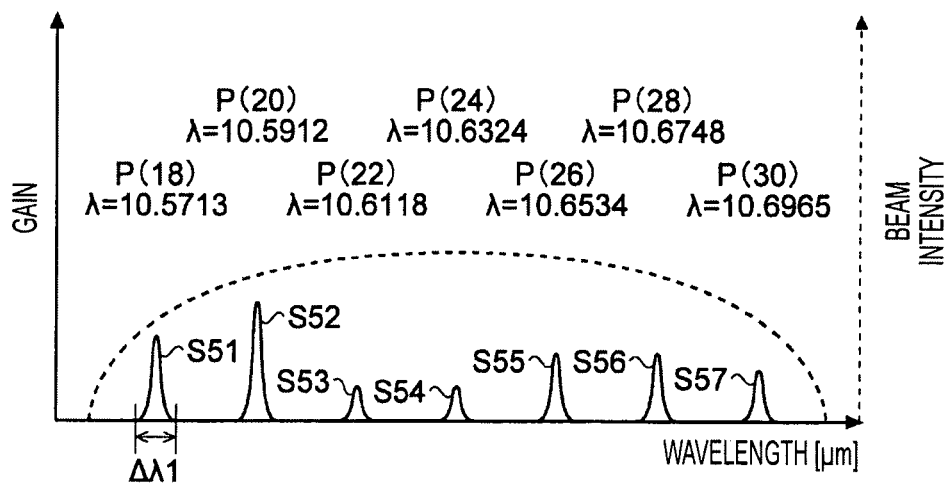
FIG. 7 illustrates gain bandwidths of the $CO_2$ gas gain medium.
Figure 8:
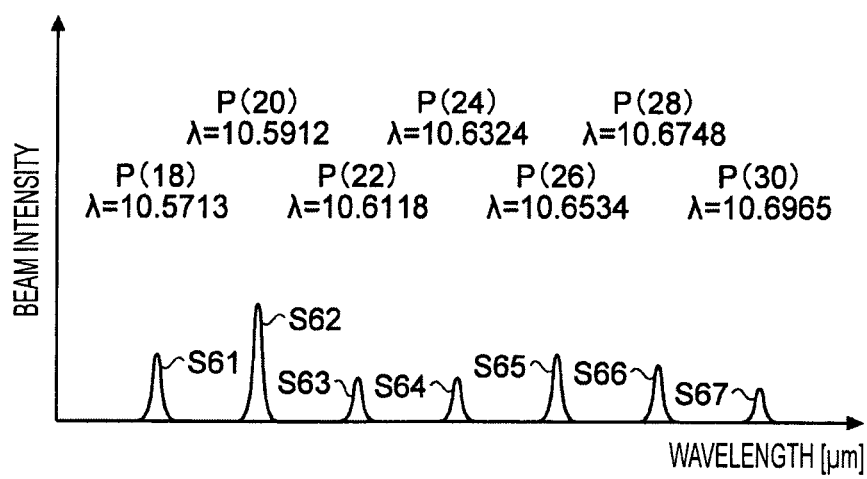
FIG. 8 illustrates amplified laser beams in each gain bandwidth of the $CO_2$ gas gain medium.

Subsequently, the amplification properties of the $CO_2$ gas gain medium in the amplifier will be discussed. FIGS. 7 and 8 illustrate gain bandwidths of the $CO_2$ gas gain medium.

As shown in FIG. 7, the $CO_2$ gas gain medium may have a plurality of gain bandwidths (for example, P(18), P(20), P(22), P(24), P(26), P(28), P(30) transitions) S51 through S57. The wavelength width of each of the gain bandwidths S51 through S57 may be approximately 0.0016 μm, for example. This wavelength width may be narrower than the wavelength chirping range of the pulsed laser beam S3 described with reference to FIG. 2. Further, the gain in each of the gain bandwidths S51 through S57 may differ from one another.

The pulsed laser beam S3 outputted from the semiconductor laser apparatus 310 may be amplified while the wavelength of the pulsed laser beam S3 overlaps at least one of the gain bandwidths S51 through S57. Here, assuming that the wavelength spectral profile of the pulsed laser beam S3 is a broad spectral profile having such a width that contains P(18) through P(30) transitions as shown in FIG. 7, the pulsed laser beam S3 amplified by the $CO_2$ gas gain medium may be outputted from the amplifier 330 as pulsed laser beams S61 through S67 with the beam intensity corresponding to the gain properties of the respective gain bandwidths S51 through S57, as shown in FIG. 8.

3.2 Embodiment Including Regenerative Amplifier (Second Embodiment)

Subsequently, the laser apparatus including the regenerative amplifier will be described in detail with reference to the drawings. In the second embodiment, the laser apparatus 3 serves as a basis, but the embodiment is not limited to the laser apparatus 3.

3.2.1 Configuration

Figure 9:
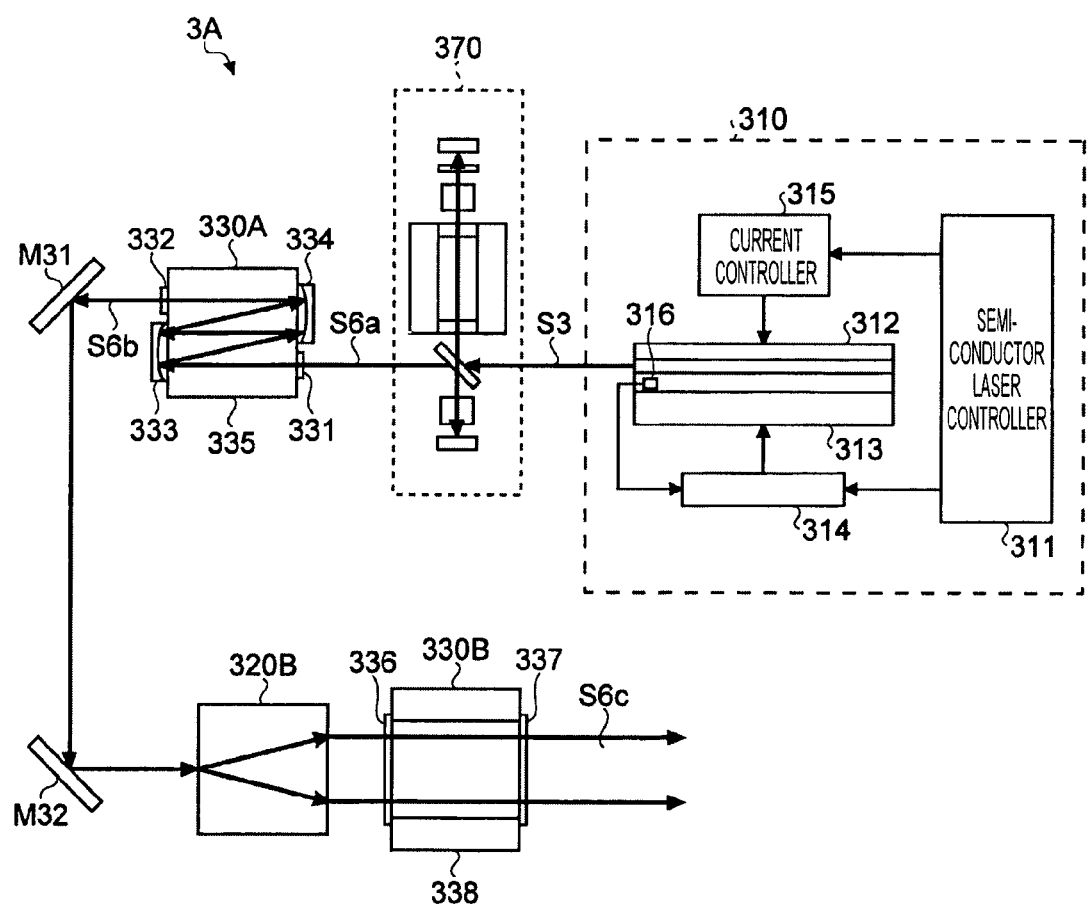
FIG. 9 schematically illustrates the configuration of a laser apparatus including a regenerative amplifier according to a second embodiment.

FIG. 9 schematically illustrates the configuration of a laser apparatus including a regenerative amplifier according to a second embodiment. As illustrated in FIG. 9, a laser apparatus 3A may include the semiconductor laser apparatus 310, a regenerative amplifier 370, a preamplifier 330A, high-reflection mirrors M31 and M32, a relay optical system 320B, and a main amplifier 330B. The relay optical system 320B may be disposed upstream from the main amplifier 330B in the direction in which the pulsed laser beam S6 travels.

The semiconductor laser apparatus 310 may be similar in configuration to the semiconductor laser apparatus 310 shown in FIG. 1. The regenerative amplifier 370 may be configured to amplify the pulsed laser beam S3 outputted from the semiconductor laser apparatus 310. To be more specific, the pulsed laser beam S3 that has entered the regenerative amplifier 370 may be amplified as it travels back and forth through a $CO_2$ gas gain medium inside the regenerative amplifier 370. With this, an amplified pulsed laser beam S6a may be outputted from the regenerative amplifier 370.

The preamplifier 330A may be a slab amplifier. The preamplifier 330A may include a chamber 335, an input window 331, an output window 332, and mirrors 333 and 334. The chamber 335 may be filled with the $CO_2$ gas. Further, two electrodes (not shown) may be provided inside the chamber 335 for exciting the $CO_2$ gas. The two mirrors 333 and 334 may be arranged to form a multipass optical path, along which the pulsed laser beam S6a travels back and forth through the $CO_2$ gas gain medium. The preamplifier 330A may be configured to further amplify the pulsed laser beam S6a that has been amplified in the regenerative amplifier 370 and output the amplified pulsed laser beam S6b.

The high-reflection mirrors M31 and M32 may be arranged to guide the pulsed laser beam S6b outputted from the preamplifier 330A to the relay optical system 320B. The relay optical system 320B may transform the shape of the beam cross-section of the pulsed laser beam S6b such that the shape of the beam cross-section of the pulsed laser beam S6b substantially coincides with the shape of the cross-section of the amplification region inside the main amplifier 330B.

The main amplifier 330B may be a fast-axial-flow amplifier. The main amplifier 330B may include a chamber 338, an input window 336, and an output window 337. Discharge tubes (not shown), through which the gas containing the $CO_2$ gas may flow, may be provided inside the chamber 338. The main amplifier 330B may be configured to further amplify the pulsed laser beam S6b that has been amplified in the preamplifier 330A and output an amplified pulsed laser beam S6c.

3.2.2 Operation

Subsequently, the operation of the laser apparatus 3A will be described.

3.2.2.1 Overview of Operation of Laser Apparatus

General operation of the laser apparatus 3A will be described first. In general, the pulsed laser beam S3 may be outputted from the semiconductor laser apparatus 310. The outputted pulsed laser beam S3 may be amplified in the regenerative amplifier 370 containing the $CO_2$ gas gain medium. The amplified pulsed laser beam S6a may then enter the preamplifier 330A containing the $CO_2$ gas gain medium. The pulsed laser beam S6a that has entered the preamplifier 330A may be amplified as it travels along the multipass optical path formed through the $CO_2$ gas gain medium. Subsequently, the amplified pulsed laser beam S6b may be reflected by the high-reflection mirrors M31 and M32 and may enter the relay optical system 320B. As mentioned above, the relay optical system 320B may adjust the shape of the beam cross-section of the pulsed laser beam S6b. The pulsed laser beam S6b, of which the shape of the beam cross-section has been adjusted, may be further amplified as it travels through the main amplifier 330B containing the $CO_2$ gas gain medium.

3.2.2.2 Amplification Control Including Regenerative Amplifier

Subsequently, the amplification control in the laser apparatus 3A including the regenerative amplifier will be described in detail with reference to the drawings. In the description to follow, as in the case shown in FIG. 3, the case where the wavelength chirping range (see R41 in FIG. 10) overlaps the entirety of a single gain bandwidth (see S51 in FIG. 10) of the $CO_2$ gas gain medium will be illustrated as an example.

Figure 10:
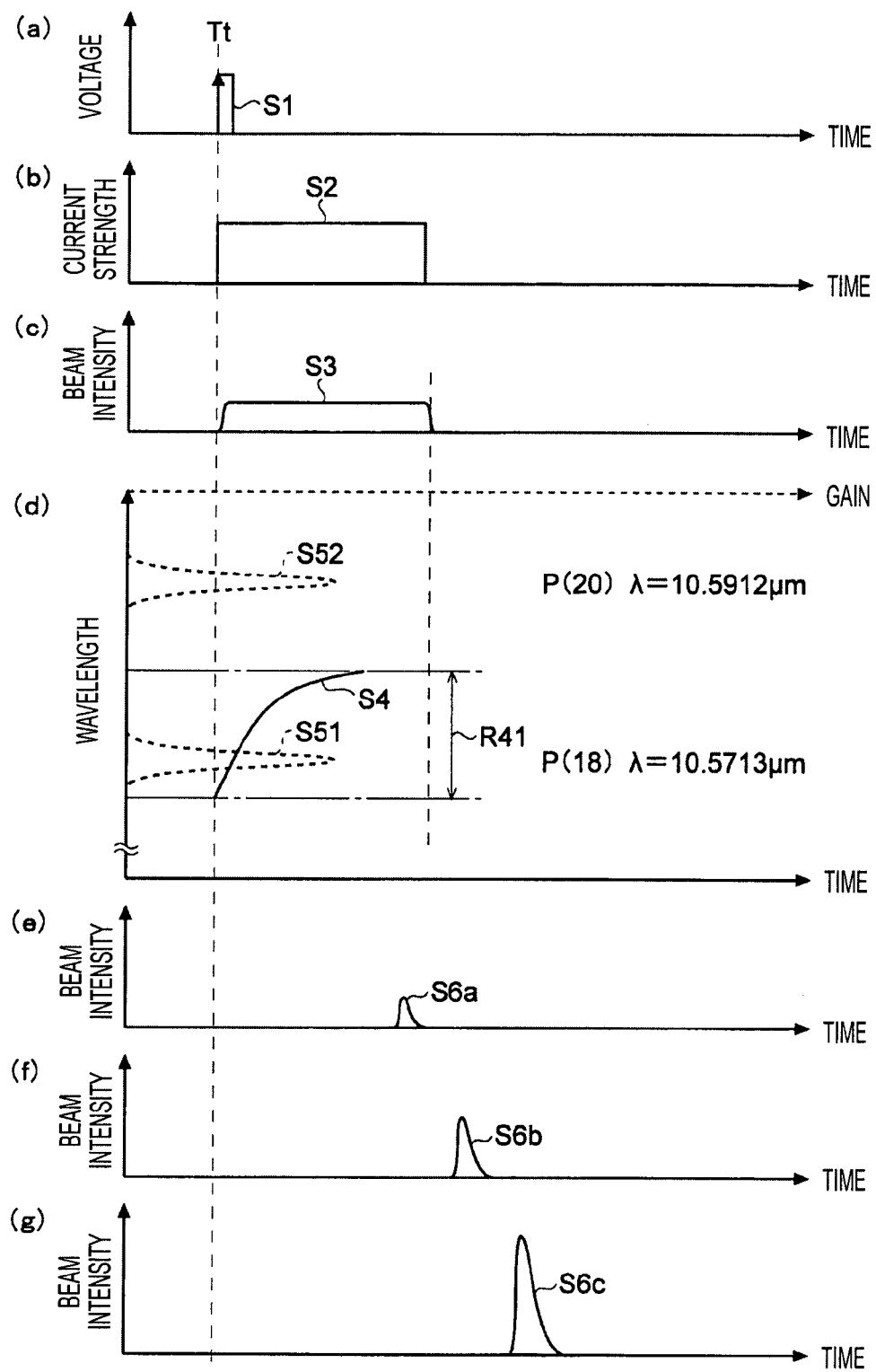
FIG. 10 illustrates an example of amplification control in the laser apparatus including the regenerative amplifier according to the second embodiment.

FIG. 10 shows an example of the amplification control in the laser apparatus 3A including the regenerative amplifier. When the oscillation trigger S1 is inputted to the semiconductor laser controller 311, as shown in FIG. 10(a), the current pulse S2 may flow in the semiconductor laser device 312 as shown in FIG. 10(b). As a result, the pulsed laser beam S3 may be outputted from the semiconductor laser apparatus 310 as shown in FIG. 10(c). As described above, the output wavelength S4 of the pulsed laser beam S3 may be controlled in advance such that the wavelength chirping range overlaps a gain bandwidth of the $CO_2$ gas gain medium (see FIG. 10(d)).

The pulsed laser beam S3 outputted from the semiconductor laser apparatus 310 may be amplified in the regenerative amplifier 370 containing the $CO_2$ gas gain medium (see FIG. 10(e)). Thereafter, the amplified pulsed laser beam S6a may be further amplified in the preamplifier 330A (see FIG. 10(f)). The pulsed laser beam S6b amplified in the preamplifier 330A may be further amplified in the main amplifier 330B (see FIG. 10(g)).

3.2.2.2.1 Regenerative Amplifier

Here, the regenerative amplifier 370 will be described.

3.2.2.2.1.1 Configuration

Figure 11:
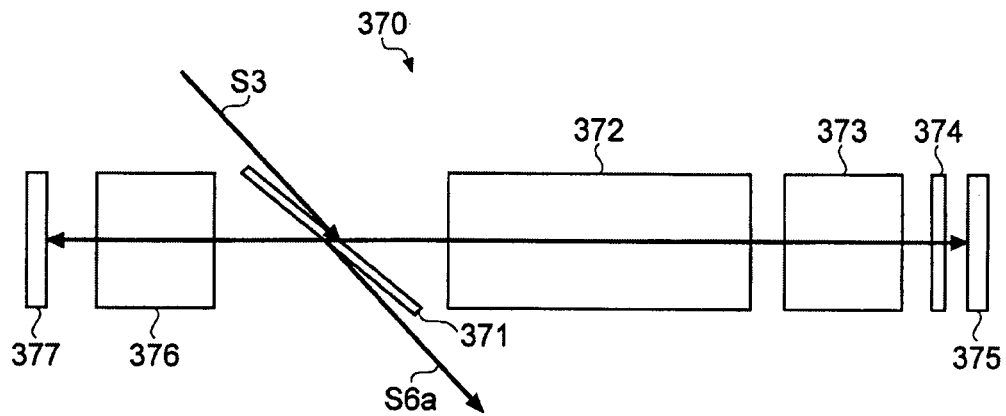
FIG. 11 illustrates an example of the configuration of the regenerative amplifier according to the second embodiment.

FIG. 11 illustrates an example of the configuration of the regenerative amplifier. As illustrated in FIG. 11, the regenerative amplifier 370 may include resonator mirrors 375 and 377, EO (electro Optic) Pockels cells 373 and 376, a polarization beam splitter 371, a chamber 372 filled with a $CO_2$ gas gain medium, and a quarter-wave plate 374.

The resonator mirrors 375 and 377 may constitute an optical resonator. The EO Pockels cell 376 and the polarization beam splitter 371 may be disposed on the beam path between the chamber 372 and the resonator mirror 377. The EO Pockels cell 373 and the quarter-wave plate 374 may be disposed on the beam path between the chamber 372 and the resonator mirror 375.

3.2.2.2.1.2 Operation

Figure 12:
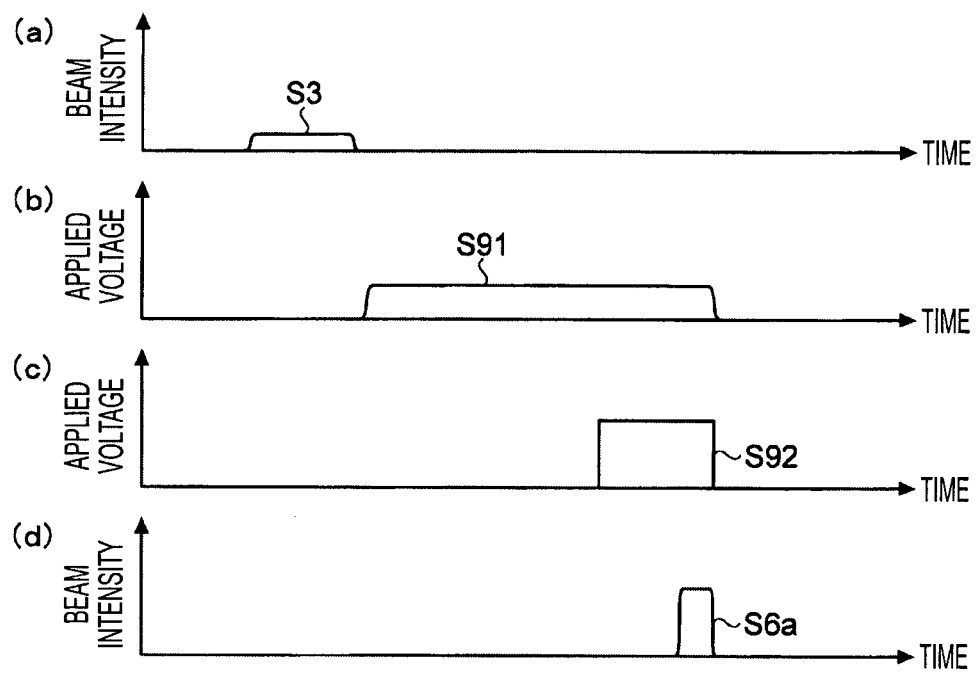
FIG. 12 illustrates an example of the operation of the regenerative amplifier according to the second embodiment.

FIG. 12 shows an example of the operation of the regenerative amplifier 370. As shown in FIG. 12, the linearly polarized pulsed laser beam S3 outputted from the semiconductor laser apparatus 310 (see FIG. 12(a)) may be incident on the polarization beam splitter 371 as mainly the S-polarization component. The S-polarization component of the pulsed laser beam S3 may be reflected by the beam splitter 371. With this, most of the pulsed laser beam S3 may enter the regenerative amplifier 370.

The pulsed laser beam S3 that has entered the regenerative amplifier 370 may travel through the $CO_2$ gas gain medium inside the chamber 372. Here, when the wavelength chirping range of the pulsed laser beam S3 overlaps at least a part of the gain bandwidth, the pulsed laser beam S3 may be amplified for a duration in which the wavelength chirping range overlaps the gain bandwidth (see FIG. 10(d)). Thereafter, the pulsed laser beam S3 may pass through the EO Pockels cell 373 and through the quarter-wave plate 374, to thereby be transformed into the circularly polarized pulsed laser beam S3. The circularly polarized pulsed laser beam S3 may be reflected by the resonator mirror 375 and may again pass through the quarter-wave plate 374. With this, the circularly polarized pulsed laser beam S3 may be transformed into the linearly polarized pulsed laser beam S3 that may be incident as mainly the P-polarization component on the polarization beam splitter 371. The pulsed laser beam S3 may be amplified further as it travels through the $CO_2$ gas gain medium inside the chamber 372. Then, the pulsed laser beam S3 may be incident on the polarization beam splitter 371 and be transmitted through the polarization beam splitter 371.

The pulsed laser beam S3 that has been transmitted through the polarization beam splitter 371 may pass through the EO Pockels cell 376, be reflected by the resonator mirror 377, and again pass through the EO Pockels cell 376 and the polarization beam splitter 371. Then, the pulsed laser beam S3 may be further amplified as it travels through the $CO_2$ gas gain medium inside the chamber 372. The pulsed laser beam S3 that has been further amplified may be transformed into the circularly polarized pulsed laser beam S3 when it passes through the EO Pockels cell 373 to which voltage S91 (see FIG. 12(b)) is applied by a power source (not shown).

Subsequently, the circularly polarized pulsed laser beam S3 may pass through the quarter-wave plate 374, to thereby be transformed into the linearly polarized pulsed laser beam S3 that may be incident as mainly the S-polarization component on the polarization beam splitter 371. The pulsed laser beam S3 may be reflected by the resonator mirror 375 and may again pass through the quarter-wave plate 374 and the EO Pockels cell 373 to which the voltage S91 is applied, to thereby be transformed into the linearly polarized pulsed laser beam S3 that may be incident as mainly the P-polarization component on the polarization beam splitter 371. The pulsed laser beam S3 may be further amplified as it travels back and forth multiple times between the resonator mirrors 375 and 377.

With the above operation, after the pulsed laser beam S3 is amplified sufficiently, voltage S92 (see FIG. 12(c)) may be applied to the EO Pockels cell 376 by a power source (not shown). With this, the linearly polarized pulse laser beam S3, which may be incident as mainly the P-polarization component on the polarization beam splitter 371, may be transformed into the circularly polarized pulsed laser beam S3. The circularly polarized pulsed laser beam S3 may be reflected by the resonator mirror 377 and may again pass through the EO Pockels cell 376 to which the voltage S92 is applied, to thereby be transformed into the linearly polarized pulsed laser beam S3 that may be incident as mainly the S-polarization component on the polarization beam splitter 371. The S-polarization component of the pulsed laser beam S3 may be reflected by the beam splitter 371. With this, the amplified pulsed laser beam S6a may be outputted from the regenerative amplifier 370. At this point, the voltage S91 applied to the EO Pockels cell 373 may be turned OFF in order to allow a subsequent pulsed laser beam to enter the regenerative amplifier 370.

3.2.2.2.1.3 Delaying Pulsed Laser Beam by Regenerative Amplifier

Figure 13:
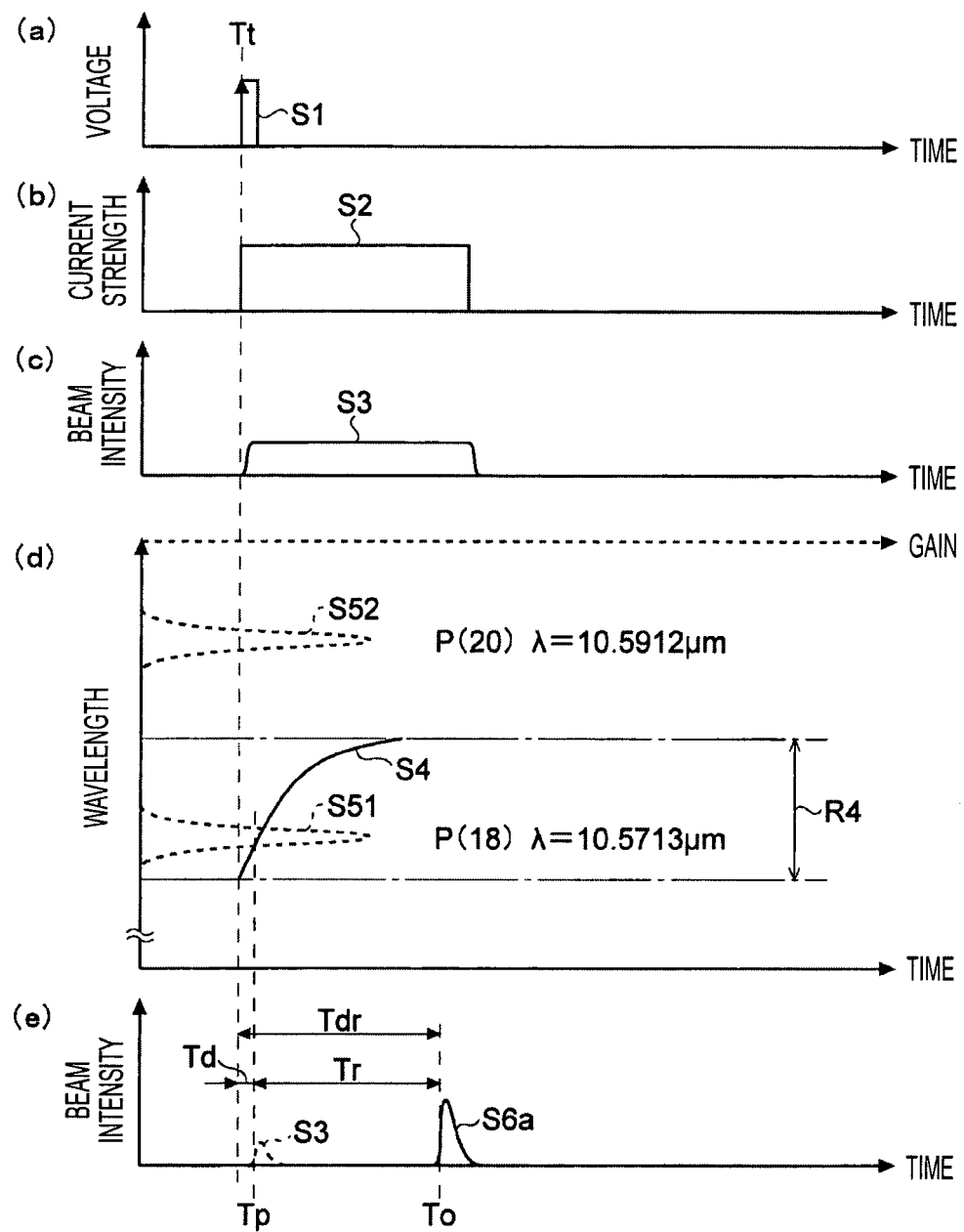
FIG. 13 is a timing chart showing the operation from the input of an oscillation trigger into a semiconductor laser apparatus until an amplified pulsed laser beam is outputted.

When the regenerative amplifier 370 is used, compared to the case where other types of amplifiers are used, a delay time given to the pulsed laser beam S3 may preferably be set long enough for the pulsed laser beam S3 to be synchronized with the generation of droplets by the droplet generator 26. FIG. 13 is a timing chart from the input of an oscillation trigger into a semiconductor laser apparatus until an amplified pulsed laser beam is outputted from a regenerative amplifier. When the oscillation trigger S1 is inputted to the semiconductor laser controller 311 at the timing Tt as shown in FIG. 13(a), the current pulse S2 may flow in the semiconductor laser device 312 (see FIG. 13(b)). With this, the pulsed laser beam S3 may be outputted from the semiconductor laser apparatus 310 as shown in FIG. 13(c). As shown in FIG. 13(d), when the pulsed laser beam S3 enters the optical resonator in the regenerative amplifier 370, the pulsed laser beam S3 may be amplified while the chirping range R4 of the output wavelength S4 of the pulsed laser beam S3 overlaps the gain bandwidth S51 of the $CO_2$ gas gain medium. As shown in FIG. 13(e), a delay time Td may be required from the timing Tt at which the oscillation trigger S1 is inputted to the semiconductor laser controller 311 until the timing Tp at which the output wavelength S4 of the pulsed laser beam S3 initially overlaps the gain bandwidth S51. Further, the pulsed laser beam S3 that has entered the regenerative amplifier 370 may travel back and forth multiple times (for example, ten times) in the optical resonator of the regenerative amplifier 370. Accordingly, a timing at which the amplified pulsed laser beam S6a is outputted from the regenerative amplifier 370 may be further delayed (see delay time Tr in FIG. 13(e)).

A delay time Tdr from the timing Tt at which the oscillation trigger S1 is inputted to the semiconductor laser controller 311 until a timing To at which the amplified pulsed laser beam S6a is outputted from the regenerative amplifier 370 may be the sum of the delay time Td and a time Tr during which the pulsed laser beam S3 travels back and forth in the resonator of the regenerative amplifier 370.

From the above, when the timing at which the pulsed laser beam S3 is outputted from the laser apparatus 3A of FIG. 9 needs to be controlled, the oscillation trigger S1 may preferably be inputted in consideration of the above delay times.

3.3 Embodiment Where Multiple QCLs Are Used as MO (Third Embodiment)

Subsequently, a laser apparatus where multiple QCLs are used as a master oscillator will be described in detail with reference to the drawings. In the description to follow, the configuration similar to that of the above embodiments will be referenced by similar reference characters, and duplicate description thereof will be omitted.

3.3.1 Configuration

Figure 14:
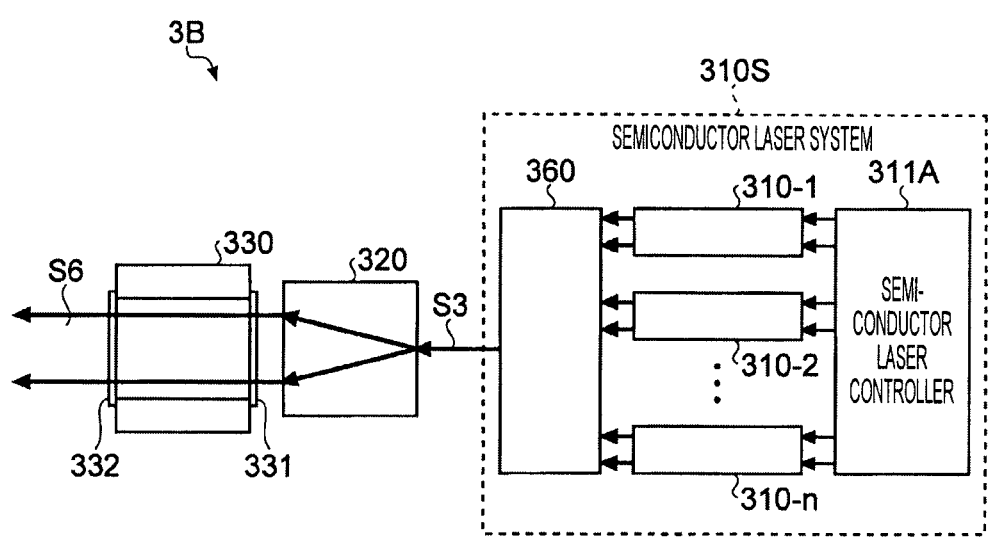
FIG. 14 schematically illustrates the configuration of a laser apparatus according to a third embodiment.

FIG. 14 schematically illustrates the configuration of a laser apparatus 3B according to a third embodiment. The laser apparatus 3B shown in FIG. 14 may be similar in configuration to the laser apparatus 3 shown in FIG. 1. However, in the laser apparatus 3B, the semiconductor laser apparatus 310 may be replaced by a semiconductor laser system 310S.

The semiconductor laser system 310S may include semiconductor laser apparatuses 310-1 through 310-n, a beam path adjusting unit 360, and a semiconductor laser controller 311A. Each of the semiconductor laser apparatuses 310-1 through 310-n may be similar in configuration to the semiconductor laser apparatus 310. The semiconductor laser controller 311A may be configured to control each of the semiconductor laser apparatuses 310-1 through 310-n. The beam path adjusting unit 360 may be positioned so as to make the beam paths of the pulsed laser beams outputted from the respective semiconductor laser apparatuses 310-1 through 310-n substantially coincide with one another.

3.3.2 Operation

Subsequently, the operation of the laser apparatus 3B will be described. Each of the semiconductor laser apparatuses 310-1 through 310-n may oscillate at the timing and with the intensity specified by the semiconductor laser controller 311A. Each of the semiconductor laser apparatuses 310-1 through 310-n may output a pulsed laser beam when a current pulse flows in the respective semiconductor laser devices 312 (see, e.g., FIG. 1). The pulsed laser beam outputted from each of the semiconductor laser apparatuses 310-1 through 310-n may be controlled such that at least a part of the wavelength chirping range of each pulsed laser beam overlaps a gain bandwidth of the $CO_2$ gas gain medium. As described above, the wavelength chirping range of each of the semiconductor laser apparatuses 310-1 through 310-n may be controlled by controlling the temperature of the respective semiconductor laser devices 312.

The pulsed laser beams outputted from the respective semiconductor laser apparatuses 310-1 through 310-n may enter the beam path adjusting unit 360. The beam path adjusting unit 360 may serve to make the beam paths of the respective pulsed laser beams substantially coincide with one another. The beam path adjusting unit 360 may be an optical system configured to make the beam paths of the pulsed laser beams outputted from the respective semiconductor laser apparatuses 310-1 through 310-n substantially coincide with one another. The beam path adjusting unit 360 may be an optical system in which a grating, a beam splitter, and the like are combined. As the pulsed laser beams outputted from the respective semiconductor laser apparatuses 310-1 through 310-n enter the beam path adjusting unit 360, the pulsed laser beam S3 including the pulsed laser beams outputted from the respective semiconductor laser apparatuses 310-1 through 310-n may be outputted from the semiconductor laser system 310S. As in the case shown in FIG. 1, the pulsed laser beam S3 may be expanded in diameter by the relay optical system 320, and thereafter may be amplified to the pulsed laser beam S6 by the amplifier 330.

Here, each of the semiconductor laser apparatuses 310-1 through 310-n may be similar in configuration to the semiconductor laser apparatus in the first embodiment; thus, duplicate description thereof will be omitted.

3.3.3 Combination of Oscillation Wavelength of Semiconductor Laser and Gain Bandwidth of $CO_2$ gas Gain Medium The case where oscillation wavelengths of the respective semiconductor laser apparatuses are controlled to overlap the gain bandwidths of the $CO_2$ gas gain medium when multiple semiconductor laser apparatuses are used will be described with examples.

3.3.3.1 Case where Single QCL is Allocated to Each Gain Bandwidth

Figure 15:
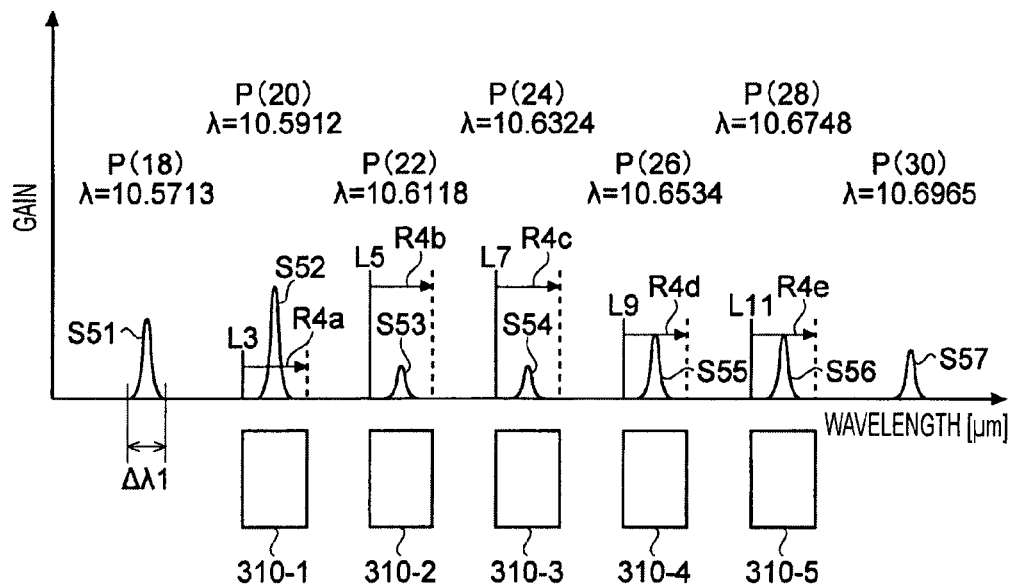
FIG. 15 illustrates a case where a single-longitudinal-mode semiconductor laser is allocated to each of the gain bandwidths in the third embodiment.
Figure 16:
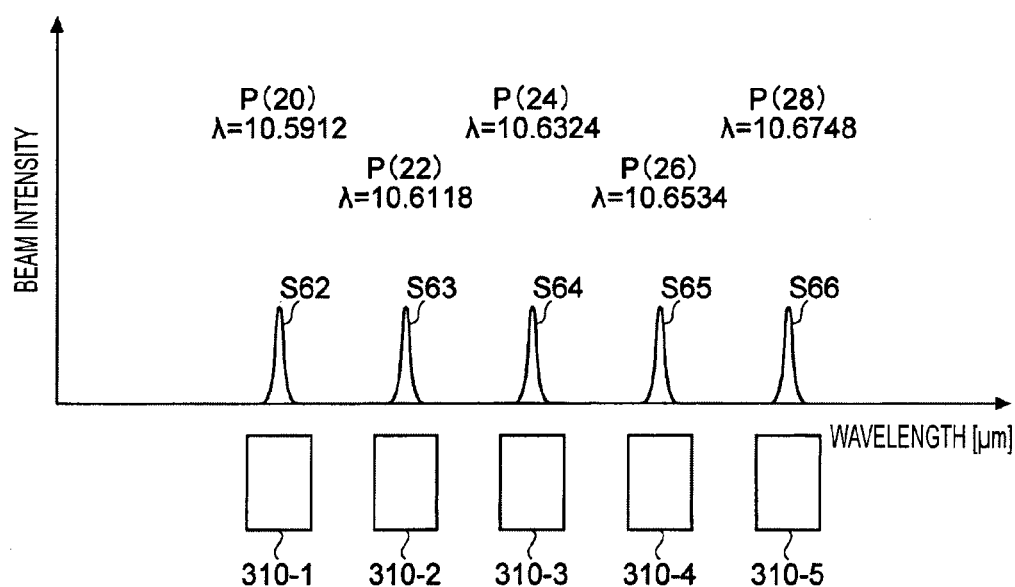
FIG. 16 shows an example of pulsed laser beams amplified in the respective gain bandwidths in the case shown in FIG. 15.

A case where single-longitudinal-mode semiconductor laser apparatuses are allocated to respective gain bandwidths will be described, first. FIG. 15 shows the case where single-longitudinal-mode semiconductor laser apparatuses are allocated to respective gain bandwidths. FIG. 16 shows an example of the pulsed laser beams amplified in the respective gain bandwidths in the case shown in FIG. 15. Here, in FIGS. 15 and 16, a case where five semiconductor laser apparatuses 310-1 through 310-5, each of which oscillates at a single-longitudinal-mode, are used will be illustrated. Further, of the gain bandwidths S51 through S57 of the $CO_2$ gas gain medium, the gain bandwidths S52 through S56 are used here.

As shown in FIG. 15, in the amplifier 330 containing a $CO_2$ gas gain medium, the gain in each of the gain bandwidths S51 through S57 may differ from one another. Thus, it may be preferable that the pulsed laser beams (at single-longitudinal-modes L3, L5, L7, L9, and L11) with beam intensity corresponding to the gain of the respective gain bandwidths are outputted from the respective semiconductor laser apparatuses 310-1 through 310-5.

In the example shown in FIG. 15, wavelength chirping ranges R4a through R4e of the pulsed laser beams outputted from the respective semiconductor laser apparatuses 310-1 through 310-5 at the respective single-longitudinal-modes L3, L5, L7, L9, and L11 may overlap at least parts of the gain bandwidths S52 through S56, respectively. In this case, the semiconductor laser controller 311A may control the beam intensity of the pulsed laser beams outputted from the respective semiconductor laser apparatuses 310-1 through 310-5 at the single-longitudinal-modes L3, L5, L7, L9, and L11 in accordance with the peak gain in the corresponding gain bandwidths S52 through S56. In this example, a single-longitudinal-mode pulsed laser beam with relatively small beam intensity may be associated with a gain bandwidth with a relatively high peak gain (e.g., S52), and a single-longitudinal-mode pulsed laser beam with relatively high beam intensity may be associated with a gain bandwidth of a relatively low peak gain (e.g., S53).

With the above control, the peak intensity of each of the pulsed laser beams S62 through S66 amplified by the $CO_2$ gas gain medium may become substantially equal, as shown in FIG. 16. With this, amplification efficiency can be improved, compared to the case where a pulsed laser beam is amplified using a single gain bandwidth, for example.

3.3.3.2 Case Where Multiple QCLs are Allocated to Single Gain Bandwidth

Figure 17:
FIG. 17 illustrates a case where multiple single-longitudinal-mode semiconductor lasers are allocated to a single gain bandwidth in the third embodiment.
Figure 18:
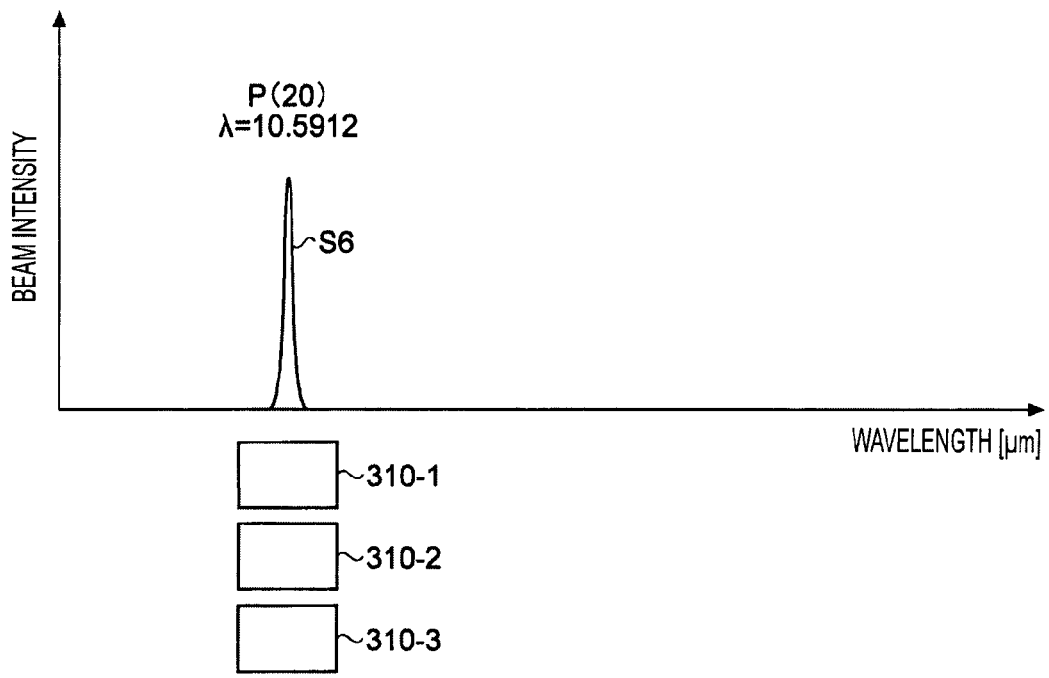
FIG. 18 shows an example of a pulsed laser beam amplified in the given gain bandwidth in the case shown in FIG. 17.

Subsequently, a case where multiple single-longitudinal-mode semiconductor laser apparatuses are allocated to a single gain bandwidth will be described below. FIG. 17 shows the case where the multiple single-longitudinal-mode semiconductor laser apparatuses are allocated to a single gain bandwidth. FIG. 18 shows an example of a pulsed laser beam amplified in the case shown in FIG. 17. Here, in FIGS. 17 and 18, the case where three semiconductor laser apparatuses 310-1 through 310-3 each of which oscillates at a single-longitudinal-mode are used is illustrated. Further, of the gain bandwidths S51 through S57 of the $CO_2$ gas gain medium, the gain bandwidth S52 is used.

As shown in FIG. 17, the wavelength chirping ranges R4a through R4c of the pulsed laser beams outputted from the multiple (three in this example) semiconductor laser apparatuses 310-1 through 310-3 at single-longitudinal-modes L3a through L3c may overlap at least a part of the single gain bandwidth S52. With this, as shown in FIG. 18, the peak intensity of the pulsed laser beam S6 outputted from the amplifier 330 may be increased.

3.3.3.3 Case where Number of QCLs Allocated to Each Gain Bandwidth is Modified in Accordance with Gain of Each Gain Bandwidth Further, as discussed above, the gain in the gain bandwidth S52, for example, may be greater than those in the other gain bandwidths. Accordingly, the number of semiconductor lasers allocated to each gain bandwidth may be modified in accordance with the gain in each gain bandwidth. It is assumed in this example that the gain bandwidths S52 through S54 are used, and the gain in the gain bandwidth S52 is twice as much as the gain in the gain bandwidth S53 or S54. Because the gain in the gain bandwidth S52 is greater than those in the gain bandwidths S53 and S54, as mentioned above, twice or more (two, for example) as many semiconductor laser apparatuses as the number (one, for example) of the semiconductor laser apparatuses allocated to the gain bandwidth S52 may be allocated to the gain bandwidth S53 or S54. With this, the current given to each of the semiconductor laser apparatuses may be made substantially equal, which may facilitate the temperature control in the semiconductor laser system 310S.

Figure 19:
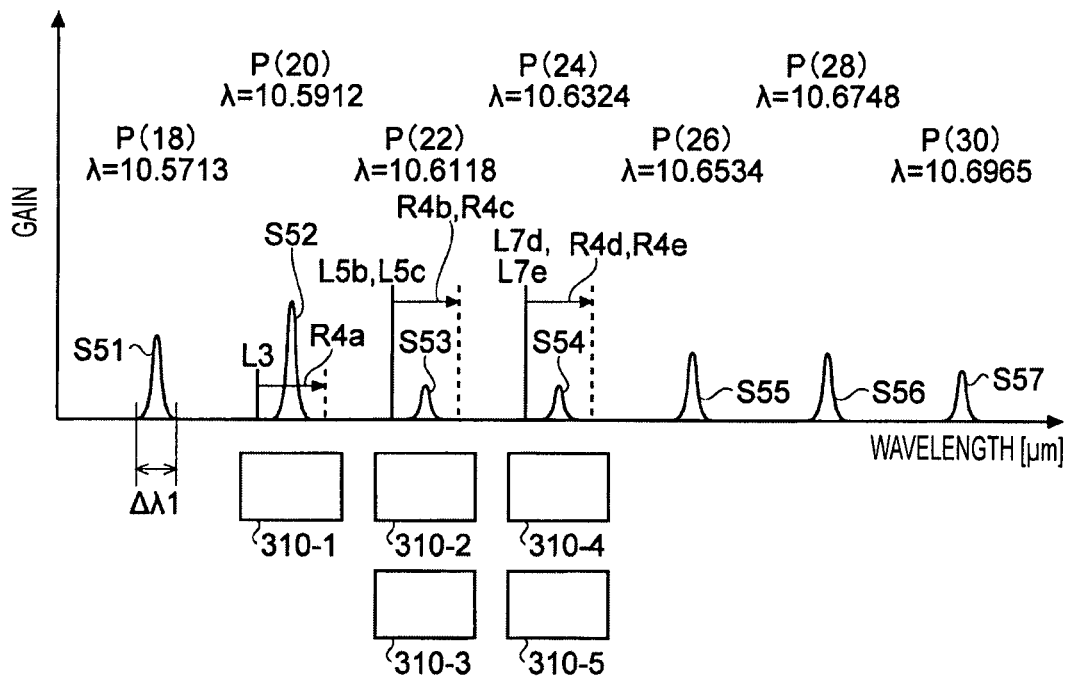
FIG. 19 illustrates a case where five single-longitudinal-mode semiconductor lasers are allocated to three of the gain bandwidths in the third embodiment.
Figure 20:
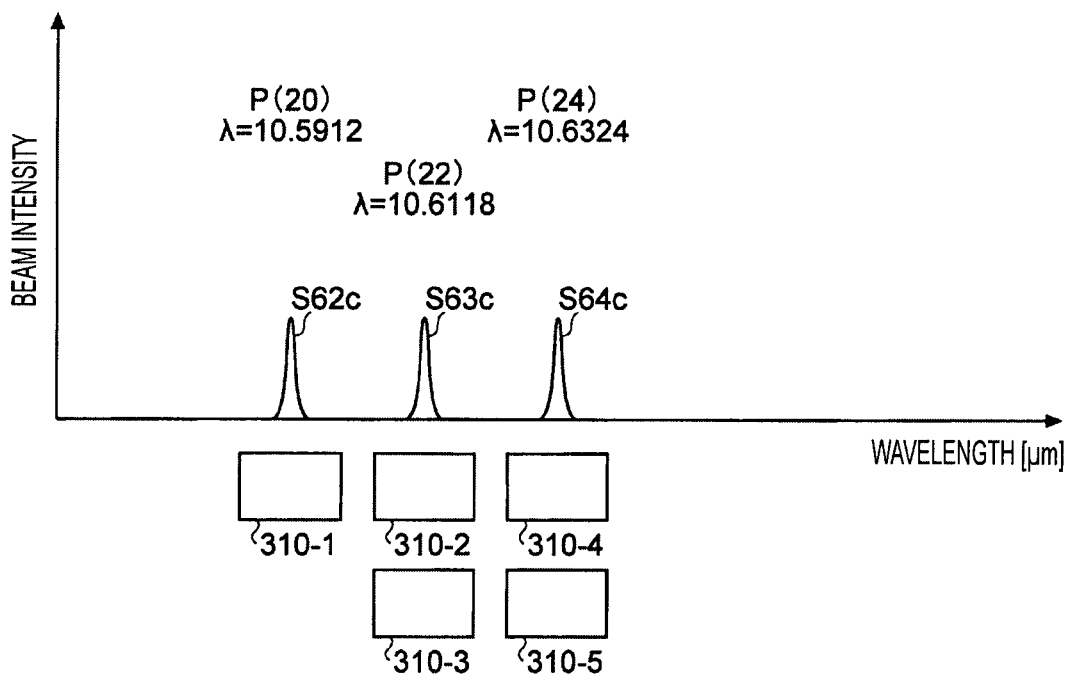
FIG. 20 shows an example of pulsed laser beams amplified in the respective gain bandwidths in the case shown in FIG. 19.

FIG. 19 shows the case where five single-longitudinal-mode semiconductor laser apparatuses are allocated to three gain bandwidths. FIG. 20 shows an example of the pulsed laser beams amplified in the respective gain bandwidths in the case shown in FIG. 19. Here, FIGS. 19 and 20 show the case where five semiconductor laser apparatuses 310-1 through 310-5 each of which oscillates at a single-longitudinal-mode are used. Further, FIGS. 19 and 20 show the case where, of the gain bandwidths S51 through S57 of the $CO_2$ gas gain medium, the gain bandwidths S52 through S54 are used.

As shown in FIG. 19, the wavelength chirping ranges R4a through R4e of longitudinal modes L3, L5b, L5c, L7d, and L7e at which the multiple (five in the example shown in FIG. 19) semiconductor laser apparatuses 310-1 through 310-5 oscillate may overlap at least parts of the gain bandwidths S52 through S54, respectively. Here, a plurality of the wavelength chirping ranges may overlap at least a part of a single gain bandwidth. When the plurality of wavelength chirping ranges overlaps a single gain bandwidth, the number of wavelength chirping ranges to overlap a single gain bandwidth may preferably be adjusted in accordance with the gain in the respective gain bandwidths. As a result, the overall beam intensity of each of the pulsed laser beams in the respective gain bandwidths is substantially equal (see FIG. 20).

In the example shown in FIG. 19, the wavelength chirping range R4a of the pulsed laser beam outputted from the semiconductor laser apparatus 310-1 at the single-longitudinal-mode L3 may overlap at least a part of the gain bandwidth S52. The wavelength chirping ranges R4b and R4c of the pulsed laser beams outputted from the respective semiconductor laser apparatuses 310-2 and 310-3 at the single-longitudinal-modes L5b and L5c may overlap at least a part of the gain bandwidth S53. Further, the wavelength chirping ranges R4d and R4e of the pulsed laser beams outputted from the respective semiconductor laser apparatuses 310-4 and 310-5 at the single-longitudinal-modes L7d and L7e may overlap at least a part of the gain bandwidth S54.

With the above combination, spectral waveforms of pulsed laser beams S62c through S64c amplified by the $CO_2$ gas gain medium may be such that their peak intensities are substantially equal to each other, as shown in FIG. 20. With this, amplification efficiency can be improved, compared to the case where the pulsed laser beam L3 is amplified using the single gain bandwidth S52, for example.

3.3.4 Waveform Control of Amplified Pulsed Laser Beam by Adjusting Timing of QCLs Waveform control of the pulsed laser beam S6 outputted from the amplifier 330 will be discussed. The temporal waveform of the pulsed laser beam S6 outputted from the amplifier 330 may be controlled by controlling not only a current waveform given to each of the semiconductor laser apparatuses 310-1 through 310-n but also timings at which a current is supplied to each of the semiconductor laser apparatuses 310-1 through 310-n.

By controlling the waveform of the pulsed laser beam S6, the pulsed laser beam S6 with high peak intensity or the pulsed laser beam S6 with a longer pulse width may be obtained. The waveform of the pulsed laser beam S6 may be controlled by controlling the timing at which a pulsed laser beam is outputted from each of the semiconductor laser apparatuses. For example, when the timings at which the multiple pulsed laser beams are outputted from the amplifier are adjusted to coincide with one another, the pulsed laser beam S6 with high peak intensity may be obtained. Alternatively, when the timings at which the multiple pulsed laser beams are outputted from the amplifier are adjusted to differ from one another, the pulsed laser beam S6 with a longer pulse width may be obtained. Hereinafter, each case will be described with examples. In the description to follow, the case where semiconductor laser apparatuses are allocated to the plurality of gain bandwidths shown in FIG. 15, respectively, will be used as an example, but this embodiment is not limited thereto. For example, the case below may be applicable to the case shown in FIG. 17 or 19.

3.3.4.1 Case where Timings at which Amplified Pulsed Laser Beams Are Outputted from Amplifier are Controlled to Coincide with Each Other FIGS. 21 through 24 show timing charts in the case where the timings at which the pulsed laser beams are outputted from the amplifier coincide with one another. In the following description, five semiconductor laser apparatuses 310-1 through 310-5 are used.

Figure 21:
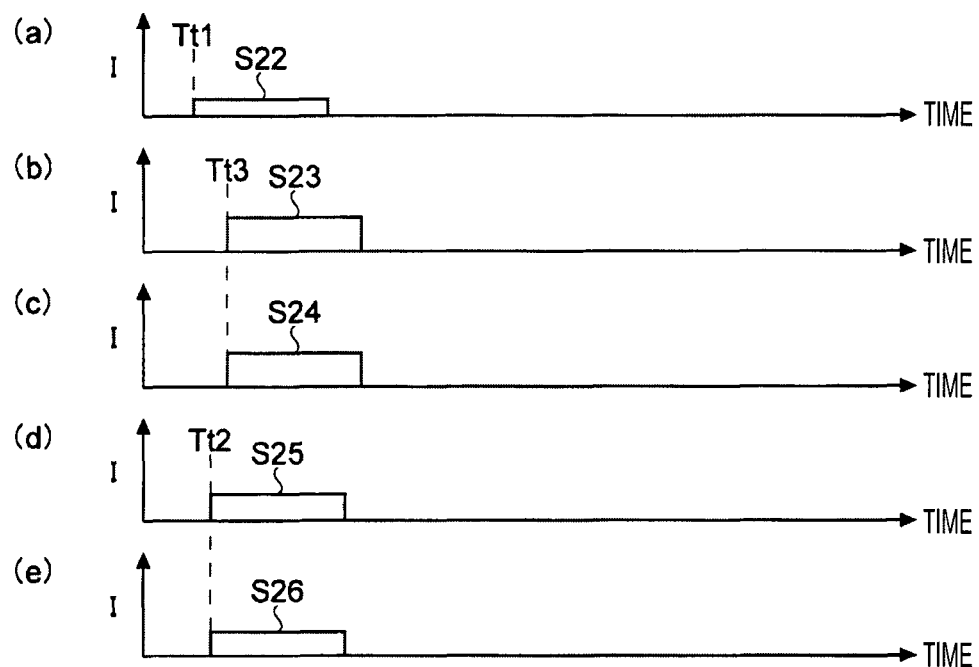
FIG. 21 is a timing chart showing a case where timings at which pulsed laser beams are outputted from an amplifier coincide with each other in the third embodiment.
Figure 22:
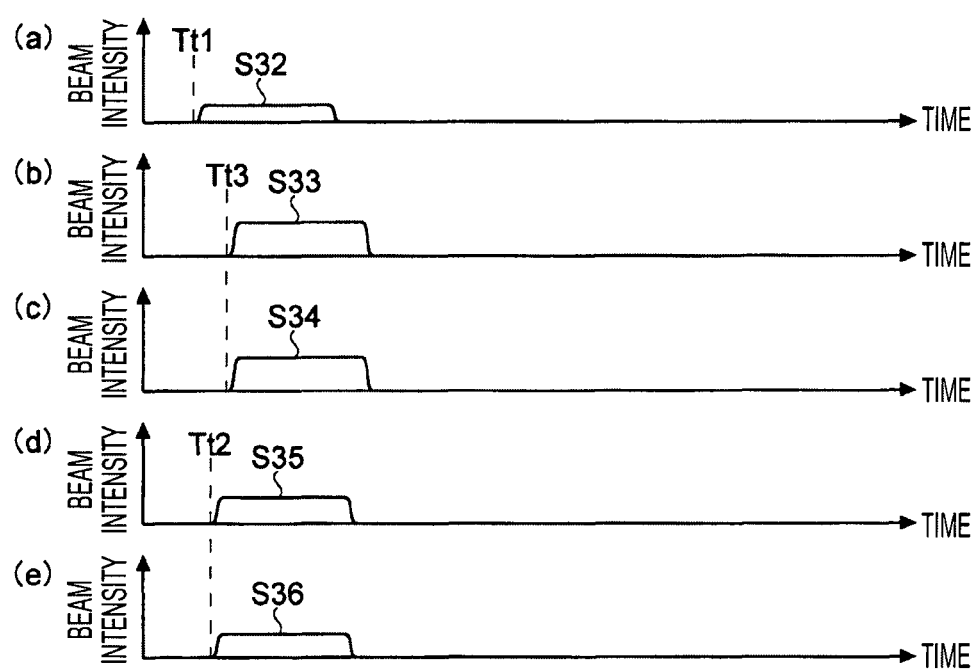
FIG. 22 is a timing chart showing a case where timings at which pulsed laser beams are outputted from an amplifier coincide with each other in the third embodiment.

As in the case described with reference to FIG. 15, the intensity of the current pulse inputted to the respective semiconductor laser apparatuses 310-1 through 310-5 may be controlled in accordance with the gain in the respective gain bandwidths corresponding to the respective longitudinal modes. For example, as shown in FIG. 21, the intensity of current pulses S22 through S26 inputted to the respective semiconductor laser apparatuses 310-1 through 310-5 may be controlled. As a result, as shown in FIG. 22, pulsed laser beams S32 through S36 with the beam intensity corresponding to the intensity of the current pulses S22 through S26 may be outputted from the respective semiconductor laser apparatuses 310-1 through 310-5.

Figure 23:
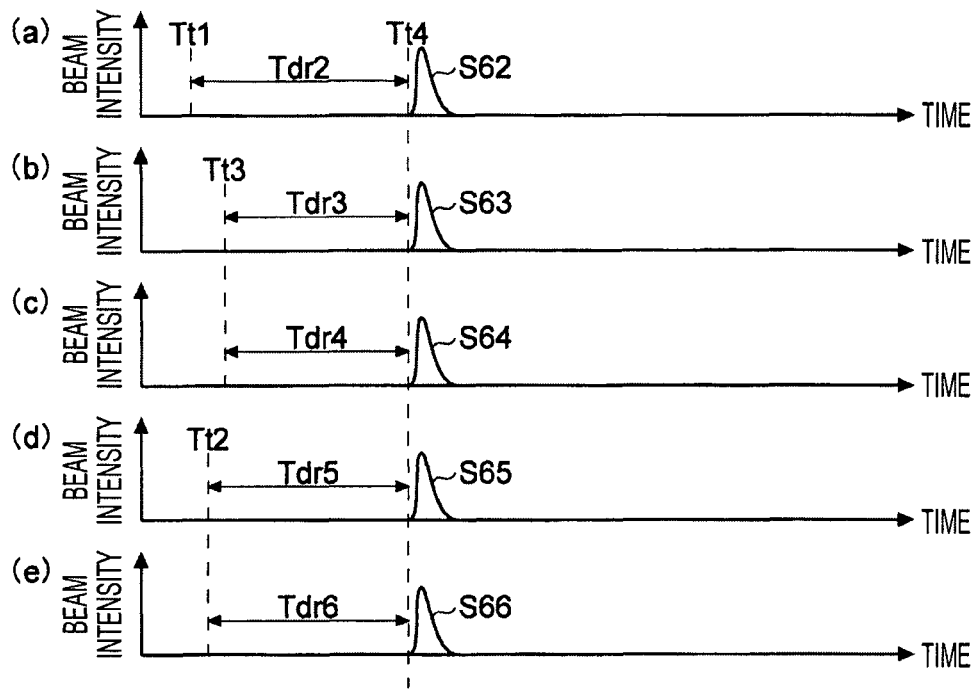
FIG. 23 is a timing chart showing a case where timings at which pulsed laser beams are outputted from an amplifier coincide with each other in the third embodiment.
Figure 24:
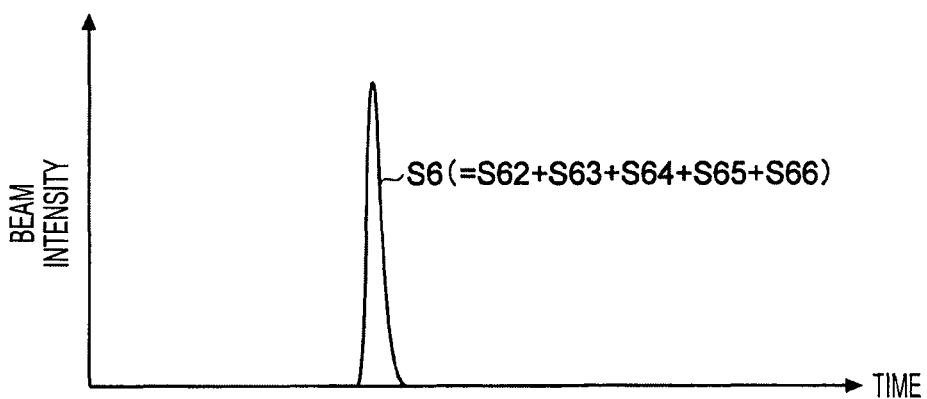
FIG. 24 is a timing chart showing a case where timings at which pulsed laser beams are outputted from an amplifier coincide with each other in the third embodiment.

As shown in FIGS. 21 and 23, oscillation triggers (current pulses S22 through S26) may preferably be given to the respective semiconductor laser apparatuses 310-1 through 310-5 at timings Tt1 through Tt3 such that the amplified pulsed laser beams S62 through S66 may be outputted from the amplifier 330 simultaneously at a timing Tt4. The timings Tt1 through Tt3 at which the oscillation triggers are inputted to the respective semiconductor laser apparatuses 310-1 through 310-5 may preferably be set so as to precede by delay times Tdr2 through Tdr6, respectively. The delay times Tdr2 through Tdr6 preceding the timing Tt4 are required for the respective pulsed laser beams S32 through S36 to be amplified in the regenerative amplifier 370, and are required for the pulsed laser beams to be outputted as amplified pulsed laser beams S62 through S66, respectively, from the regenerative amplifier 370.

The current pulses S22 through S26 may be given to the semiconductor laser apparatuses 310-1 through 310-5 at the aforementioned timings. Accordingly, the intensity of the pulsed laser beam S6 outputted from the amplifier 330 may be the sum of the intensity of the pulsed laser beams S62 through S66 (FIG. 23) amplified in the respective gain bandwidths S52 through S56. As a result, the pulsed laser beam S6 with high peak intensity may be obtained.

3.3.4.2 Case where Timings at which Amplified Pulsed Laser Beams are Outputted from Amplifier are Offset from One Another FIGS. 25 through 28 show timing charts in the case where timings at which the pulsed laser beams are outputted from the amplifier differ from one another. In the description to follow, five semiconductor laser apparatuses 310-1 through 310-5 are used.

Figure 25:
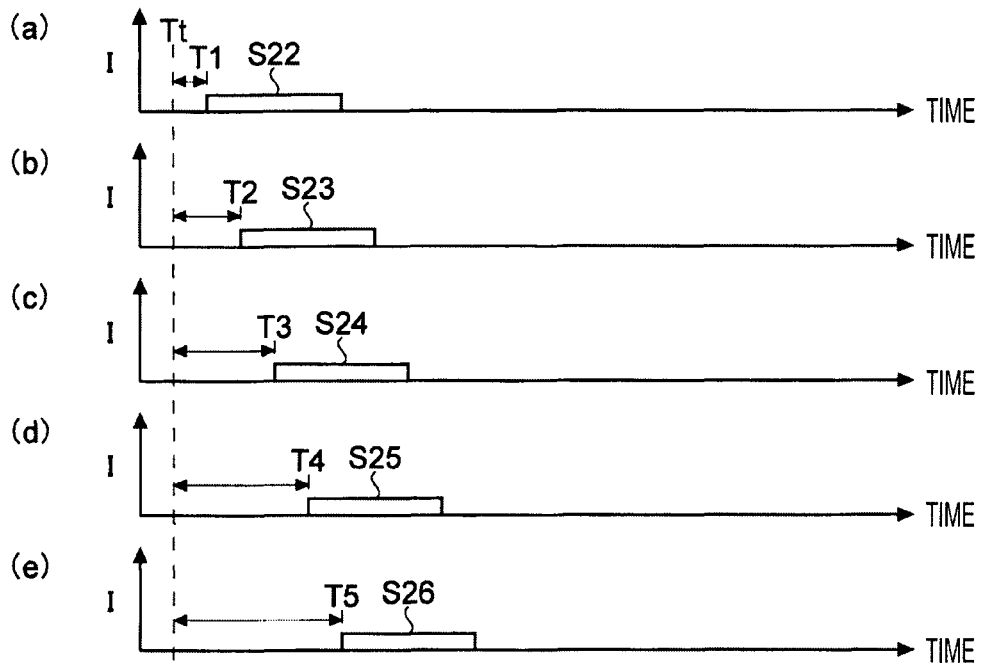
FIG. 25 is a timing chart showing a case where timings at which pulsed laser beams are outputted from an amplifier are offset from one another in the third embodiment.
Figure 26:
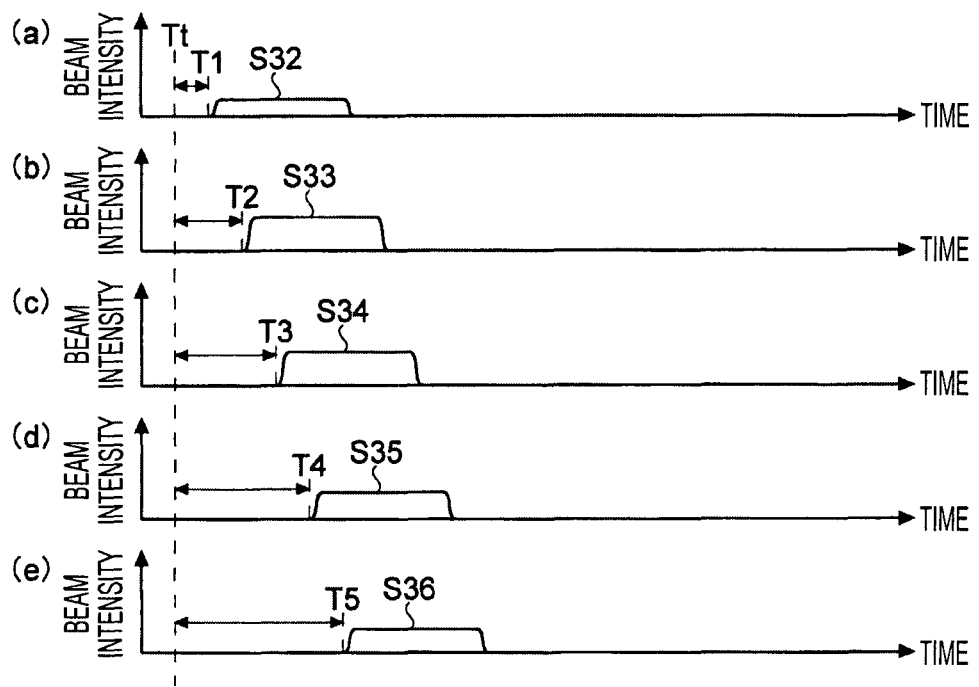
FIG. 26 is a timing chart showing a case where timings at which pulsed laser beams are outputted from an amplifier are offset from one another in the third embodiment.
Figure 27:
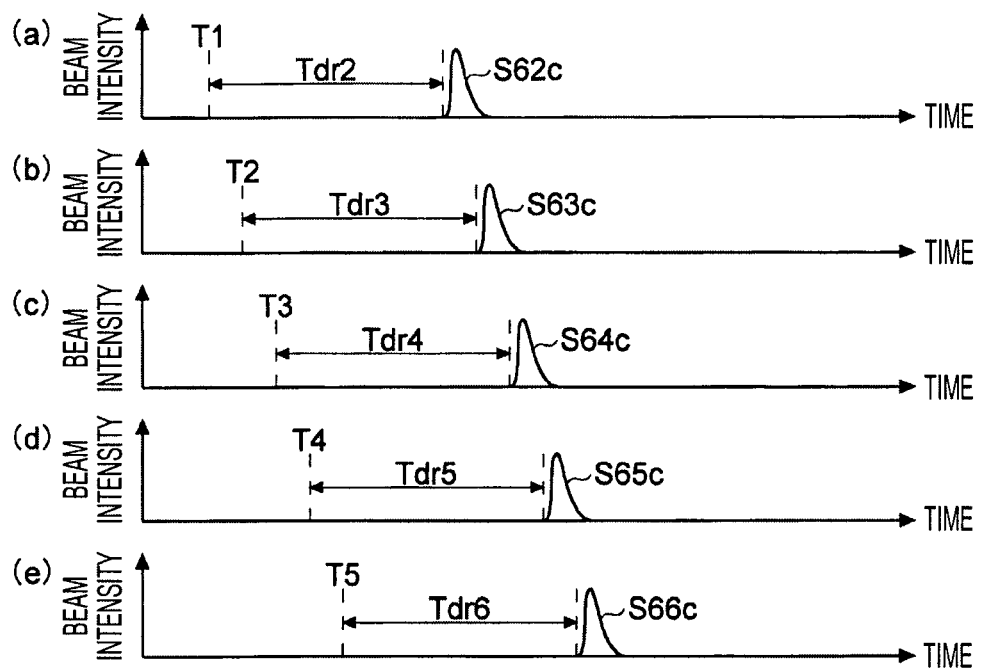
FIG. 27 is a timing chart showing a case where timings at which pulsed laser beams are outputted from an amplifier are offset from one another in the third embodiment.

As shown in FIG. 25, timings at which the pulsed laser beams S32 through S36 are outputted from the respective semiconductor laser apparatuses 310-1 through 310-5 may be offset from one another by adjusting rise timings T1 through T5 of the current pulses S22 through S26 (that is, the output timings of the oscillation triggers) inputted to the respective semiconductor laser apparatuses 310-1 through 310-5 (see FIG. 26). In other words, the rising edges of the current pulses S22 through S26 are misaligned with each other. With this, as shown in FIG. 27, timings at which the pulsed laser beams S62c through S66c are outputted from the amplifier 330 may be offset from one another. Here, the rise timings T1 through T5 may be offset from one another such that the offset amount in the timings at which the pulsed laser beams S62c through S66c are outputted is substantially equal. In that case, the rise timings T1 through T5 may preferably be set so as to precede the timings at which pulsed laser beams S62c through S66c are outputted from the amplifier 330, respectively, by the delay times Tdr2 through Tdr6.

Figure 28:
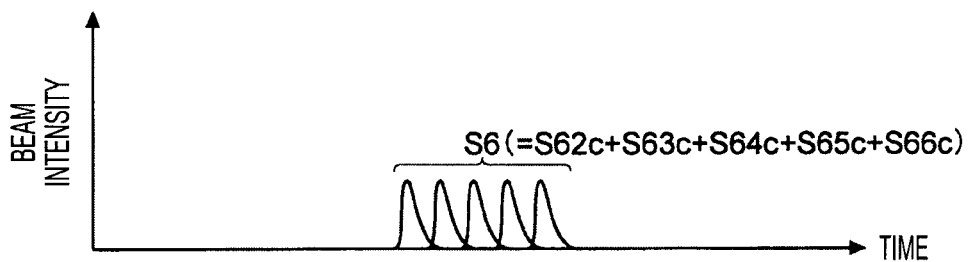
FIG. 28 is a timing chart showing a case where timings at which pulsed laser beams are outputted from an amplifier are offset from one another in the third embodiment.

The current pulses S22 through S26 may be supplied to the respective semiconductor laser apparatuses 310-1 through 310-5 at the aforementioned timings. The pulsed laser beam S6 outputted from the amplifier 330 may thus be arranged in series and closely with each other, as shown in FIG. 28. As a result, the pulsed laser beam. S6 with a longer pulsed width may be obtained.

In this way, when the pulsed laser beams S32 through S36 outputted from the respective semiconductor laser apparatuses 310-1 through 310-5 are amplified using the plurality of gain bandwidths S52 through S56, the amplification efficiency of the pulsed laser beams S32 through S36 may be increased. Further, the offset amount in the timings at which the pulsed laser beams S32 through S36 are outputted may be varied, which may allow the pulse shape of the pulsed laser beam S6 outputted from the amplifier 330 to be varied. This may make it possible to generate the pulsed laser beam S6 with an optimal pulse shape which can meet a condition. Further, largely offsetting the rise timings of the pulsed laser beams may make it possible to generate a plurality of laser beams, such as a pre-pulse laser beam and a main pulse laser beam.

3.4 Embodiment where Laser Apparatus with Multiple QCLs as MO Includes Regenerative Amplifier (Fourth Embodiment)

Figure 29:
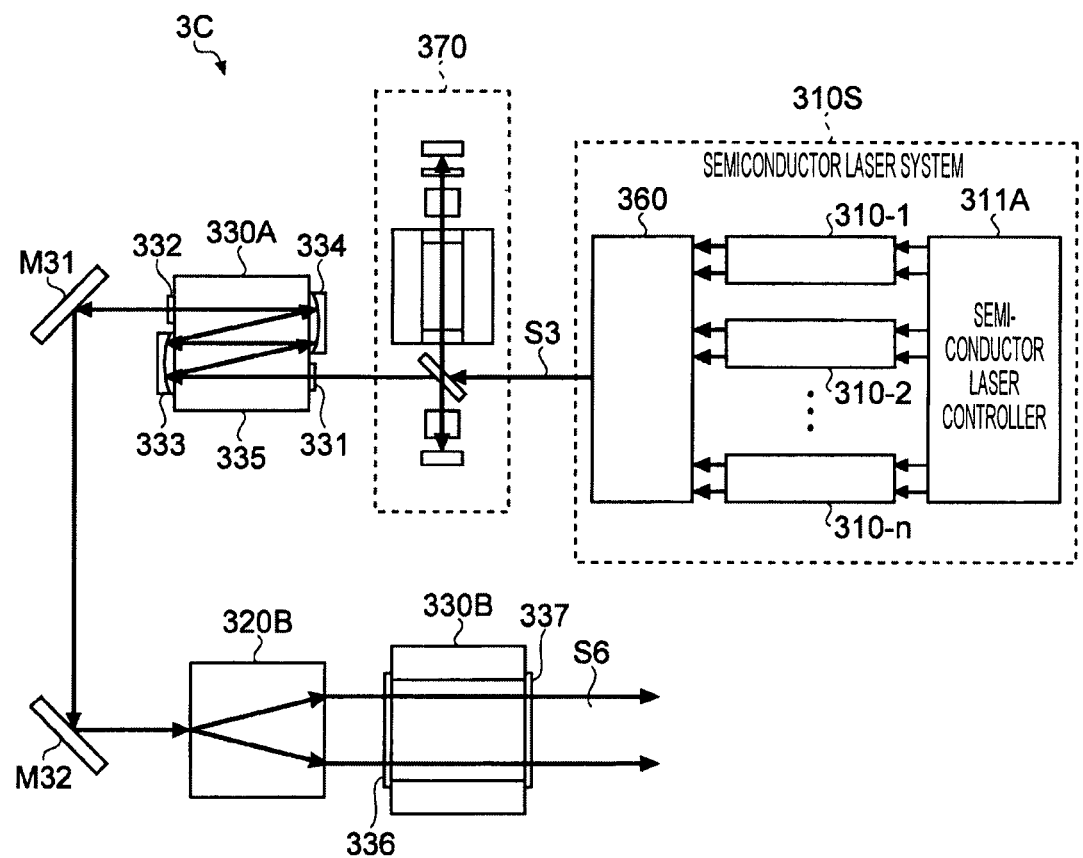
FIG. 29 schematically illustrates the configuration of a laser apparatus according to a fourth embodiment.

The laser apparatus 3B shown in FIG. 14 may include the regenerative amplifier 370 as in the laser apparatus 3A shown in FIG. 9. FIG. 29 schematically illustrates the configuration of a laser apparatus 3C according to a fourth embodiment. As illustrated in FIG. 29, the laser apparatus 3C may be similar in configuration to the laser apparatus 3A shown in FIG. 9, but may differ in that the semiconductor laser apparatus 310 is replaced by the semiconductor laser system 3105 shown in FIG. 14. Other configuration and operation may be similar to those of the above-described embodiments; thus, detailed description thereof will be omitted here.

3.5 Longitudinal Mode Outputted by QCL

In order to facilitate the understanding of the fourth embodiment, the wavelength of the longitudinal mode pulsed laser beam S3 outputted from the semiconductor laser apparatus 310 will be described first.

3.5.1 Resonator of QCL

Figure 30:
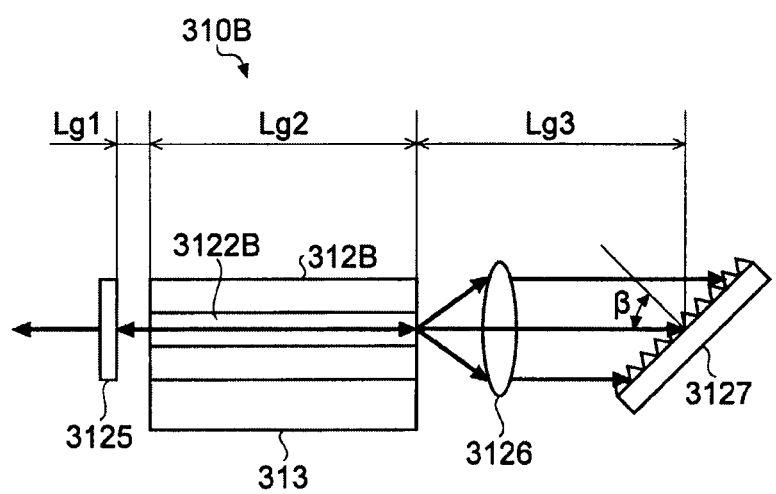
FIG. 30 schematically illustrates the configuration of an external-resonator type semiconductor laser apparatus 310B.

The oscillation wavelength of the semiconductor laser apparatus 310 will be described, first. Here, the external-resonator type semiconductor laser apparatus 310B will be used as an example. FIG. 30 schematically illustrates the configuration of the external-resonator type semiconductor laser apparatus 310B.

In the configuration shown in FIG. 30, the longitudinal mode (wavelength) of the external-resonator type semiconductor laser apparatus 310B may be represented by Expression (1) below.

$$m\lambda L = 2 \cdot L \quad (1)$$

m: order
λL: (longitudinal mode) wavelength of laser oscillation
L: optical path length of the resonator Here, the distance between the output coupler 3125 and the semiconductor laser device 312B is Lg1, and the refraction index of that space is n1. The length of the active layer 3122B is Lg2, and the refraction index thereof is n2. Further, the distance between the semiconductor laser device 312B and the grating 3127 is Lg3, and the refraction index of that space is n3. Then, the optical path length L of the optical resonator formed in the external-resonator type semiconductor laser apparatus 310B may be represented by Expression (2) below.

$$L = (n1 \cdot Lg1 + n2 \cdot Lg2 + n3 \cdot Lg3) \quad (2)$$

Further, the free spectral range (FSR) of the longitudinal mode may be represented by Expression (3) below.

$$FSR = \lambda^2 / (2L) \quad (3)$$

Here, when the grating 3127 is in the Littrow arrangement, the angle of incidence and the angle of diffraction are the same angle β; thus, the central wavelength of a selected bandwidth may be represented by Expression (4) below.

$$m(\lambda G/n3) = 2 \cdot a \cdot \sin \beta \quad (4)$$

m: order
λG: central wavelength of selected bandwidth
n3: refraction index of space between the semiconductor laser device 312B and the grating 3127
a: grating space
β: angle of diffraction (=angle of incidence α)

The external-resonator type semiconductor laser apparatus 3108 may, when the longitudinal mode λ of the optical resonator coincides with the selected central wavelength λG by the grating 3127, oscillate at the given wavelength.

Figure 31:
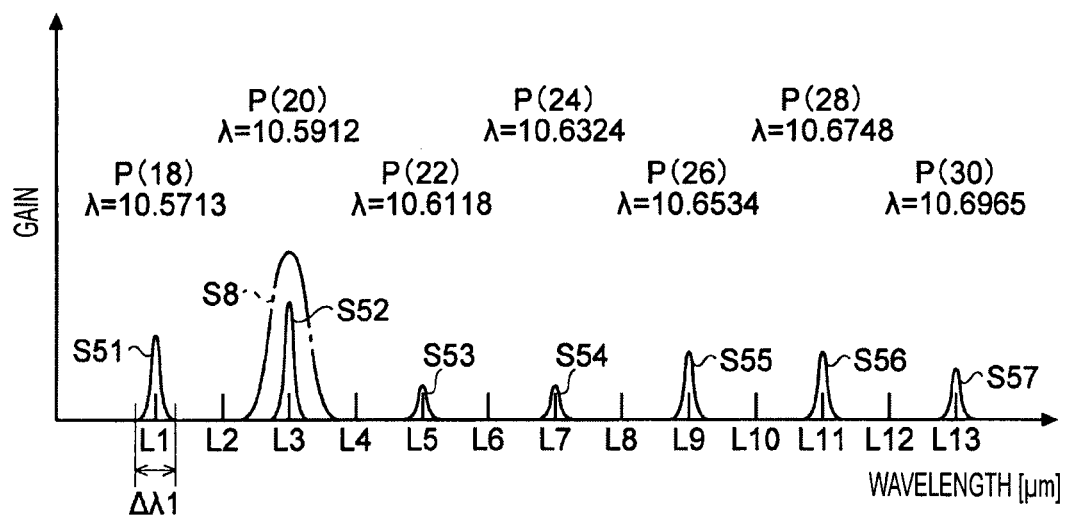
FIG. 31 illustrates the relationship among the gain bandwidths of the $CO_2$ gas gain medium, selected wavelengths by a grating, and longitudinal modes at which the semiconductor laser elements oscillate in the fourth embodiment.
Figure 32:
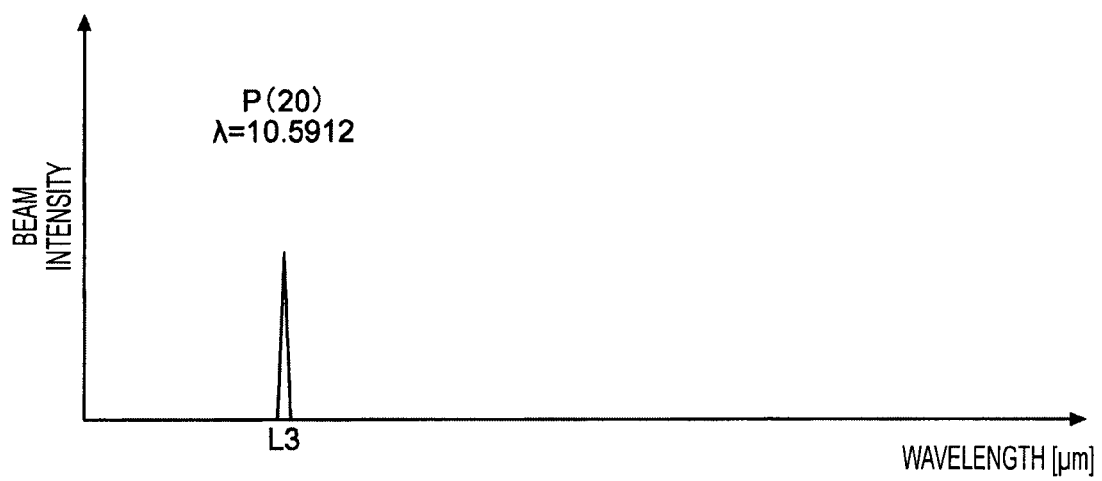
FIG. 32 shows an example of a single-longitudinal-mode outputted from a semiconductor laser apparatus in the fourth embodiment.

3.5.2 Relationship Between Longitudinal Mode of QCL and Wavelength Selectivity by Grating The relationship between the longitudinal mode at which the semiconductor laser apparatus 310 oscillates and the wavelength selectivity by the grating 3127 will be discussed. Here, the case where the pulsed laser beam S3 of a single-longitudinal-mode at a wavelength coinciding with the gain bandwidth S52 of P(20) transition is outputted from the semiconductor laser apparatus 310 will be illustrated. FIG. 31 illustrates the relationship among the gain bandwidths of the $CO_2$ gas gain medium, the wavelength selectivity by the grating, and the longitudinal modes at which the semiconductor laser device oscillates. FIG. 32 shows an example of the pulsed laser beam S3 outputted from the semiconductor laser apparatus at a single-longitudinal-mode. Here, in the example shown in FIG. 31, the semiconductor laser device 312 in the semiconductor laser apparatus 310 may oscillate at longitudinal modes L1 through L13. Further, it is assumed that the selected wavelength range S8 by the grating 3124 or 3127 of the semiconductor laser apparatus 310 (distributed-feedback semiconductor laser apparatus 310A or external-resonator type semiconductor laser apparatus 310B) contains the longitudinal mode L3 of the longitudinal modes L1 through L13. In this case, the longitudinal mode at which the semiconductor laser apparatus 310 oscillates may be the longitudinal mode L3.

As shown in FIG. 31, when the optical path length L of the optical resonator formed in the semiconductor laser apparatus 310 is 5549.8 μm and the order m of the diffracted ray selected by the grating 3124 or 3127 is 524, the wavelength λL of the longitudinal mode L3 may be 10.5912 μm, from Expression (1) above. Further, from Expression (3) above, the wavelength gap (FSR) of the longitudinal modes L1 through L13 may be 0.0101 μm. In that case, the wavelength selection range S8 selected by the grating 3124 or 3127 may include the wavelength of the longitudinal mode L3. As a result, the oscillation wavelength of the semiconductor laser apparatus 310 may in fact be the wavelength of the longitudinal mode L3.

The wavelength of the longitudinal mode L3 may be contained in the gain bandwidth S52 at P(20) transition of the $CO_2$ gas gain medium. In this way, by making the wavelength of the longitudinal mode L3 and the wavelength selection range S8 by the grating 3124 or 3127 overlap the gain bandwidth S52 at P(20) transition, the wavelength of the pulsed laser beam S3 outputted from the semiconductor laser apparatus 310 overlaps the gain bandwidth S52, as shown in FIG. 32; thus, the pulsed laser beam S3 may be amplified in the gain bandwidth S52 of the $CO_2$ gas gain medium.

Here, the case where the oscillation wavelength of the semiconductor laser apparatus 310 is controlled to overlap the gain bandwidth S52 at P(20) transition is described above. However, without being limited thereto, the wavelength chirping range of the semiconductor laser apparatus 310 may overlap at least part of any one of the gain bandwidths S51 through S57. For example, the initial wavelength of the pulsed laser beam S3 may be shorter than the wavelength of the gain bandwidth S52. In this case, the wavelength of the pulsed laser beam S3 may overlap at least part of the gain bandwidth S52 as the wavelength of the pulsed laser beam S3 chirps.

3.5.3 Controlling Optical Path Length

When the external-resonator type semiconductor laser apparatus 310B is used as the semiconductor laser apparatus 310, as may be apparent from Expression (2) above, the optical path length L of the optical resonator may be controlled by controlling at least one among the optical path lengths Lg1 and Lg3 and the refraction indexes n1 through n3. With this, the wavelength chirping range of the semiconductor laser apparatus 310B may be controlled.

Hereinafter, specific examples of the control will be discussed.

(1) Control of the refraction index n1 of the space between the output coupler 3125 and the semiconductor laser device 312B: Control at least one of the type and the density (pressure) of the gas in the space between the output coupler 3125 and the semiconductor laser device 312B;

(2) Control of the distance Lg1 between the output coupler 3125 and the semiconductor laser device 312B: Relatively displace the output coupler 3125 and the semiconductor laser device 312B in the direction of the beam axis;

(3) Control of the refraction index n2 of the active layer 3122B: Control the temperature of the semiconductor laser device 312B;

(4) Control of the refraction index n3 of the space between the semiconductor laser device 312B and the grating 3127: Control at least one of the type and the density (pressure) of the gas in the space between the semiconductor laser device 312B and the grating 3127;

(5) Control of the distance Lg3 between the semiconductor laser device 312B and the grating 3127: Relatively displace the semiconductor laser device 312B and the grating 3127 in the direction of the beam axis.

Meanwhile, when the distributed-feedback semiconductor laser apparatus 310A, which is an internal-resonator type semiconductor laser apparatus, is used as the semiconductor laser apparatus 310, the grating 3124 and the optical resonator may be formed inside the semiconductor laser device 312A (see FIG. 4). Accordingly, the wavelength of the longitudinal mode determined by the central wavelength of the bandwidth selected by the grating 3124 and the optical path length of the optical resonator may vary in accordance with the change in temperature of the active layer 3122. Thus, controlling the temperature of the semiconductor laser device 312A may make it possible to control the wavelength chirping range.

3.5.4 Controlling Current Pulse to Flow in Semiconductor Laser Device

Figure 33:
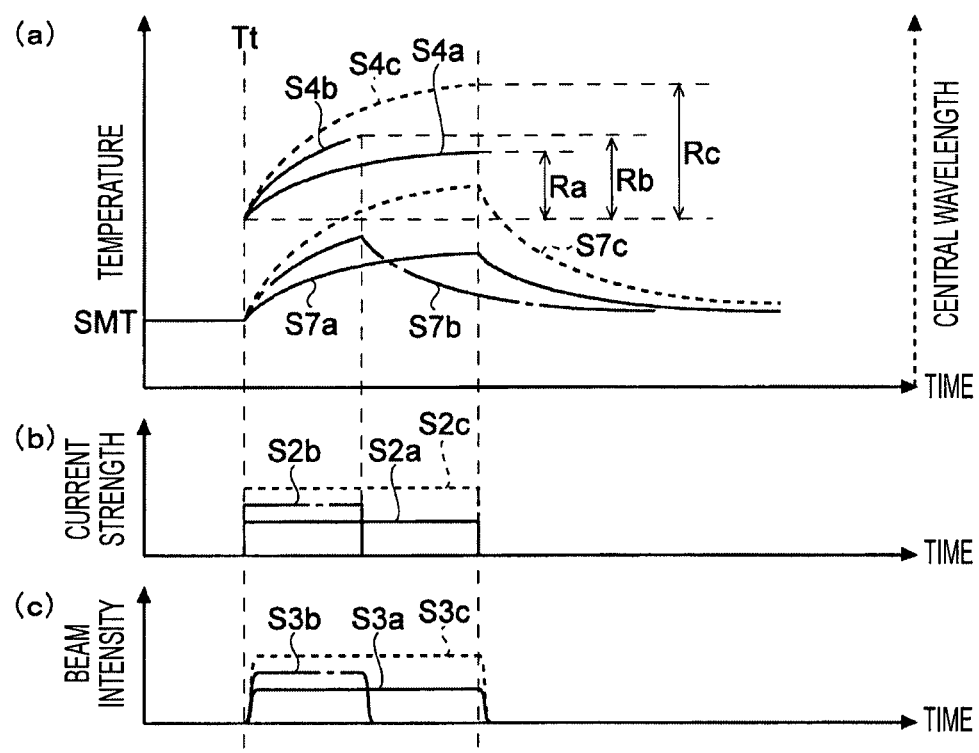
FIG. 33 illustrates changes over time in wavelength chirping, in temperature of an active layer, and in beam intensity of an outputted pulsed laser beam, when a current pulse flowing in the semiconductor laser device is varied.

Further, by controlling the current pulse to flow in the semiconductor laser device 312 of the semiconductor laser apparatus 310, the chirping range of the oscillation wavelength may be controlled as well. FIG. 33 shows a change over time in the wavelength chirping, the temperature of the active layers, and the beam intensity of the outputted pulsed laser beam.

Even when the temperature of the semiconductor device 312 is controlled by using the Peltier device 313 so as to be retained constant, for example, the temperature of the active layer 3122 of the semiconductor laser device 312 may change due to the current flowing in the semiconductor laser device 312. The rise in the temperature of the active layer 3122 may become steeper as the intensity of the current flowing in the semiconductor laser device 312 increases. For example, as shown in FIG. 33(b), when a current pulse S2c is greater than a current pulse S2a, temperature S7c of the active layer 3122 when the current pulse S2c flows in the semiconductor laser device 312 may vary more than temperature S7a of the active layer 3122 when the current pulse S2a flows in the semiconductor laser device 312, as shown in FIG. 33(a). As a result, as in the output wavelengths S4a and S4c shown in FIG. 33(a), a wavelength chirping range Rc when the current pulse S2c flows in the semiconductor laser device 312 may be wider than a wavelength chirping range Ra when the current pulse S2a flows in the semiconductor laser device 312.

The temperature of the semiconductor laser device 312 may continue to rise while the current pulse is being supplied to the semiconductor laser device 312. Accordingly, the wavelength chirping may continue during that period. Here, even if the period in which the current pulse is being supplied is short, the wavelength chirping range may be relatively wide if the intensity of the current pulse is high. For example, as shown in FIG. 33(b), when the pulse width of the current pulse S2b is made shorter than the pulse width of the current pulse S2a and the current pulse S2b is made stronger than the current pulse S2a, temperature S7b of the active layer 3122 when the current pulse S2b flows in the semiconductor laser device 312 may vary more than the temperature S7a of the active layer 3122 when the current pulse S2a flows in the semiconductor laser device 312, as shown in FIG. 33(a). As a result, as in the output wavelengths S4a and S4b shown in FIG. 33(a), a wavelength chirping range Rb when the current pulse S2b flows in the semiconductor laser device 312 may be wider than the wavelength chirping range Ra when the current pulse S2a flows in the semiconductor laser device 312.

Based on the above, it may be understood that the wavelength chirping range may be controlled by controlling the intensity and the pulse width of the current pulse that flows in the semiconductor laser device 312.

Here, the wavelength may chirp rapidly at the beginning of the current pulse, but the change may become smaller toward the end of the current pulse. From this, it may be preferable that a portion toward the end of the wavelength chirping range is controlled to overlap a gain bandwidth of the $CO_2$ gas gain medium. This may allow the pulse width of the amplified pulsed laser beam to be extended.

3.5.5 Setting Wavelength Selectivity by Design (1) External-Resonator Type Semiconductor Laser In the case of the external-resonator type semiconductor laser apparatus 310B, by modifying the angle β of incidence on the grating 3127 shown in FIG. 30, the wavelength selection range S8 by the grating 3127 shown in FIG. 31 may be set to wavelengths corresponding to the gain bandwidths S51, S53, S54, S55, S56, or S57 at other transitions (P(18), P(22), P(24), P(26), P(28), and P(30)).

(2) Internal-Resonator Type Semiconductor Laser

In the case of the internal-resonator type semiconductor laser, such as the distributed-feedback semiconductor laser apparatus 310A (see FIG. 4), by adjusting the gaps W1 in the grating 3124 when manufacturing the semiconductor laser device 312A, as in the case of the external-resonator type semiconductor laser apparatus 310B, the semiconductor laser apparatus 310A that oscillates at a single-longitudinal-mode of a wavelength corresponding to the gain bandwidth S51, S53, S54, S55, S56, or S57 at P(18), P(22), P(24), P(26), P(28), or P(30) transition other than P(20) transition can be obtained.

4. Control System of $CO_2$ Laser Apparatus with QCL as MO (Fifth Embodiment)

Subsequently, the control system of the laser apparatus 3 shown in FIG. 1 will be described in detail with reference to the drawings. Here, the configuration and the operation below may be applicable to the laser apparatuses 3A through 3C according to the other embodiments.

4.1 Configuration

Figure 34:
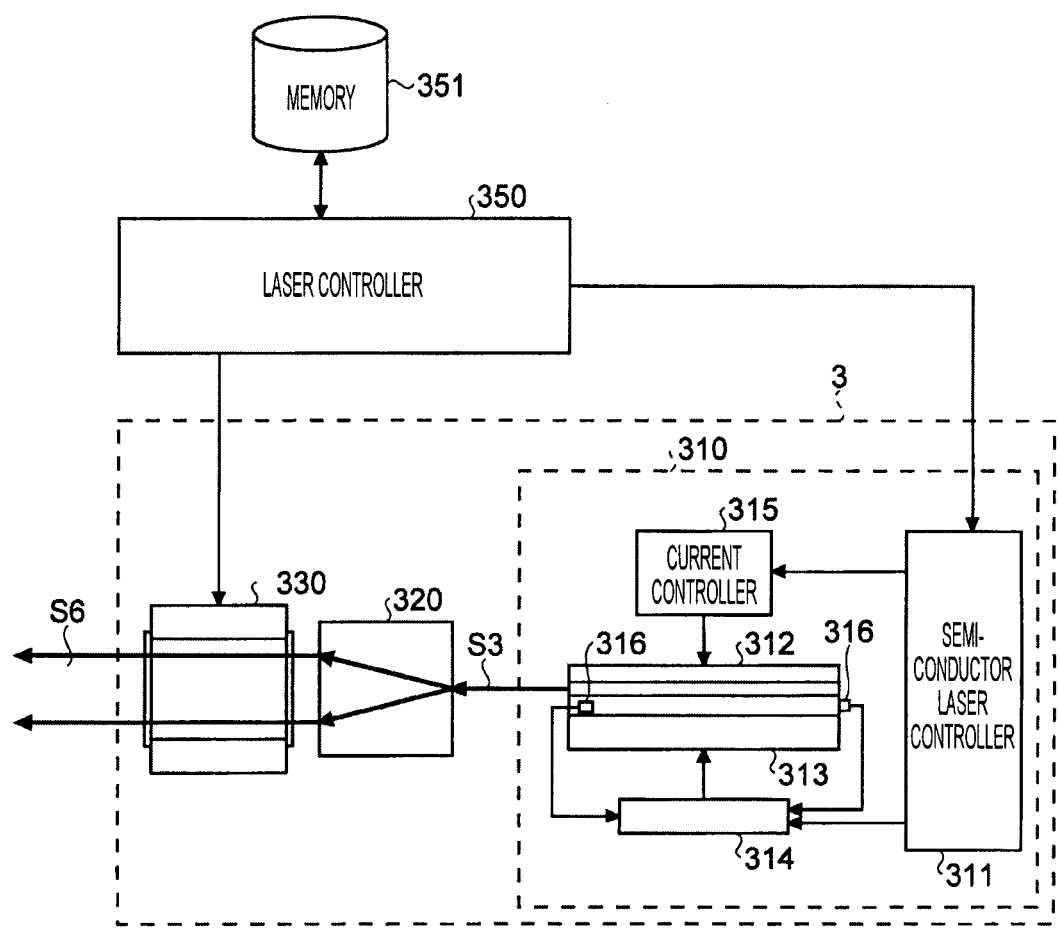
FIG. 34 schematically illustrates the configuration of a laser apparatus and the control system thereof according to a fifth embodiment.

FIG. 34 schematically illustrates the configuration of the laser apparatus 3 and the control system thereof. As illustrated in FIG. 34, the control system of the laser apparatus 3 may include a laser controller 350 and a memory 351.

The memory 351 may hold various control parameters for the laser controller 350 to control the semiconductor laser apparatus 310. The control parameters may include chirping characteristics of the semiconductor laser device 312. The memory 351 may hold the chirping characteristics by associating the chirping characteristics to a current value I and a pulse width W of the current pulse which flows in the semiconductor laser device 312, a set temperature SMTt of a temperature adjusting unit of the semiconductor laser device 312, and a repetition rate f.

4.2 Overview of Operation

The laser controller 350 may load necessary control parameters from the memory 351 when causing the semiconductor laser apparatus 310 to oscillate. The laser controller 350 may input various control signals to the semiconductor laser controller 311 of the semiconductor laser apparatus 310, based on the loaded control parameters. The semiconductor laser controller 311 may be configured to control the temperature controller 314 and the current controller 315, based on the inputted various control signals. With this, the pulsed laser beam S3 may be outputted from the semiconductor laser apparatus 310.

Further, the laser controller 350 may be configured to control the intensity and the timing at which the $CO_2$ gas gain medium in the amplifier 330 is excited. For example, the laser controller 350 may excite the $CO_2$ gas gain medium in the amplifier 330 in synchronization with the timing at which the pulsed laser beam S3 outputted from the semiconductor laser apparatus 310 passes through the amplifier 330. With this, the power consumption in the amplifier 330 may be reduced.

4.3 Control Parameters and Measuring System Thereof

Figure 35:
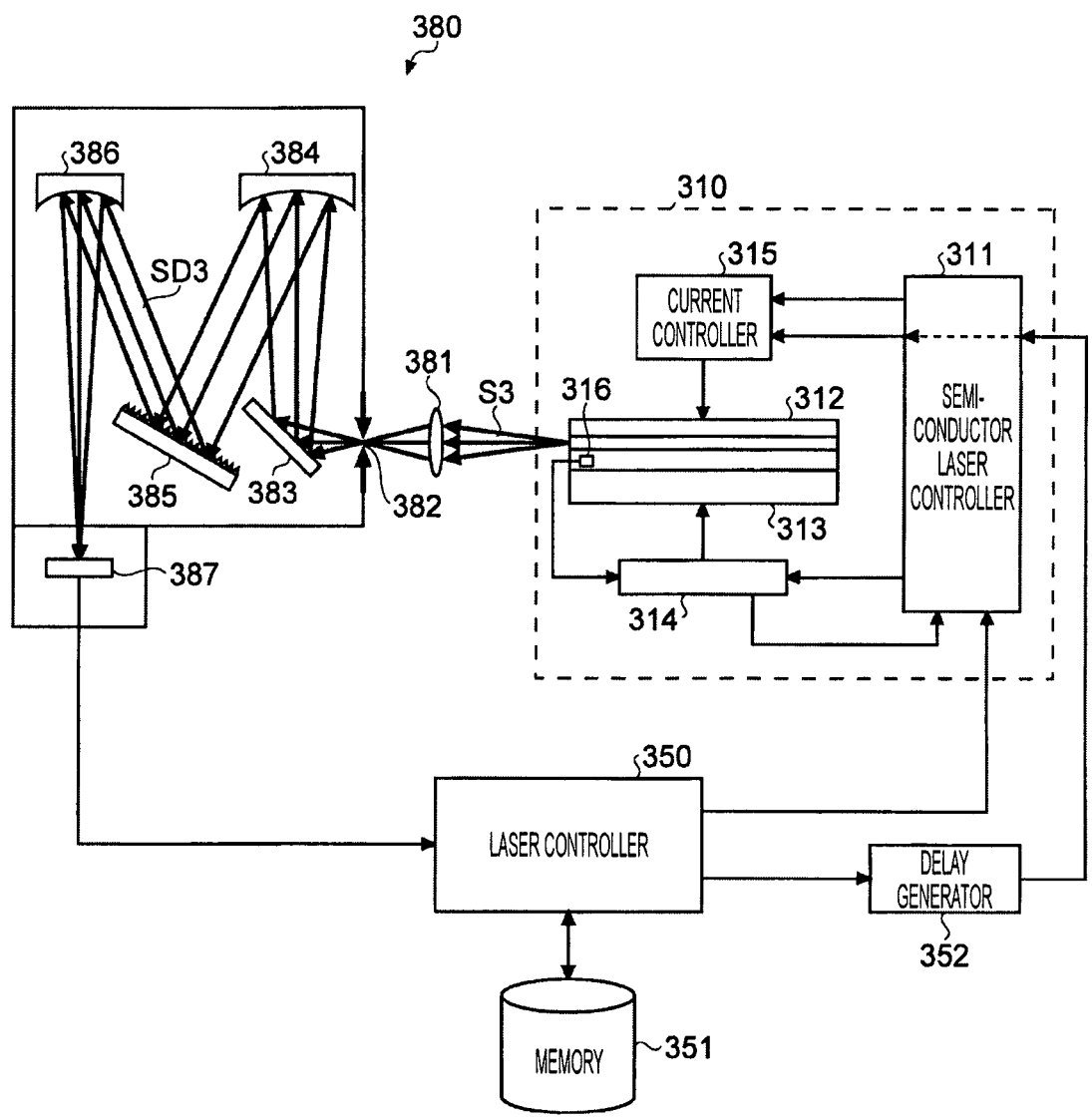
FIG. 35 schematically illustrates the configuration of a measuring system for acquiring control parameters, in advance, for the laser apparatus in the fifth embodiment.

Here, the control parameters held in the memory 351 will be discussed. The control parameters may be obtained in advance by adjustment, simulation, and so forth, for example. FIG. 35 schematically illustrates the configuration of a measuring system for obtaining the control parameters in advance for the laser apparatus 3.

4.3.1 Measuring Configuration

As illustrated in FIG. 35, the measuring system 380 may include a focusing lens 381, a member with an input slit 382, a high-reflection mirror 383, a concave mirror 384, a grating 385, a concave mirror 386, and a linear sensor 387.

The laser controller 350 may input to the semiconductor laser apparatus 310 the set temperature SMTt of the temperature controller 314 of the semiconductor laser device 312. With this, the temperature of the semiconductor laser device 312 may be adjusted to the set temperature SMTt. Further, the laser controller 350 may input to the semiconductor laser apparatus 310 the current value I and the pulse width W of the current pulse to flow in the semiconductor laser device 312. With this, the current value and the pulse width of the current pulse supplied to the semiconductor laser device 312 from the current controller 315 may be set to the current value I and the pulse width W, respectively. Furthermore, the laser controller 350 may input the oscillation triggers to the semiconductor laser controller 311 at the repetition rate f. At this time, in the case where timing synchronization with the droplet generator 26 is necessary, a delay generator 352 may be provided on a signal path through which the oscillation triggers are transmitted. With this, the current controller 315 in the semiconductor laser apparatus 310 may control the current pulses to flow in the semiconductor laser device 312 at the repetition rate f. As a result, the pulsed laser beam S3 may be outputted from the semiconductor laser apparatus 310 at the repetition rate f.

The pulsed laser beam S3 outputted from the semiconductor laser apparatus 310 may travel through the focusing lens 381 and the input slit 382. The pulsed laser beam S3 that has passed through the input slit 382 may be reflected by the high-reflection mirror 383 and the concave mirror 384, to thereby be collimated. The pulsed laser beam S3 reflected by the concave mirror 384 may be incident on the grating 385. Rays of the pulsed laser beam L3 may be diffracted by the grating 385 in accordance with their wavelengths. Diffracted rays SD3 diffracted by the grating 385 may be reflected by the concave mirror 386. The linear sensor 387 may be disposed at the focus of the concave mirror 386. In that case, diffracted rays SD3 may be focused at positions on the linear sensor 387 in accordance with their diffraction angles. An image data obtained by the linear sensor 387 may be inputted to the laser controller 350. The laser controller 350 may detect the wavelength of the pulsed laser beam S3 based on the inputted image data.

Further, the laser controller 350 may hold the state of a wavelength change over time detected per pulse in the pulsed laser beam S3 as the chirping characteristics of the semiconductor laser apparatus 310. Furthermore, the laser controller 350 may hold in the memory 351 the obtained chirping characteristics by associating the chirping characteristics with the control parameters (current value I, pulse width W, set temperature SMTt (see FIG. 36, discussed below), and repetition rate f) currently set for the semiconductor laser apparatus 310.

4.3.2 Chirping Characteristics

Figure 36:
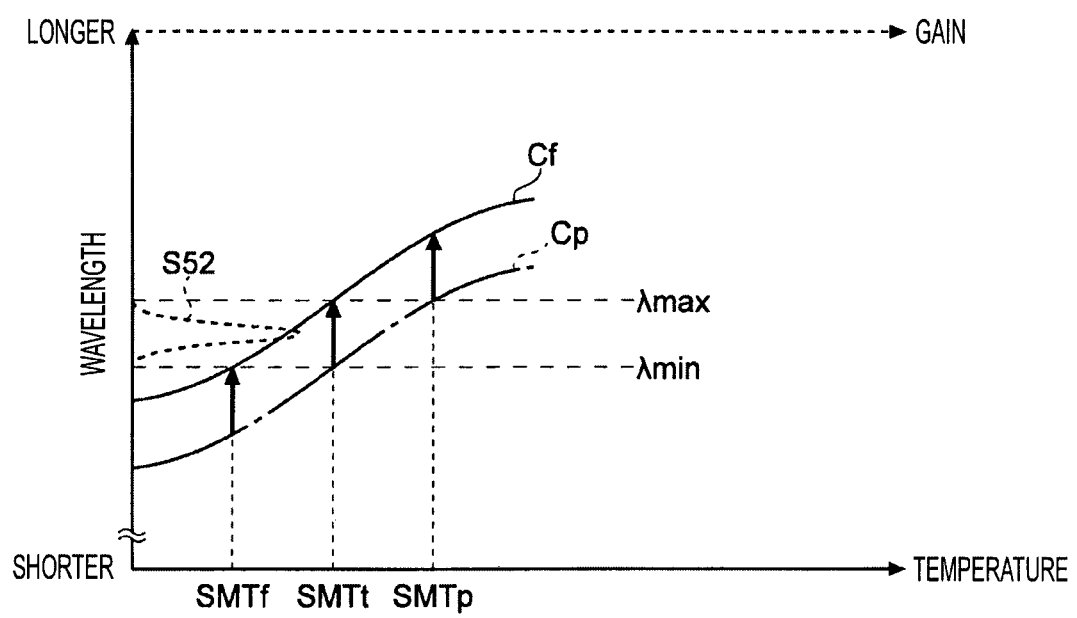
FIG. 36 illustrates an example of chirping characteristics of the semiconductor laser apparatus in the fifth embodiment.

Here, the chirping characteristics of the semiconductor laser apparatus will be discussed with reference to the drawings. FIG. 36 shows an example of the chirping characteristics of the semiconductor laser apparatus. FIG. 36 shows the case where the wavelength of the pulsed laser beam S3 is adjusted, but not limited to, with respect to the gain bandwidth S52. However, the wavelength of the pulsed laser beam S3 may be adjusted with respect to the other gain bandwidths S51 and S53 through S57.

In FIG. 36, a curve Cp indicates temperature dependency of temporally initial wavelengths in a single pulse of the pulsed laser beam S3. A curve Cf indicates temperature dependency of temporally final wavelengths in a single pulse of the pulsed laser beam S3. Thus, the wavelength of the pulsed laser beam S3 may shift from the curve Cp to the curve Cf in the duration of a single pulse.

Further, a set temperature SMTp may be set so that the final wavelength of the pulsed laser beam S3 becomes the longest wavelength λmax of the gain bandwidth S52 in the curve Cp. A set temperature SMTf may be set so that the final wavelength of the pulsed laser beam S3 becomes the shortest wavelength λmin of the gain bandwidth S52. In that case, when the set temperature SMTt of the semiconductor laser apparatus 310 is at or above the set temperature SMTp, the wavelength of the pulsed laser beam S3 does not overlap the gain bandwidth S52; therefore, the pulsed laser beam S3 may not be amplified. When the set temperature SMTt is at or below the set temperature SMTf, the wavelength of the pulsed laser beam S3 does not overlap the gain bandwidth S52, either; therefore, the pulsed laser beam S3 may not be amplified.

Accordingly, the set temperature SMTt may be set at a temperature (intermediate temperature, for example) between the set temperature SMTf and the set temperature SMTp, for example. With this, the pulsed laser beam S3 may be amplified using a bandwidth with higher gain. As a result, the amplification efficiency may be improved. Here, the set temperature SMTt between the set temperature SMTf and the set temperature STMp may be obtained from Expression (5) below.

$$SMTt=(SMTf+SMTp)/2 \qquad (5)$$

4.3.3 Measuring Operation

The operation for acquiring the control parameters by the measuring system 380 and the laser controller 350 will be described in detail with reference to the drawings. The description to follow will be given with a focus on the operation of the laser controller 350.

Figure 37:
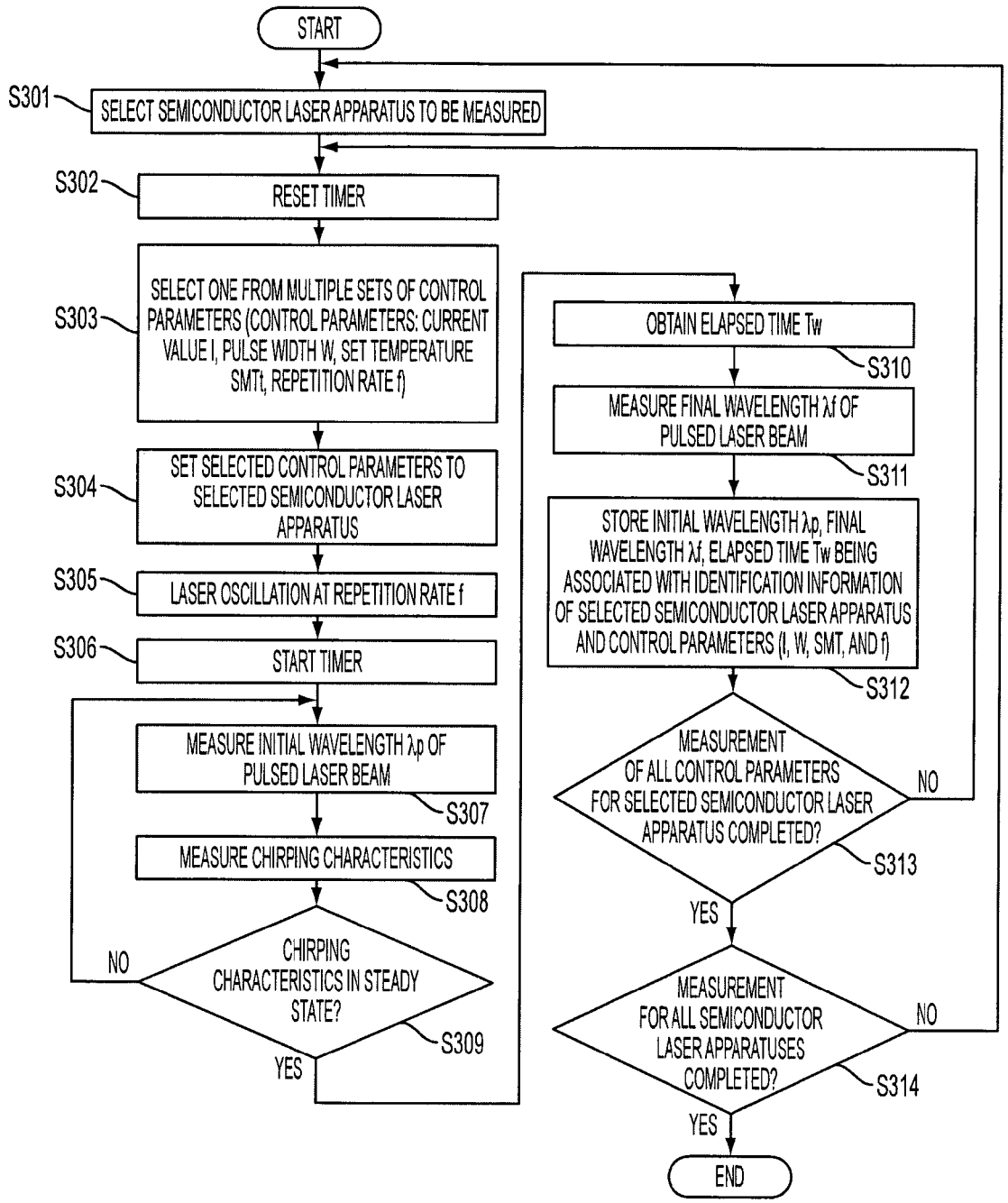
FIG. 37 illustrates an example of the control parameter acquisition operation by the measuring system and the laser controller in the fifth embodiment.

FIG. 37 illustrates an example of control parameter acquisition operation by the measuring system 380 and the laser controller 350. As shown in FIG. 35, the measuring system 380 may preferably be arranged downstream from the semiconductor laser apparatus 310. As shown in FIG. 37, the laser controller 350 may first select a semiconductor laser apparatus subject for measurement (Step S301). However, when the laser apparatus includes only a single semiconductor laser apparatus, Step S301 may be omitted.

Then, the laser controller 350 may reset a timer (not shown) (Step S302). Subsequently, the laser controller 350 may select a single set of control parameters from a plurality of sets of control parameters held in the control system (Step S303). Each set of control parameters may include the current value I and the pulse width W of the current pulse to flow in the semiconductor laser device 312, the set temperature SMTt of the temperature adjusting unit of the semiconductor laser device 312, and the repetition rate f. The plurality of sets of control parameters may be held in the memory 351, for example. The laser controller 350 may read out the plurality of sets of control parameters held in the memory 351 and select one from the sets.

Then, the laser controller 350 may send the control parameters included in the selected set of control parameters to the semiconductor laser controller 311 of the semiconductor laser apparatus 310, to thereby set the control parameters to the semiconductor laser controller 311 (Step S304). Subsequently, the laser controller 350 may input the oscillation triggers to the semiconductor laser controller 311 at the predetermined repetition rate f, whereby the semiconductor laser apparatus 310 may oscillate at the predetermined repetition rate f (Step S305). Then, the laser controller 350 may start measuring an elapsed time with the timer (Step S306).

Subsequently, the laser controller 350 may measure the initial wavelength λp of the pulsed laser beam S3 outputted from the semiconductor laser apparatus 310 (Step S307). The initial wavelength λp may be measured based on the image data inputted from the linear sensor 387 of the measuring system 380, for example.

Then, the laser controller 350 may measure the chirping characteristics of the pulsed laser beam S3 (Step S308). The chirping characteristics may be measured based on the change over time in the image data inputted from the linear sensor 387, for example.

Thereafter, the laser controller 350 may determine whether or not the chirping characteristics of the pulsed laser beam S3 are in a steady state (Step S309). Whether or not the chirping characteristics are in the steady state may be determined based on whether or not the chirping characteristics of immediately preceding several pulses of the pulsed laser beams S3 sufficiently coincide with one another. When the chirping characteristics are not in the steady state (Step S309; NO), the laser controller 350 may return to Step S307 and measure the initial wavelength λp and the chirping characteristics of a subsequent pulse of the pulsed laser beam S3 (Steps S307 and S308).

On the other hand, when the chirping characteristics are in the steady state (Step S309; YES), the laser controller 350 may acquire an elapsed time Tw measured by the timer (Step S310). The chirping characteristics of the pulsed laser beam S3 may not be stabilized until the temperature of the semiconductor laser device 312 is in the steady state. Accordingly, acquiring the elapsed time Tw required for the chirping characteristics to reach the steady state in advance may help determine easily whether or not the chirping characteristics reaches the steady state even when the apparatus is placed in operation.

Then, the laser controller 350 may measure the final wavelength λf of the pulsed laser beam S3 (Step S311). The final wavelength λf may be measured based on the image data inputted from the linear sensor 387 of the measuring system 380, for example.

Subsequently, the laser controller 350 may store the initial wavelength λp, the final wavelength λf, and the elapsed time Tw acquired with the above operation for the selected semiconductor laser apparatus 310 in the memory 351 (Step S312). The above parameters are associated with the identification information of, and the set of control parameters for, the selected semiconductor laser apparatus 310.

Then, the laser controller 350 may determine whether or not the measurement for all the control parameters in the selected set has been completed for the selected semiconductor laser apparatus 310 (Step S313). When the measurement in all the control parameters has not been completed (Step S313; NO), the laser controller 350 may return to Step S302 and repeat the subsequent steps.

Thereafter, when the measurement in all the control parameters is completed (Step S313; YES), the laser controller 350 may determine whether or not the above measurement has been completed for all the semiconductor laser apparatuses 310 (Step S314). When the measurement for all the semiconductor laser apparatuses 310 has not been completed (Step S314; NO), the laser controller 350 may return to Step S301 and repeat the subsequent steps. When the measurement for all the semiconductor laser apparatuses 310 has been completed (Step S314; YES), the laser controller 350 may terminate this operation.

With the above operation, the measurement data in all the control parameters in the selected set with respect to all the semiconductor laser apparatuses 310 may be stored in the memory 351.

4.4 Amplification Control Operation

Figure 38:
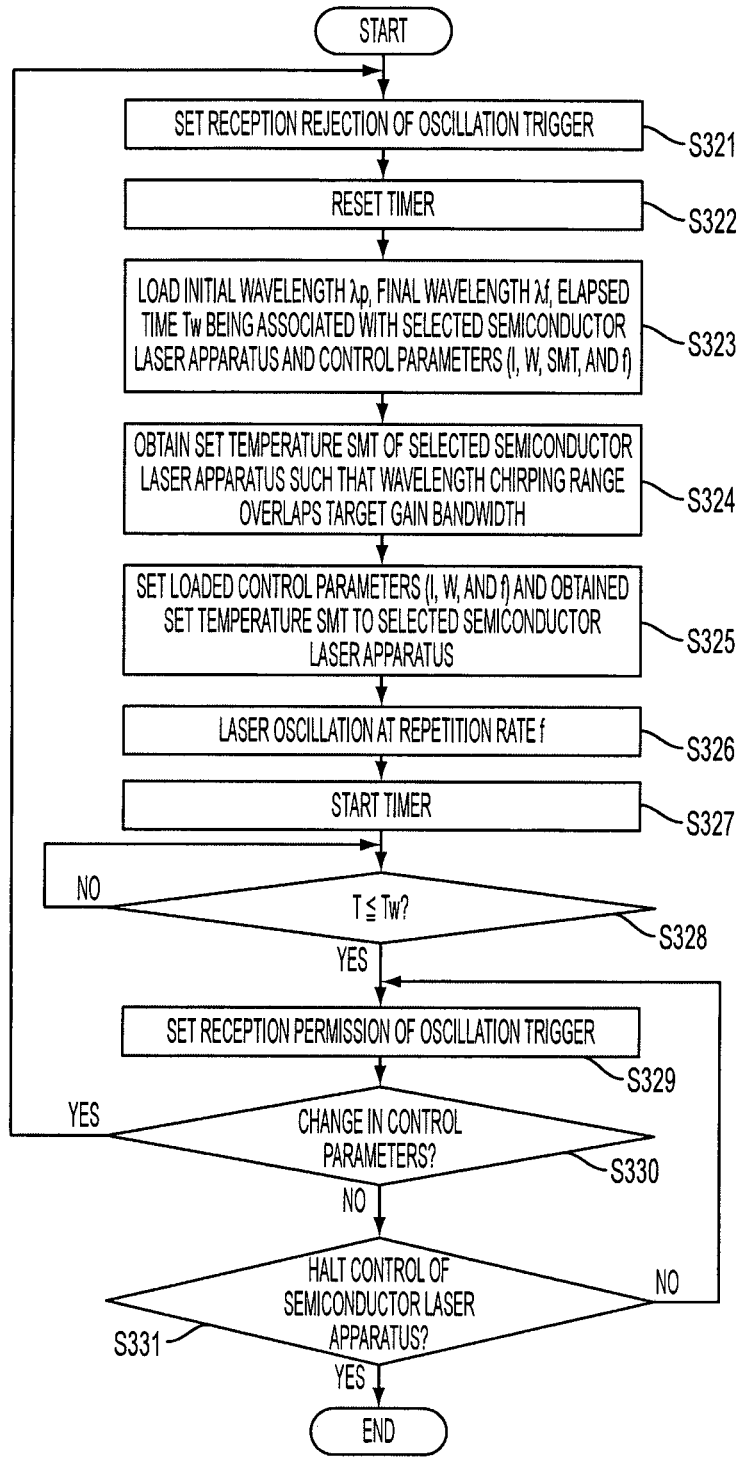
FIG. 38 illustrates amplification control operation including feedback-control by the laser controller in the fifth embodiment.

The amplification control operation of the laser apparatus 3 will be described in detail with reference to the drawings. Here, the operation below may be applicable to the laser apparatuses 3A through 3C according to the other embodiments as well. FIG. 38 shows the amplification control operation by the laser controller 350.

In the amplification control operation, as shown in FIG. 38, the laser controller 350 may first set a reception refusal of the oscillation trigger (Step S321). The oscillation trigger may be inputted to the laser controller 350 from an external apparatus, such as an exposure apparatus, or may be given to the laser controller 350 from a trigger generator (not shown) inside the laser controller 350.

Then, the laser controller 350 may reset a timer (not shown) (Step S322). Subsequently, the laser controller 350 may load the initial wavelength $\lambda p$, the final wavelength $\lambda f$, and the elapsed time Tw associated with the identification information, and the set of control parameters of, the respective semiconductor laser apparatuses 310 from the memory 351 (Step S323). Here, when there is only a single semiconductor laser apparatus 310, the initial wavelength $\lambda p$, the final wavelength $\lambda f$, and the elapsed time Tw may be associated with the set of control parameters (i.e., no identification information).

Thereafter, the laser controller 350 may obtain a set temperature SMT for controlling the wavelength chirping range of a given semiconductor laser apparatus 310 to overlap the target gain bandwidth of the semiconductor laser apparatus 310 (Step S324). Here, the set temperature SMT may be obtained from Expression (5) above, for example.

Subsequently, the laser controller 350 may set the control parameters loaded in Step S323 and the set temperature SMT obtained in Step S324 to the respective semiconductor laser apparatuses 310 (Step S325).

Then, the laser controller 350 may input the oscillation triggers to the semiconductor laser controller 311 at the predetermined repetition rate f, whereby the semiconductor laser apparatus 310 may oscillate at the predetermined repetition rate f (Step S326). Thereafter, the laser controller 350 may start measuring an elapsed time with the timer (Step S327).

Subsequently, the laser controller 350 may stand by until the elapsed time Tw has passed (Step S328; NO). Whether or not the elapsed time Tw has passes may be determined based on the count value in the timer. When the elapsed time Tw has passed (Step S328; YES), the laser controller 350 may set a reception permission of the oscillation trigger (Step S329). With this, the laser controller 350 may cause the semiconductor laser apparatus 310 to oscillate based on the oscillation trigger received from an external apparatus or from the trigger generator provided therein.

Thereafter, the laser controller 350 may determine whether or not there has been a change in the control parameters (Step S330). The information on the change in the control parameters may be given to the laser controller 350 from an external apparatus, for example. When there has been a change in the control parameters (Step S330; YES), the laser controller 350 may return to Step S321 and repeat the subsequent steps. On the other hand, when there is no change in the control parameters (Step S330; NO), the laser controller 350 may determine whether or not the control of the semiconductor laser apparatus 310 is to be terminated (Step S331). Whether or not the control of the semiconductor laser apparatus 310 is to be terminated may be determined based on whether or not the termination or completion of exposure has been notified from the external apparatus, for example. When the control of the semiconductor laser apparatus 310 is to be terminated (Step S331; YES), the laser controller 350 may terminate this operation. On the other hand, when the control of the semiconductor laser apparatus 310 is not to be terminated (Step S331; NO), the laser controller 350 may return to Step S329 and repeat the subsequent steps.

4.5 Control System of $CO_2$ Laser Apparatus Capable of Feedback-Control (Sixth Embodiment)

The laser apparatus 3 capable of feedback-control will be described in detail with reference to the drawings. Here, the configuration and the operation below may be applicable to the laser apparatuses 3A through 3C according to the other embodiments as well.

4.5.1 Feedback-Control Configuration

Figure 39:
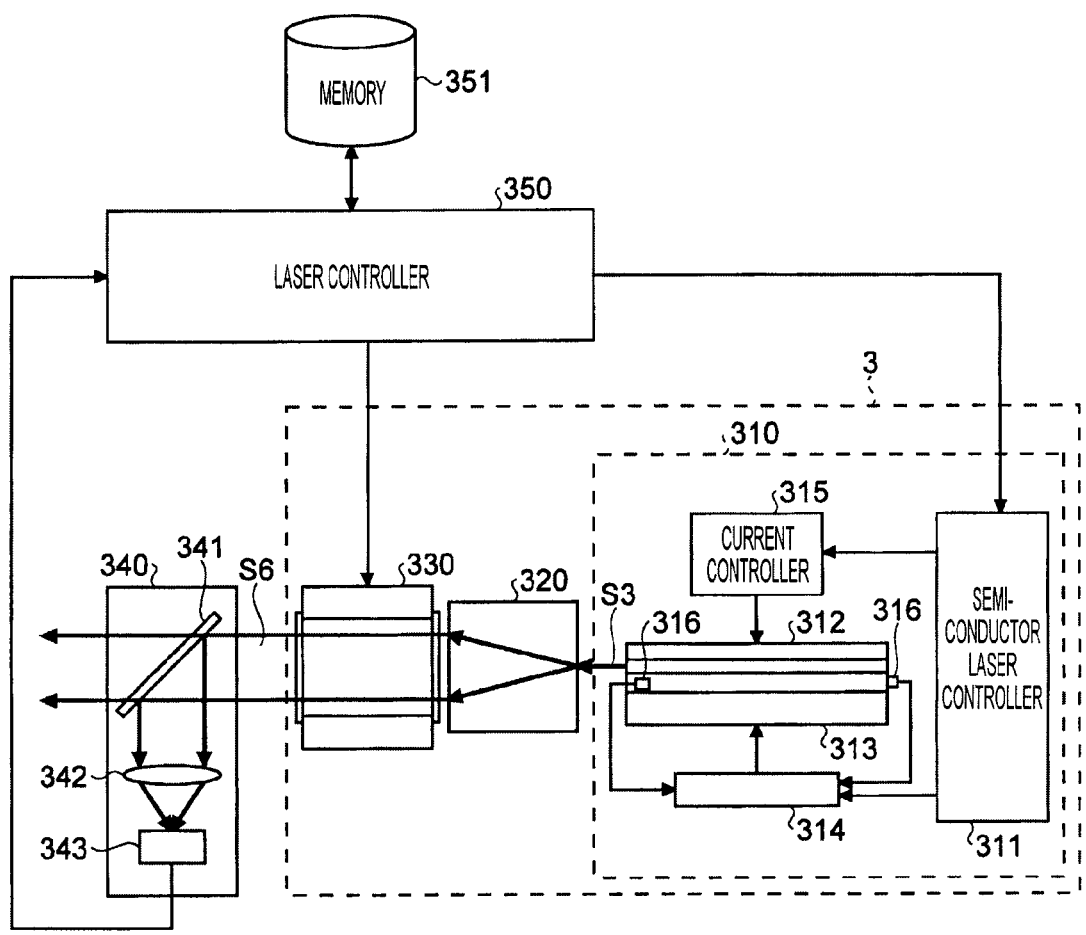
FIG. 39 schematically illustrates the configuration of a laser apparatus and the control system thereof including a loop for feedback-control according to a sixth embodiment.

FIG. 39 schematically illustrates the configuration of the laser apparatus 3 including a loop for feedback-control and the control system thereof. As it may be apparent when FIG. 39 is compared to FIG. 34, the feedback-control system of the laser apparatus 3 may further include a monitor unit 340.

The monitor unit 340 may be provided on the beam path of the pulsed laser beam S6 downstream from the amplifier 330. The monitor unit 340 may include a beam splitter 341, a focusing lens 342, and an optical detector 343. The beam splitter 341 may reflect a part of the pulsed laser beam S6 outputted from the amplifier 330. The focusing lens 342 may be disposed so as to focus the part of the pulsed laser beam S6 reflected by the beam splitter 341 on a photosensitive surface of the optical detector 343. The optical detector 343 may detect a timing Tp at which the pulsed laser beam S6 is outputted or may detect a pulse shape of the pulsed laser beam S6. Alternatively, a spectroscope for detecting the wavelength of the pulsed laser beam S6 may be used in place of the optical detector 343. Here, the monitor unit 340 may be configured to detect the pulsed laser beam S3, and if that is the case, the monitor unit 340 may be provided on the beam path of the pulsed laser beam S3 upstream from the amplifier 330.

The laser controller 350 may be connected to the monitor unit 340, the amplifier 330, and the semiconductor laser controller 311. The laser controller 350 may be configured to control these, to thereby control the output and the amplification of the pulsed laser beam S3.

4.5.2 Feedback-Control Operation

The operation of the laser apparatus 3 including a loop for feedback-control and the control system thereof will be described. Here, the amplification control operation may be similar to the operation described with reference to FIG. 38. Below, the feedback-control carried out by the laser controller 350 during the amplification control operation will be discussed with examples. When the timing Tp at which the amplified pulsed laser beam S6 is outputted requires a delay time, the delay time may be set in advance as a target delay time Tdt. The control system may basically use feedback-control to adjust the temperature of the semiconductor laser device 312 such that the timing Tp, which is detected in the monitor unit 340, at which the amplified pulsed laser beam S6 is outputted from the amplifier 330 may achieve the target delay time Tdt.

Figure 40:
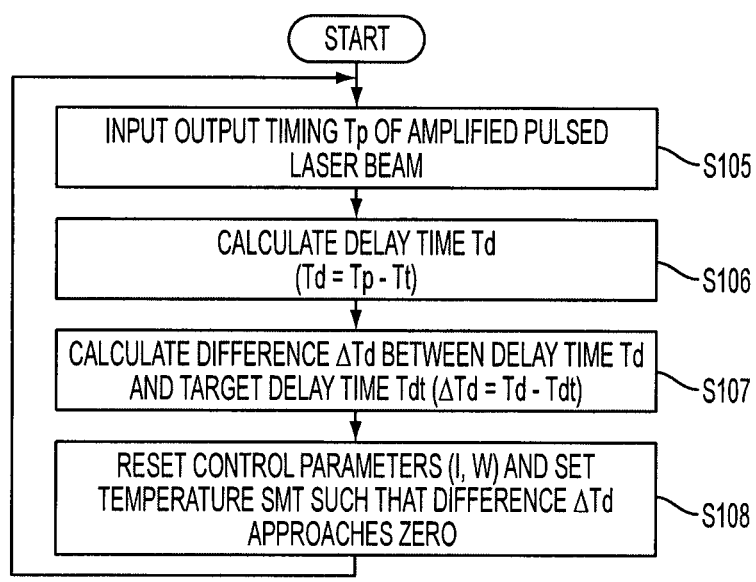
FIG. 40 illustrates an example of the feedback-control in the sixth embodiment.

In the amplification control operation, the pulsed laser beam S3 may be outputted regularly from the semiconductor laser apparatus 310 at the timing Tt+$\Delta$T. The pulsed laser beam S3 may enter the amplifier 330 via the relay optical system 320. In the amplifier 330, the pulsed laser beam S3 may be amplified while the wavelength chirping range of the pulsed laser beam S3 overlaps a gain bandwidth of the $CO_2$ gas gain medium. As a result, the pulsed laser beam S6 may be outputted from the amplifier 330 at the timing Tp delayed by the delay time Td from the timing Tt. The timing Tp at which the pulsed laser beam S6 is outputted from the amplifier 330 may be detected by the monitor unit 340. As shown in FIG. 40, the timing Tp detected by the monitor unit 340 may be inputted to the laser controller 350 (Step S105). Here, the monitor unit 340 may detect the pulse shape, the wavelength, and so forth of the pulsed laser beam S6.

Then, the laser controller 350 may calculate the delay time Td of the timing Tp from the timing Tt, based on the detection result inputted from the monitor unit 340 (Step S106). Thereafter, the laser controller 350 may calculate a difference between the target delay time Tdt and the delay time Td (Step S107).

Subsequently, the laser controller 350 may reset the current value I, the pulse width W, and the set temperature SMT of the semiconductor laser device 312 to the semiconductor laser controller 311, so that the difference ΔTd approximates to 0 (Step S108). Thereafter, the laser controller 350 may return to Step S105.

In this way, the laser controller 350 may repeat the feedback-control in Steps S105 through S108, whereby the timing at which the amplified pulsed laser beam S6 is outputted may be stabilized.

5. Extreme Ultraviolet Light Generation System (Seventh Embodiment)

Subsequently, an EUV light generation system will be described with examples.

5.1 Exemplary Laser Produced Plasma Type EUV Light Generation System

First, an exemplary EUV light generation system will be described in detail with reference to the drawings.

5.1.1 Configuration

Figure 41:
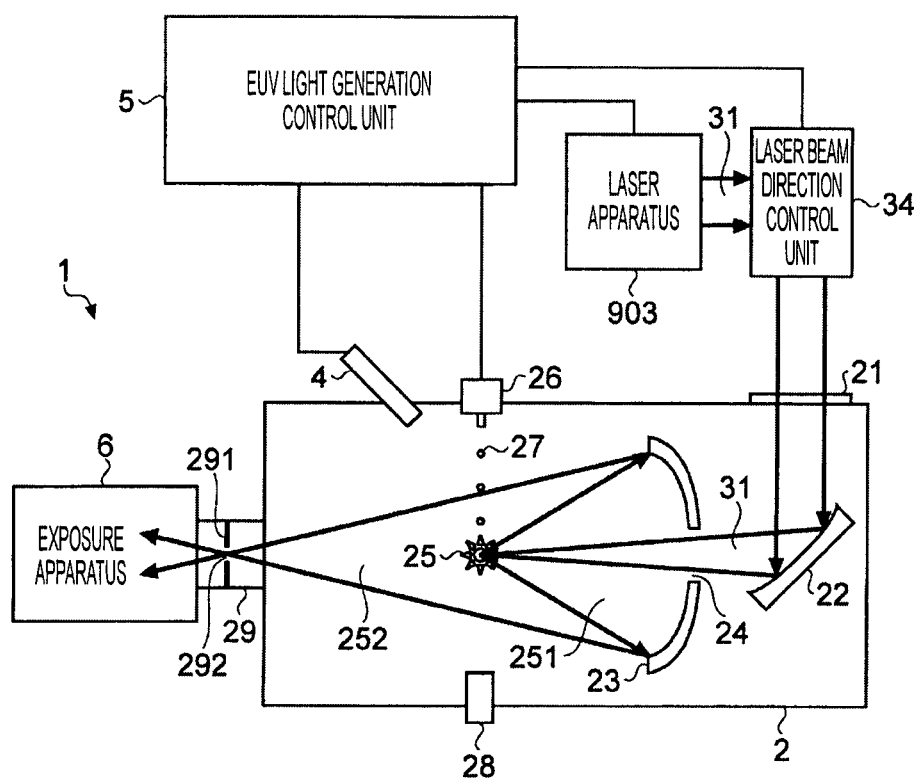
FIG. 41 schematically illustrates the configuration of an exemplary LPP type EUV light generation system.

FIG. 41 schematically illustrates the configuration of an exemplary LPP type EUV light generation apparatus 1. The EUV light generation apparatus 1 may be used with at least one laser apparatus 903. In this application, a system including the EUV light generation apparatus 1 and the laser apparatus 903 may be referred to as an EUV light generation system. As illustrated in FIG. 41 and described in detail below, the EUV light generation apparatus 1 may include a chamber 2 and a target supply unit (droplet generator 26, for example). The interior of the chamber 2 may preferably be vacuum or kept at pressure lower than the atmospheric pressure. The chamber 2 may be filled with a gas which is highly transmissive to the EUV light. The target supply unit may be mounted to the chamber 2 so as to penetrate a wall of the chamber 2, for example. A target material to be supplied by the target supply unit may include, but is not limited to, tin, terbium, gadolinium, lithium, xenon, or any combination thereof.

The chamber 2 may have at least one through-hole formed in the wall thereof. The through-hole may be covered with a window 21, and a pulsed laser beam 31 may travel through the window 21 into the chamber 2. An EUV collector mirror 23 having a spheroidal reflective surface may be provided inside the chamber 2, for example. The EUV collector mirror 23 may have first and second foci. The EUV collector mirror 23 may have a multi-layered reflective film formed on a surface thereof, and the reflective film may include molybdenum and silicon that are laminated in alternate layers, for example. The EUV collector mirror 23 may preferably be disposed such that the first focus thereof lies in a plasma generation region 25 and the second focus thereof lies in an intermediate focus (IF) region 292 defined by the specification of an exposure apparatus. The EUV collector mirror 23 may have a through-hole 24 formed at the center thereof, and the pulsed laser beam 31 may travel through the through-hole 24.

The EUV light generation system may include an EUV light generation control unit 5. Further, the EUV light generation apparatus 1 may include a target sensor 4. The target sensor 4 may be equipped with an imaging function and may detect at least one of the presence, the trajectory, and the position of a target.

Further, the EUV light generation apparatus 1 may include a connection part 29 for allowing the interior of the chamber 2 and the interior of the exposure apparatus 6 to be in communication with each other. A wall 291 having an aperture may be disposed inside the connection part 29. The wall 291 may be disposed such that the second focus of the EUV collector mirror 23 lies in the aperture formed in the wall 291.

Further, the EUV light generation system may include a laser beam direction control unit 34, a laser beam focusing mirror 22, and a target collection unit 28 positioned for collecting a target 27. The laser beam direction control unit 34 may include an optical element for defining the direction in which the laser beam travels and an actuator for adjusting the position and the orientation (or posture) of the optical element.

5.1.2 Operation

With reference to FIG. 41, the pulsed laser beam 31 outputted from the laser apparatus 903 may pass through the laser beam direction control unit 34, and may be outputted from the laser beam direction control unit 34 after having its direction optionally adjusted. The pulsed laser beam 31 may travel through the window 21 and enter the chamber 2. The pulsed laser beam 31 may travel inside the chamber 2 along at least one beam path from the laser apparatus 903, be reflected by the laser beam focusing mirror 22, and strike at least one target 27.

The droplet generator 26 may output the targets 27 toward the plasma generation region 25 inside the chamber 2. The target 27 may be irradiated by at least one pulse of the pulsed laser beam 31. The target 27, which has been irradiated by the pulsed laser beam 31, may be turned into plasma, and rays of light including EUV light 251 may be emitted from the plasma. The EUV light 251 may be reflected selectively by the EUV collector mirror 23. EUV light 252 reflected by the EUV collector mirror 23 may travel through the intermediate focus region 292 and be outputted to the exposure apparatus 6. The target 27 may be irradiated by multiple pulses included in the pulsed laser beam 31.

The EUV light generation control unit 5 may integrally control the EUV light generation system. The EUV light generation control unit 5 may process image data of the droplet 27 captured by the target sensor 4. Further, the EUV light generation control unit 5 may control at least one of the timing at which the target 27 is outputted and the direction into which the target 27 is outputted (e.g., the timing with which and/or direction in which the target is outputted from the droplet generator 26), for example. Furthermore, the EUV light generation control unit 5 may control at least one of the timing with which the laser apparatus 903 oscillates (e.g., by controlling laser apparatus 903), the direction in which the pulsed laser beam 31 travels (e.g., by controlling laser beam direction control unit 34), and the position at which the pulsed laser beam 31 is focused (e.g., by controlling laser apparatus 903, laser beam direction control unit 34, or the like), for example. The various controls mentioned above are merely examples, and other controls may be added as necessary.

5.2 EUV Light Generation System to which $CO_2$ Laser Apparatus with QCL as MO is Applied (Eighth Embodiment)

The case where the above-described laser apparatus 3 is applied to the EUV light generation system shown in FIG.

41, for example, will be described with reference to the drawings. Below, the case where the laser apparatus 3 shown in FIG. 1 is applied to the EUV light generation system shown in FIG. 41 will be discussed.

5.2.1 Configuration

Figure 42:
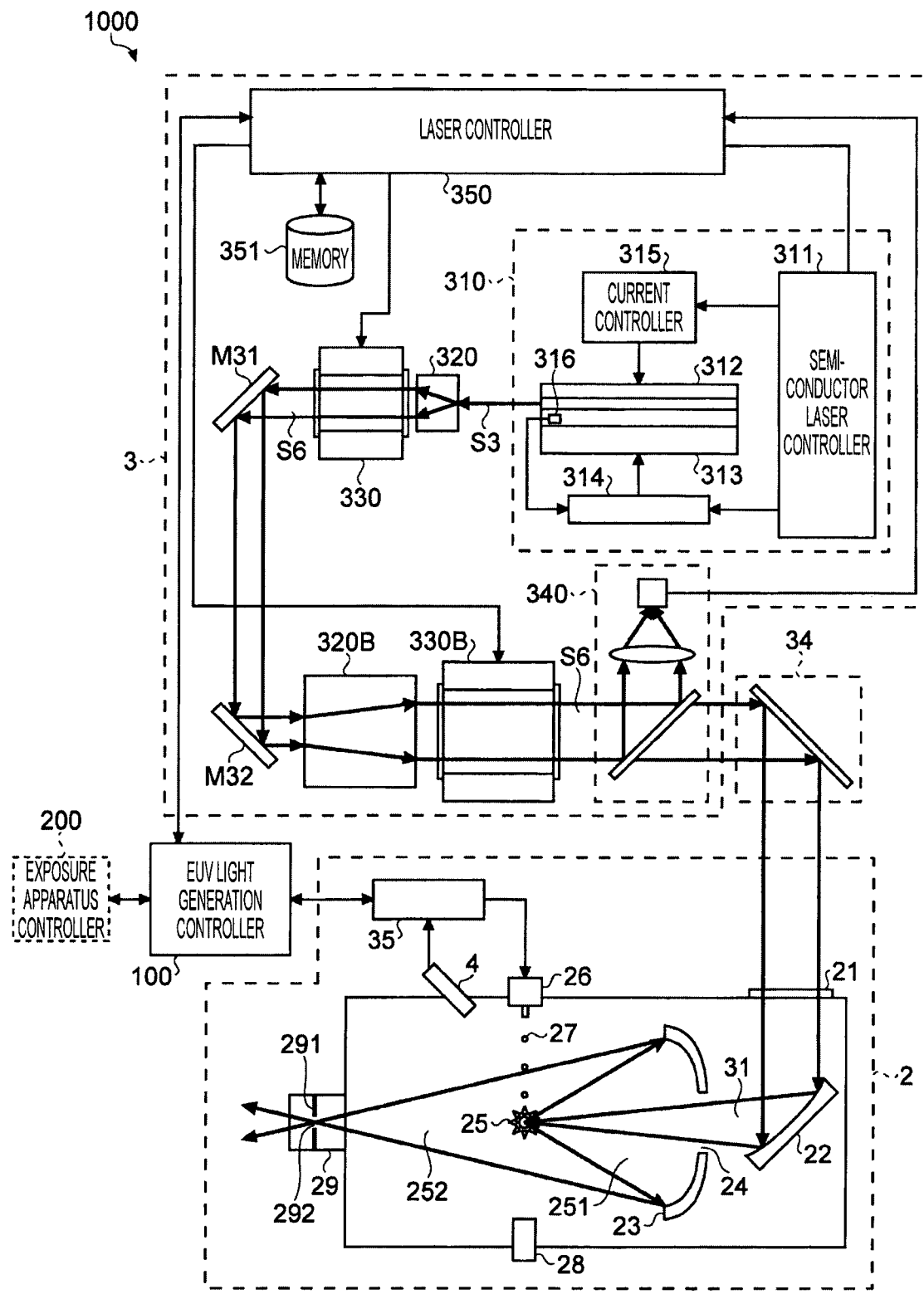
FIG. 42 schematically illustrates the configuration of an EUV light generation system according to an eighth embodiment.

FIG. 42 schematically illustrates the configuration of an EUV light generation system according to an eighth embodiment. As shown in FIG. 42, an EUV light generation system 1000 may include an EUV light generation controller 100, the laser apparatus 3, the laser beam direction control unit 34, the chamber 2, and the droplet generator 26. The laser apparatus 3 may include the amplifier 330, high-reflection mirrors M31 and M32, a relay optical system 320B, and a main amplifier 330B.

Further, the laser apparatus 3 may include the monitor unit 340 disposed on the beam path of the pulsed laser beam S6 downstream from the main amplifier 330B. Further, the chamber 2 may be provided with a droplet controller 35.

5.2.2 Operation

The general operation of the EUV light generation system 1000 shown in FIG. 42 will be described. The EUV light generation controller 100 may be connected to the laser controller 350, the droplet controller 35, and an exposure apparatus controller 200 and may transmit control signals to and from these controllers. The droplet controller 35 may send an output signal to the droplet generator 26 directing the timing at which the target 27 is to be outputted. When the target 27 is outputted from the droplet generator 26, the position of the target 27 may be detected by the target sensor 4. The detection data may then be sent to the droplet controller 35.

Upon receiving a trigger signal from the EUV light generation controller 100, the laser controller 350 may cause the semiconductor laser controller 311 to output a current pulse to the current controller 315. The current controller 315 may cause a current pulse of a predetermined waveform, based on the current pulse from the semiconductor laser controller 311, to flow in the semiconductor laser device 312. When the current pulse flows in the semiconductor laser device 312, the pulsed laser beam S3 may be outputted. The pulsed laser beam S3 outputted from the semiconductor laser device 312 may be amplified as it travels through the relay optical system 320, the amplifier 330, and the main amplifier 330B via the high-reflection mirrors M31 and M32 and the relay optical system 320B. The monitor unit 340 provided on the beam path of the pulsed laser beam S6 downstream from the main amplifier 330B may detect the passing timing, the pulse energy, the pulse shape, the wavelength, and so forth of the amplified pulsed laser beam S6. The laser controller 350 may send control signals to the semiconductor laser controller 311, the amplifier 330, and the main amplifier 330B, based on the detection results by the monitor unit 340.

5.2.2.1 Flow of Controlling Timing at which Target is Irradiated by Pulsed Laser Beam Subsequently, the operation for controlling the timing at which the target 27 supplied into the chamber 2 is irradiated by the pulsed laser beam S6 will be described in detail with reference to the drawings.

5.2.2.1.1 Main Flow

Figure 43:
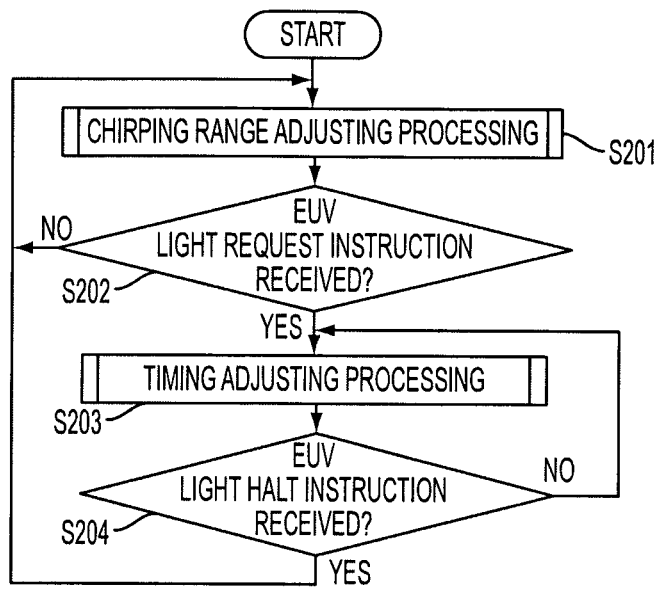
FIG. 43 illustrates the operation for controlling a timing as which a target is irradiated by a pulsed laser beam in the eighth embodiment.

FIG. 43 shows the operation for controlling the timing at which a target is irradiated by the pulsed laser beam. As shown in FIG. 43, the EUV light generation controller 100 may first execute a subroutine (chirping range adjusting processing) for setting the certain parameters so that at least a part of the wavelength chirping range of the semiconductor laser apparatus 310 overlaps at least a part of one of the gain bandwidths S51 through S57 of the $CO_2$ gas gain medium (Step S201).

Then, the EUV light generation controller 100 may stand by until it receives an instruction signal requesting the generation of the EUV light from the exposure apparatus controller 200 (Step S202; NO). Upon receiving the instruction signal (Step S202; YES), the EUV light generation controller 100 may execute a subroutine (timing adjusting processing) for adjusting the timing at which the target 27 arrives in the plasma generation region 25 and the timing at which the pulsed laser beam S6 is focused in the plasma generation region 25 (Step S203).

Thereafter, the EUV light generation controller 100 may determine whether or not it has received an instruction signal requesting the halt in the generation of the EUV light from the exposure apparatus controller 200 (Step S204). When the instruction signal has not been received (Step S204; NO), the EUV light generation controller 100 may return to Step S203. On the other hand, when the instruction signal has been received (Step S204; YES), the EUV light generation controller 100 may return to Step S201.

When the signal is inputted to the droplet generator 26 from the droplet controller 35 for causing the droplet generator 26 to output the target 27, the droplet generator 26 may output the target 27 toward the plasma generation region 25. Then, The pulsed laser beam 6 may be focused in the plasma generation region 25 in synchronization with the timing at which the target 27 arrives in the plasma generation region 25.

5.2.2.1.2 Chirping Range Adjusting Processing

Figure 44:
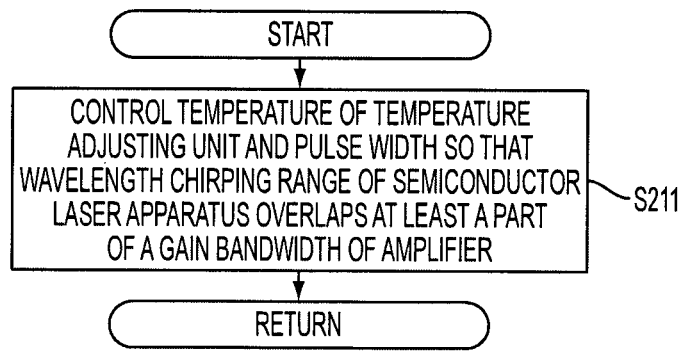
FIG. 44 illustrates an example of chirping range adjusting processing in FIG. 43.

The Peltier device 313 serving as the temperature adjusting unit may be provided in the semiconductor laser apparatus 310 for controlling the temperature of the semiconductor laser device 312 of the semiconductor laser apparatus 310. Accordingly, in the chirping range adjusting processing in Step S201 of FIG. 43, as shown in FIG. 44, the EUV light generation controller 100 may set at least any one of the set temperature SMT of the Peltier device 313, the pulse width W (temporal length) of the current pulse to flow in the semiconductor laser device 312, and the current value I of the current pulse to flow in the semiconductor laser device 312. On that basis, at least a part of the chirping range of the oscillation wavelength of the semiconductor laser apparatus 310 overlaps at least a part of one of the gain bandwidths S51 through S57 of the amplifier 330 and the main amplifier 330B (Step S211). Thereafter, the EUV light generation controller 100 may return to the operation shown in FIG. 43.

5.2.2.1.3 Timing Adjusting Processing

Figure 45:
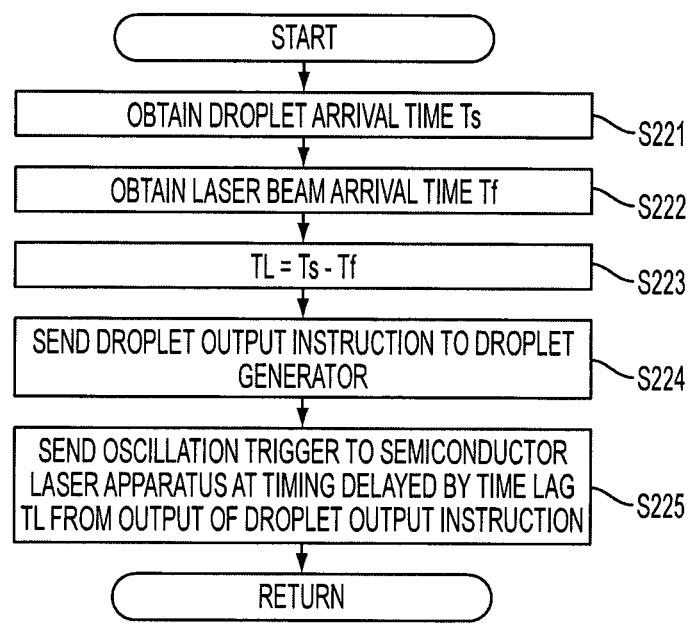
FIG. 45 illustrates an example of timing adjusting processing in FIG. 43.

In the timing adjusting processing indicated in step S203 of FIG. 43, as shown in FIG. 45, the EUV light generation controller 100 may first acquire a droplet arrival time Ts, which is a duration from the transmission of a droplet output instruction for requesting the droplet generator 26 to output the target 27 until the target 27 arrives in the plasma generation region 25 (Step S221). Arrival of the target 27 in the plasma generation region 25 may be detected based, for example, on the timing at which the target sensor 4 captures the image of the target 27. For example, the droplet arrival time Ts may be obtained by measuring a period from the timing at which the droplet output instruction is outputted until the target 27 is detected by the target sensor 4. The position at which the target 27 is detected by the target sensor 4 may not coincide with the plasma generation region 25 in some cases. If that is the case, a distance DS1 between the droplet generator 26 and the position at which the target 27 is detected by the target sensor 4 and a distance DS2 between the droplet generator 26 and the plasma generation region 25 may be measured. Then, the speed of the target 27 may be calculated from the distance DS1 and the time elapsed from the timing at which the droplet output instruction is outputted until the target 27 is detected. Based on the calculated result, the droplet arrival time Ts for the distance DS2 may be calculated.

Subsequently, the EUV light generation controller 100 may acquire a laser beam arrival time Tf, which is a duration from the input of the oscillation trigger into the semiconductor laser apparatus 310 until the pulsed laser beam S6 arrives in the plasma generation region 25 (Step S222). In the acquisition of the laser beam arrival time Tf, a time Tf0 which is a duration (for example) may be detected from the input of the oscillation trigger into the semiconductor laser apparatus 310 until the pulsed laser beam S6 is detected by the monitor unit 340. Then, an arrival time Tx of the pulsed laser beam 6, which may be acquired in advance, required to travel from the monitor unit 340 to the plasma generation region 25 may be added to the time Tf 0. The sum of these times may serve as the laser beam arrival time Tf. Here, the arrival time Tx of the pulsed laser beam S6 from the monitor unit 340 to the plasma generation region 25 may be a value obtained by measurement, or a value obtained by calculation of the optical path length from the monitor unit 340 to the plasma generation region 25.

Then, the EUV light generation controller 100 may calculate a time lag TL by subtracting the laser beam arrival time Tf from the droplet arrival time Ts (Step S223). The time lag TL may be a difference between the timing at which the target 27 arrives in the plasma generation region 25 and the timing at which the pulsed laser beam S6 arrives in the plasma generation region 25, in the case where the droplet output instruction and the oscillation trigger are outputted simultaneously, for example. The timing at which the oscillation trigger is outputted is delayed by the time lag TL with respect to the timing at which the droplet output instruction is outputted. This may allow the target 27 and the pulsed laser beam S6 to arrive in the plasma generation region 25 at substantially the same time. The time lag TL may also be used to determine the aforementioned delay times Tdr, Tdt, and so forth.

Thereafter, the EUV light generation controller 100 may send the droplet output instruction to the droplet generator 26 (Step S224). Further, the EUV light generation controller 100 may input the oscillation trigger to the semiconductor laser controller 311 at a timing delayed by the time lag TL from the output of the droplet output instruction (Step S225). With this, the timing at which the target 27 arrives in the plasma generation region 25 and the timing at which the pulsed laser beam S6 arrives in the plasma generation region 25 may be synchronized. The target 27 may thus be irradiated by the pulsed laser beam S6 in the plasma generation region 25.

5.3 EUV Light Generation System to which $CO_2$ Laser Apparatus with Multiple QCLs as MO is Applied (Ninth Embodiment)

To the EUV light generation system shown in FIG. 41, any of the laser apparatuses 3A, 3B, and 3C of the other embodiments may be applied as well, in place of the laser apparatus 3.

5.3.1 Configuration

Figure 46:
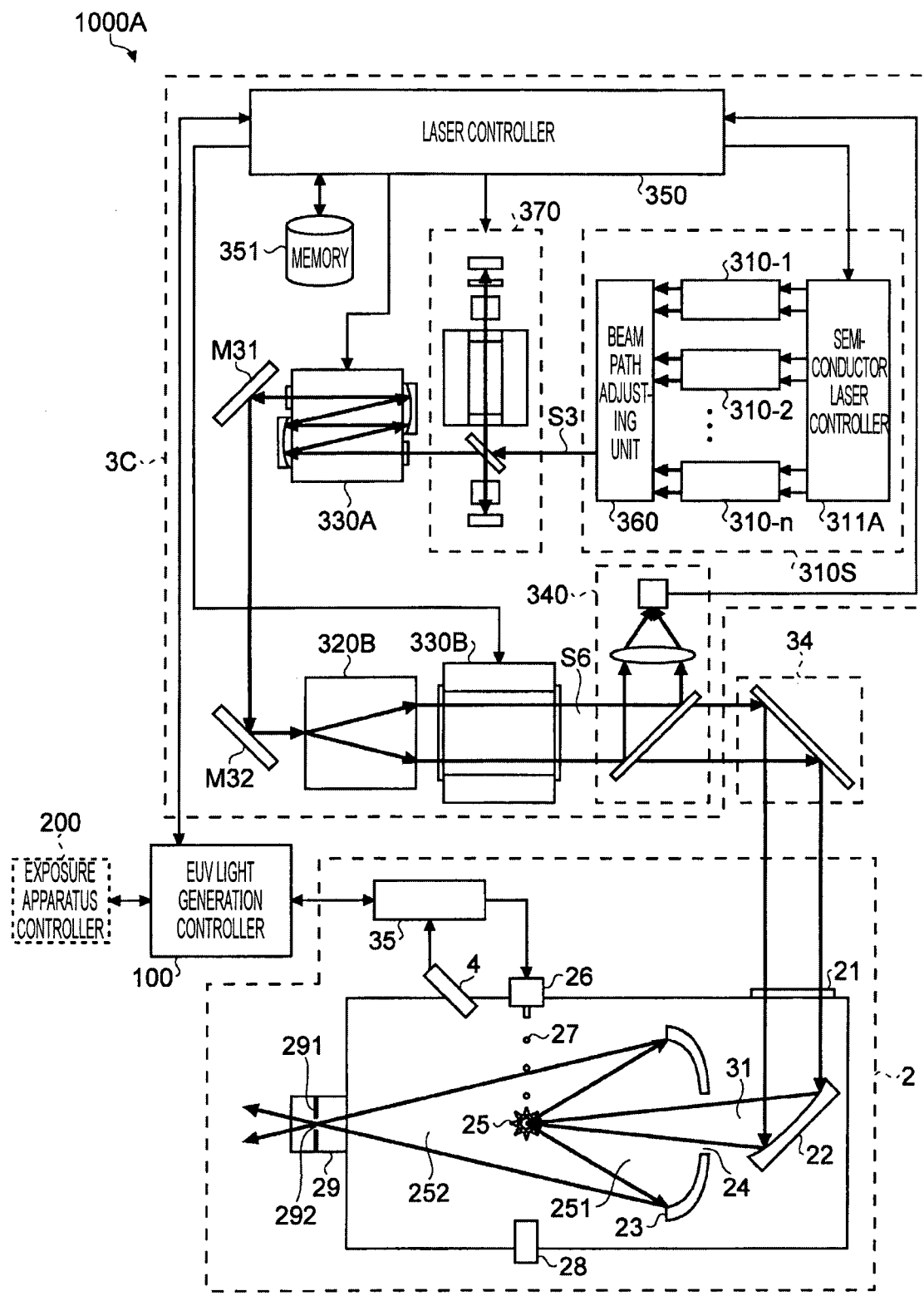
FIG. 46 schematically illustrates the configuration of an EUV light generation system according to a ninth embodiment.

FIG. 46 schematically illustrates the configuration of an EUV light generation system 1000A to which the laser apparatus 3C shown in FIG. 29 is applied. As illustrated in FIG. 46, the EUV light generation system 1000A may be similar in configuration to the EUV light generation system 1000 shown in FIG. 42, but may differ in that the semiconductor laser system 3C may be included in place of the semiconductor laser apparatus 310. Other configuration may be similar to that of the EUV light generation system 1000 shown in FIG. 42.

5.3.2 Operation

Subsequently, the general operation of the EUV light generation system 1000A shown in FIG. 46 will be discussed. The EUV light generation controller 100 may be connected to the laser controller 350, the droplet controller 35, and the exposure apparatus controller 200 and may transmit control signals to and from these controllers.

The droplet controller 35 may send an output signal to the droplet generator 26 directing the timing at which the target 27 is to be outputted. When the target 27 is outputted from the droplet generator 26, the position of the target 27 may be detected by the target sensor 4. The detection data may be sent to the droplet controller 35.

Upon receiving the trigger signal from the EUV light generation controller 100, the laser controller 350 may send the oscillation triggers for causing the semiconductor laser controller 311A to supply current pulses to the respective semiconductor laser apparatuses 310-1 through 310-n. The pulsed laser beams outputted from the respective semiconductor laser apparatuses 310-1 through 310-n may have their beam paths adjusted so as to coincide with one another by the beam path adjusting unit 360. The pulsed laser beam S3, which includes the pulsed laser beam outputted from the respective semiconductor laser apparatuses 310-1 through 310-n, may be amplified as it passes through the regenerative amplifier 370, the preamplifier 330A, and the main amplifier 330B via the high-reflection mirrors M31 and M32 and the relay optical system 320B. The monitor unit 340 provided on the beam path of the pulsed laser beam S6 downstream from the main amplifier 330B may detect the passing timing, the pulse energy, the pulse shape, the wavelength, and so forth of the pulsed laser beam S6. The laser controller 350 may send control signals to the semiconductor laser controller 311A, the regenerative amplifier 370, the preamplifier 330A, and the main amplifier 330B, respectively, based on the detection result by the monitor unit 340.

In the EUV light generation system 1000A, the operation for controlling the timing at which the target 27 supplied into the chamber 2 is irradiated by the pulsed laser beam S6 may be similar to the operation described above with reference to FIGS. 43 through 45. Further, the laser apparatus 3C may be similar in operation to the laser apparatus 3B described with reference to FIGS. 16 through 28, except in that the laser apparatus 3C includes the regenerative amplifier 370. The operation of the regenerative amplifier 370 may be similar to the operation described with reference to FIGS. 11 and 12.

6. Supplementary Descriptions 6.1 Beam Path Adjusting Unit for Multiple QCL Laser Beams An example of the above-described beam path adjusting unit 360 will be described below.

Figure 47:
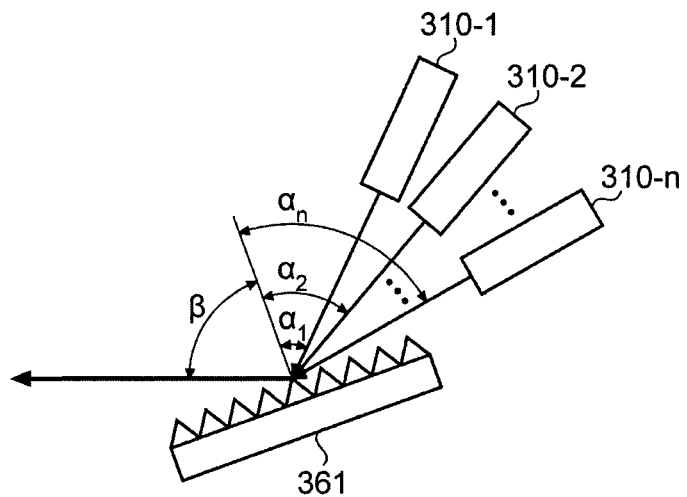
FIG. 47 illustrates an example of a beam path adjusting unit according to one aspect of this disclosure.

6.1.1 Beam Path Adjusting Unit for Multiple QCL Laser Beams at Different Oscillation Wavelengths FIG. 47 shows a case where a reflective type grating 361 is used as the beam path adjusting unit 360. For example, when laser beams at respectively different wavelengths are incident on the grating 361 at the same angle, an m-th diffracted rays (here, m is a positive integer, for example, one) of these laser beams may be diffracted at different angles. Here, the relationship among the angle α of incidence, the angle β of diffraction, and the wavelength λ may satisfy Expression (6) below. In Expression (6), m is the order of the diffracted ray.

$$mλ = a(\sin α ± \sin β) \quad (6)$$

Accordingly, as shown in FIG. 47, the semiconductor laser apparatuses 310-1 through 310-n may be positioned with respect to the grating 361 such that m-th diffracted rays of the respective pulsed laser beams outputted from the respective semiconductor laser apparatuses 310-1 through 310-n at different wavelengths ($λ_1$ through $λ_n$) are diffracted at the same angle β by the grating 361. Here, assuming the angles at which the pulsed laser beams outputted from the respective semiconductor laser apparatuses 310-1 through 310-n are incident on the grating 361 are angles $α_1$ through $α_n$, the arrangement of the semiconductor laser apparatuses 310-1 through 310-n with respect to the grating 361 may satisfy Expression (7) below.

$$mλ_1 = a(\sin α_1 ± \sin β) \quad (7)$$
$$mλ_2 = a(\sin α_2 ± \sin β)$$
$$...$$
$$mλ_n = a(\sin α_n ± \sin β)$$

In this way, using the grating 361 may make it possible to achieve the beam path adjusting unit 360 of a compact and simple configuration. In this example, the reflective type grating 361 is used. However, this embodiment is not limited thereto, and a transmissive type grating may be used as well.

Figure 48:
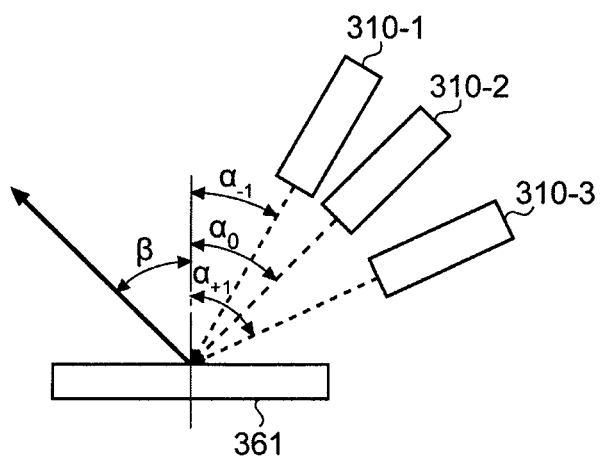
FIG. 48 illustrates another example of a beam path adjusting unit according to another aspect of this disclosure.

6.1.2 Beam Path Adjusting Unit for Multiple QCL Laser Beams at the Same Oscillation Wavelength The beam path adjusting unit 360 embodied by the grating 361 may be used to make the beam paths of pulsed laser beams at the same wavelength coincide with one another. In this case, the beam paths of diffracted rays of different orders may be made to coincide with one another. For example, as shown in FIG. 48, when the beam paths of the pulsed laser beams outputted from three semiconductor laser apparatuses 310-1 through 310-3 at the same wavelength are made to coincide with one another, the semiconductor laser apparatuses 310-1 through 310-n may be positioned with respect to the grating 361 such that the −1st order diffracted ray of the pulsed laser beam outputted from the semiconductor laser apparatus 310-1, the 0th order diffracted ray of the pulsed laser beam outputted from the semiconductor laser apparatus 310-2, and the +1st order diffracted ray of the pulsed laser beam outputted from the semiconductor laser apparatus 310-3 are diffracted by the grating 361 at the same angle β. In this case, assuming the angles at which the pulsed laser beams outputted from the respective semiconductor laser apparatuses 310-1 through 310-3 are incident on the grating 361 are angles $α_{−1}$, $α_0$, and $α_{+1}$, respectively, the arrangement of the semiconductor laser apparatuses 310-1 through 310-3 with respect to the grating 361 may satisfy Expression (8) below.

$$mλ_{−1} = a(\sin α_{−1} ± \sin β)$$
$$mλ_0 = a(\sin α_0 ± \sin β)$$
$$mλ_{+1} = a(\sin α_{+1} ± \sin β) \quad (8)$$

In this way, even when the beam paths of the pulsed laser beams at the same wavelength are made to coincide with one another, the grating 361 may achieve the beam path adjust-ing unit 360 having a compact and simple configuration. In this example as well, a transmissive type grating may be used.

Figure 49:
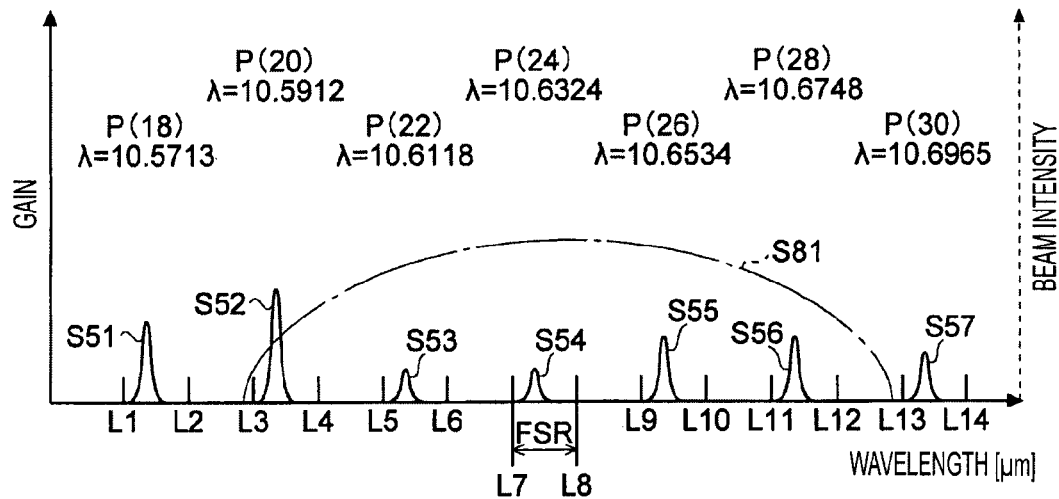
FIG. 49 shows the relationship between longitudinal modes of semiconductor lasers and selected wavelengths by a grating, when a grating with a broad range of wavelength selectivity is used.

6.2 Case where Semiconductor Laser that Oscillates at Multi-Longitudinal Mode is Applied A multi-longitudinal mode semiconductor laser apparatus may also be used as the semiconductor laser apparatus 310. For example, when the external-resonator type semiconductor laser apparatus 310B shown in FIG. 5 is embodied by the multi-longitudinal mode semiconductor laser apparatus, in place of the grating 3127 with the wavelength selection range S8 as shown in FIG. 31, a grating with a broader wavelength selection range S81 as shown in FIG. 49 may be used. FIG. 49 shows a case where the external-resonator type semiconductor laser apparatus 310B oscillates at ten longitudinal modes.

Figure 50:
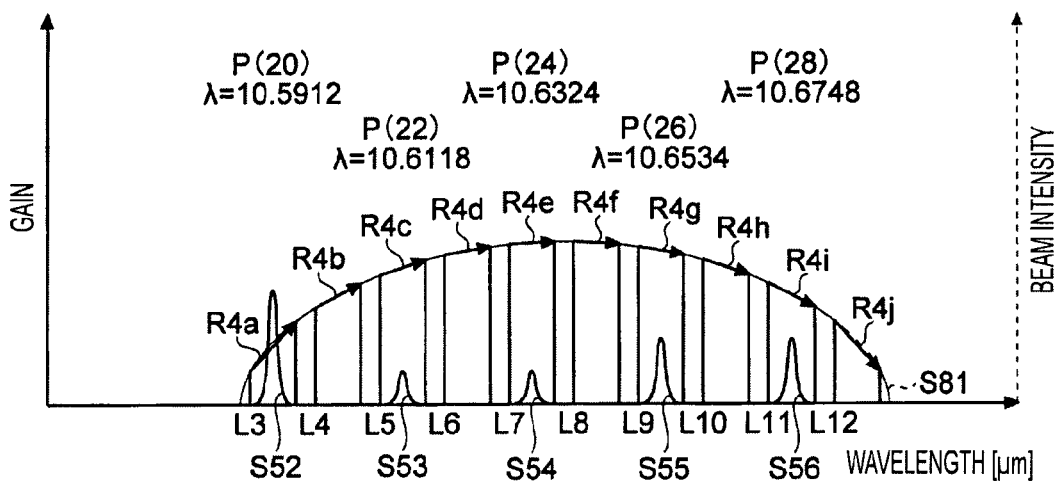
FIG. 50 illustrates the control in the laser apparatus shown in FIG. 14 including a grating with a broad range of wavelength selectivity, where the longitudinal modes of the respective semiconductor lasers are amplified in the respective gain bandwidths of the $CO_2$ gas gain medium.
Figure 51:
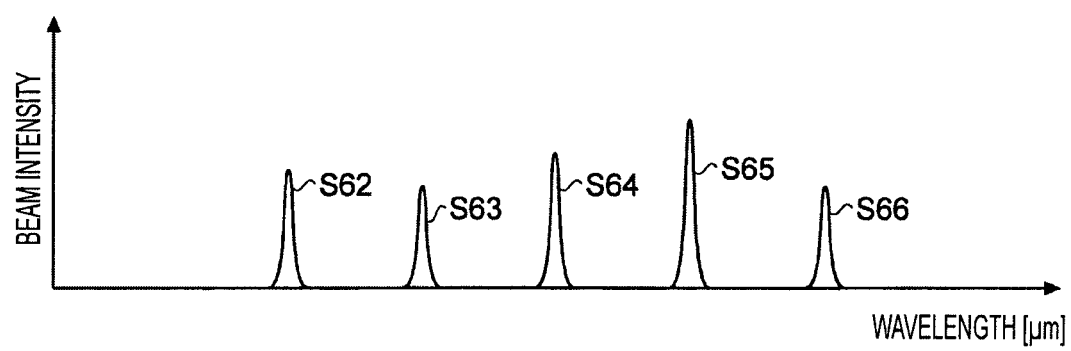
FIG. 51 shows beam intensity of each of the pulsed laser beams amplified under the control shown in FIG. 50.

Even in this case, the external-resonator type semiconductor laser apparatus 310B may preferably be controlled to oscillate such that the initial wavelength of the pulsed laser beam outputted from the external-resonator type semiconductor laser apparatus 310B is shorter than the corresponding gain bandwidths S52 through S56. When a current flows in the semiconductor laser device 312B, the wavelength chirping may occur at each of the longitudinal modes L3 through L12, as shown in FIG. 50. As shown in FIG. 51, a pulsed laser beam containing the pulsed laser beams S62 through S66 amplified in the respective gain bandwidths S52 through S56 may be outputted while the wavelength chirping ranges R4a through R4j of the respective longitudinal modes L3 through L12 overlap the gain bandwidths S52 through S56. Here, the longitudinal modes L4, L6, L8, L10, and L12, which do not overlap any of the gain bandwidths S51 through S57 in their wavelength chirping ranges, may not be amplified.

The above-described embodiments and the modifications thereof are merely examples for implementing this disclosure, and this disclosure is not limited thereto. Making various modifications according to the specifications or the like is within the scope of this disclosure, and it is apparent from the above description that other various embodiments are possible within the scope of this disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not being limited to the stated elements." The term "have" should be interpreted as "including the stated elements but not being limited to the stated elements." Further, the modifier "one (a/an)" should be interpreted as "at least one" or "one or more."

What is claimed is:

1. A laser apparatus, comprising:
    a master oscillator configured to output a pulsed laser beam at a repetition rate, each pulse of the pulsed laser beam being chirped, the master oscillator including a plurality of semiconductor laser apparatuses;
    at least one amplifier configured to amplify the pulsed laser beam from the master oscillator, the at least one amplifier being configured to include a plurality of gain bandwidths; and
    a controller for controlling a temperature of each of the plurality of semiconductor laser apparatuses, as a parameter affecting an output wavelength of the pulsed laser beam such that a wavelength chirping range of the pulsed laser beam overlaps at least a part of at least one of the plurality of gain bandwidths, wherein:
at least two of the plurality of semiconductor laser apparatuses output pulsed laser beams having wavelength chirping ranges different from each other,
the controller controls such that the temperature of each of the plurality of semiconductor laser apparatuses is placed between a first temperature at which a temporally initial wavelength in a single pulse of the pulsed laser beam becomes a longest wavelength of the at least one of the plurality of gain bandwidths and a second temperature at which a temporally final wavelength in a single pulse of the pulsed laser beam becomes a shortest wavelength of the at least one of the plurality of gain bandwidths; and
the wavelength chirping range of each pulse of the pulsed laser beam has the temporally initial wavelength, the temporally final wavelength, and a plurality of wavelengths extending from the temporally initial wavelength to the temporally final wavelength, with at least one of the temporally initial wavelength and the temporally final wavelength being outside the at least one of the plurality of gain bandwidths, and at least one of the plurality of wavelengths being inside the at least one of the plurality of gain bandwidths.

2. The laser apparatus according to claim 1, wherein temporally initial wavelength is inside the at least one of the plurality of gain bandwidths.

3. The laser apparatus according to claim 1, wherein both the temporally initial wavelength and the temporally final wavelength are outside the at least one of the plurality of gain bandwidths.

4. The laser apparatus according to claim 3, wherein a portion toward an end of the plurality of wavelengths extending from the temporally initial wavelength to the temporally final wavelength overlaps the at least one of the plurality of gain bandwidths.

5. The laser apparatus according to claim 3, wherein the controller inputs oscillation triggers to the plurality of semiconductor laser apparatuses such that pulsed laser beams outputted from the plurality of semiconductor laser apparatuses, respectively, are outputted from the at least one amplifier at approximately a same timing.

6. The laser apparatus according to claim 5, wherein each of the plurality of semiconductor laser apparatuses is configured to oscillate at a single-longitudinal mode.

7. The laser apparatus according to claim 6, wherein at least two of the plurality of the semiconductor laser apparatuses are configured to oscillate at the same wavelength.

8. The laser apparatus according to claim 5, further comprising a plurality of amplifiers for amplifying the pulsed laser beam.

9. The laser apparatus according to claim 5, further comprising a regenerative amplifier for amplifying the pulsed laser beam.

10. The laser apparatus according to claim 5, further comprising a current controller for supplying a current to the plurality of semiconductor laser apparatuses,
wherein the controller is configured to control a timing at which the current controller supplies a current to each of the plurality of semiconductor laser apparatuses, based on a duration from an input of a current to each of the plurality of semiconductor laser apparatuses until an arrival of the pulsed laser beam at a predetermined position.

11. The laser apparatus according to claim 5, further comprising:
a current controller for supplying a current to the plurality of semiconductor laser apparatuses; and
a memory,
wherein the controller is configured to control a timing at which the current controller supplies a current to each of the plurality of semiconductor laser apparatuses, based on a data stored in the memory, the data being a duration from a input of a current to each of the plurality of semiconductor laser apparatuses until an arrival of the pulsed laser beam at a predetermined position.

12. The laser apparatus according to claim 10, wherein the predetermined position is located downstream from the at least one amplifier,
a monitor unit is provided at the predetermined position, the monitor unit being configured to detect the pulsed laser beam, and
the arrival of the pulsed laser beam at the predetermined position is determined based on a detection result of the pulsed laser beam by the monitor unit.

13. The laser apparatus according to claim 11, wherein the predetermined position is located downstream from the at least one amplifier,
a monitor unit is disposed at the predetermined position, the monitor unit being configured to detect the pulsed laser beam, and the arrival of the pulsed laser beam at the predetermined position is determined based on a detection result of the pulsed laser beam by the monitor unit.

14. An extreme ultraviolet light generation system, comprising:
a laser apparatus including
a master oscillator configured to output a pulsed laser beam at a repetition rate, each pulse of the pulsed laser beam being chirped, the master oscillator including a plurality of semiconductor laser apparatuses,
at least one amplifier configured to amplify the pulsed laser beam from the master oscillator, the at least one amplifier being configured to include a plurality of gain bandwidths, and
a controller for controlling a temperature of each of the plurality of semiconductor laser apparatuses, as a parameter affecting an output wavelength of the pulsed laser beam such that a wavelength chirping range of the pulsed laser beam overlaps at least a part of at least one of the plurality of gain bandwidths, wherein
at least two of the plurality of semiconductor laser apparatuses output pulsed laser beams having wavelength chirping ranges different from each other,
the controller controls such that the temperature of each of the plurality of semiconductor laser apparatuses is placed between a first temperature at which a temporally initial wavelength in a single pulse of the pulsed laser beam becomes a longest wavelength of the at least one of the plurality of gain bandwidths and a second temperature at which a temporally final wavelength in a single pulse of the pulsed laser beam becomes a shortest wavelength of the at least one of the plurality of gain bandwidths, and
the wavelength chirping range of each pulse of the pulsed laser beam has the temporally initial wavelength, the temporally final wavelength, and a plurality of wavelengths extending from the temporally initial wavelength to the temporally final wavelength, with at least one of the temporally initial wavelength and the temporally final wavelength being outside the at least one of the plurality of gain bandwidths, and at least one of the plurality of wavelengths being inside the at least one of the plurality of gain bandwidths;

a chamber;

a target supply unit configured to supply a target material toward a predetermined region inside the chamber; and a collector mirror for selectively reflecting at least extreme ultraviolet light emitted in the predetermined region inside the chamber.

15. The extreme ultraviolet light generation system according to claim 14, wherein the temporally initial wavelength is inside the at least one of the plurality of gain bandwidths.

16. The extreme ultraviolet light generation system according to claim 14, wherein both the temporally initial wavelength and the temporally final wavelength are outside the at least one of the plurality of gain bandwidths.

17. The extreme ultraviolet light generation system according to claim 16, wherein a portion toward an end of the plurality of wavelengths extending from the temporally initial wavelength to the temporally final wavelength overlaps the at least one of the plurality of gain bandwidths.

18. The extreme ultraviolet light generation system according to claim 16, wherein the controller inputs oscillation triggers to the plurality of semiconductor laser apparatuses such that pulsed laser beams outputted from the plurality of semiconductor laser apparatuses, respectively, are outputted from the at least one amplifier at approximately a same timing.

* * * * *